United States Patent
Peterson et al.

(10) Patent No.: US 7,122,880 B2
(45) Date of Patent: Oct. 17, 2006

(54) COMPOSITIONS FOR PREPARING LOW DIELECTRIC MATERIALS

(75) Inventors: Brian Keith Peterson, Fogelsville, PA (US); John Francis Kirner, Orefield, PA (US); Scott Jeffrey Weigel, Allentown, PA (US); James Edward MacDougall, New Tripoli, PA (US); Lisa Deis, Pittsburgh, PA (US); Thomas Albert Braymer, Allentown, PA (US); Keith Douglas Campbell, Slatington, PA (US); Martin Devenney, Mountain View, CA (US); C. Eric Ramberg, San Jose, CA (US); Konstantinos Chondroudis, Sunnyvale, CA (US); Keith Cendak, Millbrae, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 35 days.

(21) Appl. No.: 10/638,942

(22) Filed: May 20, 2003

(65) Prior Publication Data

US 2004/0048960 A1 Mar. 11, 2004

Related U.S. Application Data

(60) Provisional application No. 60/384,321, filed on May 30, 2002.

(51) Int. Cl.
*H01L 21/31* (2006.01)
*H01L 21/469* (2006.01)

(52) U.S. Cl. ............... 257/632; 257/E21.261; 257/E21.273; 438/780; 438/781

(58) Field of Classification Search ............ 438/780, 438/781; 427/372.2, 419.2; 257/632
See application file for complete search history.

(56) References Cited

U.S. PATENT DOCUMENTS

| | | | |
|---|---|---|---|
| 5,905,117 A | 5/1999 | Yokotsuka et al. | 525/104 |
| 6,126,733 A | 10/2000 | Wallace et al. | 106/287.16 |
| 6,329,017 B1 | 12/2001 | Liu et al. | 427/240 |
| 6,376,634 B1 | 4/2002 | Nishikawa et al. | 528/25 |
| 6,406,794 B1 | 6/2002 | Shiota et al. | 428/447 |
| 6,495,479 B1 | 12/2002 | Wu et al. | 438/781 |
| 6,576,568 B1* | 6/2003 | Mandal et al. | 438/781 |
| 2002/0042210 A1 | 4/2002 | Mandal et al. | 438/780 |
| 2002/0189495 A1 | 12/2002 | Hayashi et al. | 106/287.13 |

FOREIGN PATENT DOCUMENTS

| EP | 1088868 | 4/2001 |
|---|---|---|
| EP | 1090967 | 4/2001 |
| EP | 1 117 102 A2 | 7/2001 |

(Continued)

OTHER PUBLICATIONS

S. Yang, et al., "Molecular Templating of Nanoporous Ultralow Dielectric Constant (≈1.5) Organosilicates by Tailoring the Microphase Separation of Triblock Copolymers," Chem. Mater. 2001, 13, p. 2762-2764.

(Continued)

*Primary Examiner*—Alexander Ghyka
(74) *Attorney, Agent, or Firm*—Rosaleen P. Morris-Oskanian; Joseph D. Rossi

(57) ABSTRACT

Low dielectric materials and films comprising same have been identified for improved performance when used as performance materials, for example, in interlevel dielectrics integrated circuits as well as methods for making same. In one aspect of the present invention, the performance of the dielectric material may be improved by controlling the weight percentage of ethylene oxide groups in the at least one porogen.

28 Claims, 4 Drawing Sheets

FOREIGN PATENT DOCUMENTS

| | | |
|---|---|---|
| EP | 1 123 753 A2 | 8/2001 |
| EP | 1123753 * | 8/2001 |
| EP | 1127929 | 8/2001 |
| EP | 1 142 832 A1 | 10/2001 |
| EP | 1 197 998 A2 | 4/2002 |
| EP | 1 249 846 A2 | 10/2002 |
| WO | WO 0027254 | 5/2000 |
| WO | WO 01/86709 A2 | 11/2001 |

OTHER PUBLICATIONS

European Search Report dated Sep. 16, 2003, Application No. 03012119.8-2102.

Wang, S., et al., *Advanced Processing: CMP of Cu/low-K and Cu/ultralow-K layers*, Solid State Technol., Sep. 2001.

Lin, S., et al., *Low-k Dielectrics Characterization for Damascene Integration*, International Interconnect Technology Conference, Burlingame, CA, Jun. 2001.

Lu, Y., et al., *Evaporation-Induced Self-Assembly of Hybrid Bridged Silsesquioxane Film and Particulate Mesophases with Integral Organic Functionalty*, J. Am. Chem. Soc. 2000, 122, 5258-5261.

Golden, J.H., et al., *Designing Porous Low-k Dielectrics*, Semiconductor International, May 2001.

Peters, L., *Industry Divides on Low-k Dielectric Choices*, Semiconductor International, Jul. 2001.

Jin, C., et al., *Characterization and Integration of Porous Extra Low-k (XLK) Dielectrics*, International Interconnect Technology Conference, San Francisco, CA, Jun. 2000.

Thomas, M. E., *Spin-on Stacked Films for Low-keff Dielectrics*, Solid State Technol., Jul. 2001.

Thanawala, S., et al., *Reduction in the Effective Dielectric Constant of Integrated Interconnect Structures Through an All-Spin-On Strategy*, Honeywell Technical Reports.

Ramos, T., et al., *Mechanical and Electrical Properties of Nanoglass™ Nanoporous Silica as a Function of Porosity*, Honeywell Technical Report.

Cook, R. F., et al., *Stress-Corrosion Cracking of Low-Dielectric-Constant Spin-On-Glass Thin Films*, J. Electrochem. Soc. 1999, 146(12), 4439-4448.

Ro, H. W., et al., *Synthesis and Characterization of Polysilsesquioxane Copolymers for Low Dielectric Applications*, Polymer Preprints 2001, 42(2), 889.

Yang, S., et al., *Molecular Templating of Nanoporouos Ultralow Dielectric Constant (≈1.5) Organosilicates by Tailoring the Microphase Separation of Triblock Copolymers*, Chem. Mater. 2001, 13, 2762-2764.

Yang, S., et al., *Nanoporous Ultralow Dielectric Constant Organosilicates Templated by Triblock Copolymers*, Chem. Mater. 2002, 14, 369-374.

Lynn, J. L., et al., *Surfactants*, in Kirk-Othmer Encyclopedia of Chemical Technology, Copyright© 1997 by John Wiley & Sons, Inc. DOI: 10.1002/0471238961.1921180612251414.a01. Article Online Posting Date: Dec. 4, 2000.

Glass, J. E., *Water-Soluble Polymers*, in Kirk-Othmer Encyclopedia of Chemical Technology; John Wiley & Sons, Inc., 1988. DOI: 10.1002/0471238961.2301200507120119.a01. Article Online Posting Date: Dec. 4, 2000.

Brown, E, S., et al., *Glycols: Ethylene Glycol and Propylene Glycol*, in Kirk-Othmer Encyclopedia of Chemical Technology, 3$^{rd}$ ed.; John Wiley & Sons: New York, 1980; vol. 11.p. 953.

Kingery, W. D., et al., *Introduction to Ceramics*, 2nd ed.; John Wiley: New York, 1976; pp. 947ff.

Kingery, W. D., et al., *Introduction to Ceramics*, 2nd ed.; John Wiley: New York, 1976; pp. 773ff.

Day, A.R., et al., *The Elastic Moduli of a Sheet Containing Circular Holes*, J. Mech. Phys. Solids 1992, 40, 1031-1051.

Ramos, T., et al., *Nanoporous Silica for Low k Dielectrics*, Mater. Res. Soc. Symp. Proc. 1997, 443, 91-98.

Bremmer, J. N. , *A New Class of Insulating Materials: Emergence of Ultralow-k*, Solid State Technol., Sep. 2001.

Kingery, W. D., et al., *Introduction to Ceramics*, 2nd ed.; John Wiley: New York, 1976; equation 18.56, p. 948.

Oliver, W. C., J. Mater. Res. 1992, 7, 1564.

Gross, D., et al., *Two-Dimensional Hexagonal Mesoporous Silica Thin Films Prepared from Block Copolymers: Detailed Characterization and Formation Mechanism*, Chem. Mater 2001, 13, pp. 1848-1856.

\* cited by examiner

COMPOSITIONS FOR PREPARING LOW DIELECTRIC MATERIALS

CROSS-REFERENCE TO RELATED APPLICATIONS

This application claims the benefit of U.S. Provisional Patent Application No. 60/384,321, filed May 30, 2002.

BACKGROUND OF THE INVENTION

The present invention relates generally to a material suitable for use, for example, in electronic devices. More specifically, the invention relates to a composition for making a low dielectric performance material or film comprising same having an improved elastic modulus and a low dielectric constant.

There is a continuing desire in the microelectronics industry to increase the circuit density in multilevel integrated circuit devices such as memory and logic chips in order to improve the operating speed and reduce power consumption. In order to continue to reduce the size of devices on integrated circuits, it has become necessary to use insulators having a low dielectric constant to reduce the resistance-capacitance ("RC") time delay of the interconnect metallization and to prevent capacitive cross talk between the different levels of metallization. Such low dielectric materials are desirable for premetal dielectric layers and inter-level dielectric layers.

Typical dielectric materials for devices with 180 nm line width are materials with a dielectric constant between about 3.8 and 4.2. As the line width decreases, the dielectric constant should also be decreased. For example, devices with 130 nm line width require materials with a dielectric constant between about 2.5 and 3.0. Extremely low dielectric constant ("ELK") materials generally have a dielectric constant between about 2.0 and 2.5. Devices with 90 nm line width require materials with dielectric constants less than 2.4. According to the 2001 International Technology roadmap for Semiconductors (ITRS) interconnect roadmap, the projected dielectric constant requirements for interlevel metal insulators will be less than 2.1 for the 65 nm node, less than 1.9 for the 45 nm node, less than 1.7 for the 32 nm node, and less than 1.6 for the 22 nm node.

A number of processes have been used for preparing low dielectric constant films. Chemical vapor deposition (CVD) and spin-on dielectric (SOD) processes are typically used to prepare thin films of insulating layers. Other hybrid processes are also known such as CVD of liquid polymer precursors and transport polymerization CVD. A wide variety of low κ materials deposited by these techniques have been generally classified in categories such as purely inorganic materials, ceramic materials, silica-based materials, purely organic materials, or inorganic-organic hybrids. Likewise, a variety of processes have been used for curing these materials to decompose and/or remove volatile components and substantially crosslink the films such as heating, treating the materials with plasmas, electron beams, or UV radiation.

Since the dielectric constant of air is nominally 1.0, one approach to reducing the dielectric constant of a material may be to introduce porosity. Porosity has been introduced in low dielectric materials through a variety of different means. A dielectric film when made porous may exhibit lower dielectric constants compared to a dense film, however, the elastic modulus of the film generally decreases with increasing porosity. Consequently, it may be impractical to use these low dielectric compositions due to the trade-off in dielectric constant with elastic modulus.

The dielectric constant (κ) of a material generally cannot be reduced without a subsequent reduction in the mechanical properties, i.e., modulus, hardness, etc., of the material. Mechanical strength is needed for subsequent processing steps such as etching, CMP ("Chemical Mechanical Planarization"), and depositing additional layers such as diffusion barriers for copper, copper metal ("Cu"), and cap layers on the product. In some of these processes, temperature cycling of multiple layers may induce stresses due to the thermal coefficient of expansion mismatch between the different materials thereby causing cracking or delamination. Surface planarity is also required and may be maintained through controlling processing parameters such as those during the film formation process and also through CMP. Mechanical integrity, or stiffness, compressive, and shear strengths, may be particularly important to survive CMP. It has been found that the ability to survive CMP may be correlated with the elastic, or Young's, modulus of the material, along with other factors including polishing parameters such as the down force and platen speed. See, for example, Wang et al., "Advanced processing: CMP of CU/low-κ and Cu/ultralow-κ layers", Solid State Technol., September, 2001; Lin et al., "Low-κ Dielectrics Characterization for Damascene Integration", International Interconnect Technology Conference, Burlingame, Calif., June, 2001. These mechanical properties are also important in the packaging of the final product.

Another consideration in the production of low dielectric materials and the resultant film is the level of metal impurities present in the material. In order for a low dielectric film to be suitable for Integrated Circuit (IC) fabrication, it is desirable that the film has a controlled level of impurities. In other words, the film should be deposited using ingredients that have minimal levels of nonvolatile impurities that may be harmful in silicon oxide-based insulator films in microelectronic devices. In the IC industry, it is well known that alkali metal ions such as sodium and potassium should be excluded from silicon dioxide films used as metal oxide semiconductor ("MOS") transistor insulators and multilevel interconnection insulators. These positively charged ions might become mobile when exposed to electric fields and drift away from the positively biased film interface and toward the negatively biased film interface causing capacitance-voltage shifts.

Some commercially available chemical reagents used in the production of low dielectric films contain alkali metal impurities. These impurities may result from residual levels of catalyst used in the manufacture of the chemical precursor reagents. Ratios of 0.005–0.05:1 mol of NaOH, KOH, or NaOCH$_3$ to alcohol are frequently used in the base-catalyzed ethoxylation of aliphatic alcohols, alkylphenols, and fatty acids. See, e.g., Lynn et al., "Surfactants", Kirk-Othmer Encyclopedia of Chemical Technology, John Wiley & Sons, Inc., (1997). For example, the use of 0.005 mol NaOH per mol of alcohol in the production of TRITON™ X-114, an alkylphenol ethoxylate with an average 7.5 moles of ethoxylate per mole of alcohol, may result in 214 ppm of sodium in the final product. Such levels of residual catalytic impurities are often of little consequence in typical applications of these chemicals because the surfactant is often used at such low levels that the catalytic impurities imparted by the surfactant become insignificant in the final formulation. A polymer such as polyethylene glycol (PEG) may be made using different catalyst systems depending on the desired molecular weight. For molecular weight below 20,000, base or the Na⁺ or K⁺ alkoxides of methanol or butanol are used as the catalyst. See, for instance, Glass, J. E. "Water-Soluble Polymers", Kirk-Othmer Encyclopedia of Chemical Technology, John Wiley & Sons, Inc. (1988). Solvents, like surfactants, can also contain residual catalytic impurities. For instance, the formation of ethers, such as propylene glycol propyl ether (PGPE), through the reaction of propylene oxide with an alcohol, is often base-catalyzed when high selectivity to the primary alkyl ether over the secondary ether is desired which can result in residual impurities. See, for instance, Brown, et al., "Glycols: Ethylene Glycol and Propylene Glycol", Kirk-Othmer Encyclopedia of Chemical Technology, 3rd ed., John Wiley & Sons, N.Y., (1980), Vol. 11, p 953. A further source of impurities may result from an inattention to detail, such as packaging or handling outside a clean room, because such stringent purity requirements are not needed for typical applications.

Alkali metal impurity specifications for chemical precursor solutions for integrated circuit applications typically set the allowable impurity levels to approximately 20 parts per billion maximum for each type of alkali metal and less than 50 ppb total. To meet these limits, the material supplier to the IC industry may purify the surfactants. The reference, EP 1,142,832, assigned to the assignee of the present application, discusses how the dielectric and mechanical properties of the resulting films may be adversely affected by the purification of surfactants used as porogens in the film-forming mixture. The reference, US 2002/0045693, discusses how the dielectric properties of the resulting films may be adversely affected by the purification of reagents even if surfactant is not present.

The following references, U.S. Pat. Nos. 6,406,794, 6,329,017, 6,495,479, 6,126,733, U.S. Pat. App. Serial No. 2002/0189495, EP 1123753, and Chem. Mater. 2001 13, 2762 and 1848, provide various compositions used for forming dielectric films that include chemical reagents such as at least one source for silicon, a porogen, and a solvent. These references fail to disclose the purification of the chemical reagents, particularly porogens, prior to addition to the composition to remove alkali metal impurities. Some references, such as U.S. Pat. Nos. 6,376,634 and 6,126,733, discuss purifying the reagents prior to addition to the composition. However, as mentioned previously, in certain instances the purification process may adversely affect the dielectric constant and/or mechanical properties of the material.

Accordingly, there is a need in the art to provide improved dielectric materials having low dielectric constant and sufficient mechanical strength. To achieve that end, there is also a need in the art to provide a means to correlate dielectric constant, porosity, and elastic modulus to identify and develop low dielectric materials. There is also a need in the art to provide dielectric materials and films that have relatively low metal content yet still maintain the beneficial properties, i.e., lower κ and higher modulus, that high levels of metals may impart. Further, there is a need in the art to provide processes for making low dielectric films at relatively low temperatures and relatively short cycle times.

All references cited herein are incorporated herein by reference in their entirety.

BRIEF SUMMARY OF THE INVENTION

The present invention satisfies some, if not all of the needs in the art by providing improved performance materials and films comprising same, preferably having a dielectric constant of 3.7 or below, yet sufficient mechanical strength.

In one aspect of the present invention, there is provided a mixture of an at least one chemical reagent for producing a performance material having a dielectric constant of about 3.7 or less comprising: at least one silica source; at least one porogen; a carboxylate selected from the group consisting of a carboxylic acid, a carboxylate anion, a carboxylic acid ester, or combinations thereof; and an ionic additive. The at least one chemical reagent is purified prior to adding to the mixture if it has a metal impurity level of 1 ppm or greater.

In a further aspect of the present invention, there is provided a process for forming a performance film having a dielectric constant of 3.7 or less comprising: providing a mixture of an at least one chemical reagent comprising: an at least one silica source; a carboxylate selected from the group consisting of a carboxylic acid, a carboxylate anion, a carboxylic acid ester, or combinations thereof; and an at least one porogen comprising from about 5 weight percent to about 75 weight percent ethylene oxide groups; wherein if at least one chemical reagent has a metal impurity level of 1 ppm or greater then the reagent is purified; depositing the mixture onto a substrate to form a coated substrate; and curing the coated substrate to one or more temperatures and for a time sufficient to form said performance film.

In an another aspect of the present invention, there is provided a mixture of an at least one chemical reagent for producing a performance material having a dielectric constant of about 3.7 or less comprising: at least one silica source; at least one porogen wherein the at least one porogen comprises from about 5 weight percent to about 75 weight percent ethylene oxide groups; and a carboxylate selected from the group consisting of a carboxylic acid, a carboxylate anion, a carboxylic acid ester, or combinations thereof; wherein the at least one chemical reagent has a metal impurity level below 1 ppm.

In yet another aspect of the present invention, there is provided a mixture of an at least one chemical reagent for producing a performance material having a dielectric constant of about 3.7 or less comprising: at least one silica source; an at least one porogen; and a strong acid catalyst in an amount sufficient to adjust a pAcid value of the mixture to a range of from about 2.2 to about 9.

In a still further aspect of the present invention, there is provided a mixture of an at least one chemical reagent for producing a performance material having a dielectric constant of about 3.7 or less comprising: at least one silica source; at least one porogen wherein the at least one porogen comprises about 75 weight percent or less of ethylene oxide groups; and an ionic additive; provided that if the at least one chemical reagent has a metal impurity level of 1 ppm or greater then the at least one chemical reagent is purified prior to adding to the mixture.

In another aspect of the present invention, there is provided a mixture of an at least one chemical reagent for producing a performance material having a dielectric constant of about 3.7 or less comprising: at least one silica source; and at least one porogen wherein the at least one porogen comprises from about 5 to about 75 weight percent of ethylene oxide groups, provided that if the at least one chemical reagent has a metal impurity level of 1 ppm or greater then the at least one chemical reagent is purified prior to adding to the mixture.

In a still further aspect of the present invention, there is provided a process for forming a performance film having a dielectric constant of 3.7 or less comprising: providing a mixture of an at least one chemical reagent comprising an at least one silica source, an at least one porogen, and about 5000 ppm or less of an ionic additive; depositing the mixture onto a substrate to form a coated substrate; and curing the coated substrate to one or more temperatures and for a time sufficient to form said performance film; provided that if the at least one chemical reagent has a metal impurity level of 1 ppm or greater then the step of purifying the at least one chemical reagent is conducted prior to adding the at least one chemical reagent to the mixture.

In another aspect of the present invention, there is provided a process for process for forming a performance film having a dielectric constant of 3.7 or less comprising: providing a mixture of an at least one chemical reagent comprising: at least one silica source; and at least one porogen wherein the at least one porogen comprises from about 5 to about 75 weight percent of ethylene oxide groups provided that if the at least one chemical reagent has a metal impurity level of 1 ppm or greater then a step of purifying the at least one chemical reagent is conducted prior to adding the at least one chemical reagent to the mixture; depositing the mixture onto a substrate to form a coated substrate; and curing the coated substrate to one or more temperatures and for a time sufficient to form said performance film.

In yet another aspect of the present invention, there is provided a process for forming a performance film having a dielectric constant of 3.7 or less comprising: providing a mixture of an at least one chemical reagent comprising: at least one silica source; at least one porogen; and a strong acid catalyst in an amount sufficient to adjust a pAcid value of the mixture to a range of from about 2.2 to about 9; depositing the mixture onto a substrate to form a coated substrate; and curing the coated substrate to one or more temperatures and for a time sufficient to form said performance film.

These and other aspects of the invention will become apparent from the following detailed description.

DETAILED DESCRIPTION OF THE INVENTION

Figure 1A:
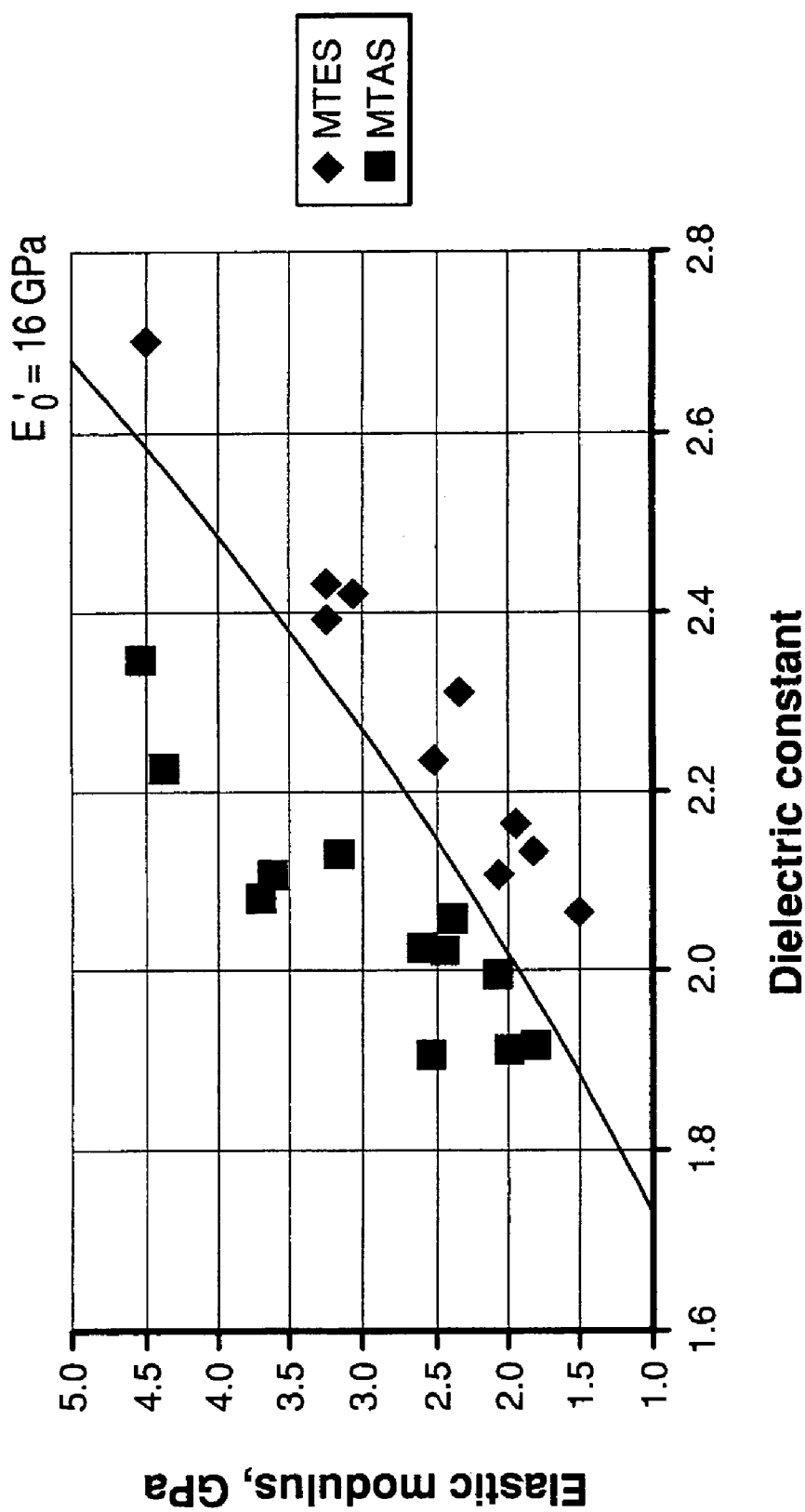
FIGS. 1a and 1b illustrate the effect of weight percent ethylene oxide groups for single surfactants and mixtures of surfactants, respectively, on the normalized wall elastic modulus on the materials of the present invention.

The present invention is directed to low dielectric materials and films comprising same. The dielectric materials of the present invention have relatively low metal content and allow for ease of manufacture in comparison to other materials in the art. The low dielectric materials and films of the present invention are suitable for use as a "performance material". The term "performance material" as used herein relates to an inorganic material that is suitable for use as an interlevel dielectric (ILD), or a mesoporous silicon-based material that is suitable for use in semiconductors, semiconductor manufacturing, photonics, nano-scale mechanical or nano-scale electrical devices, gas separations, liquid separations, or chemical sensors. The terms "silicon-based" and "silica-based" are used interchangeably throughout the specification.

In certain preferred embodiments, the dielectric or performance material of the present invention may have improved mechanical and other properties as a result of the selecting the weight percentage of ethoxylation in the porogen. The improvement in properties may be expressed by the normalized wall elastic modulus ($E_0'$). Pending U.S. patent application Ser. No. 10/158,511, which is incorporated herein by reference in its entirety, discusses the normalized wall elastic modulus ($E_0'$) and its relationship on the material properties. Two measured attributes of a low dielectric material, dielectric constant and elastic modulus, are correlated into one figure of merit, the normalized wall elastic modulus ($E_0'$), that can be used to identify and develop improved low dielectric materials. Improved dielectric materials are materials having a low dielectric constant yet high enough elastic modulus to tolerate subsequent processing steps such as packaging and CMP processes. In this connection, materials with substantially identical normalized wall elastic modulus values belong to a family of materials whose dielectric constant and elastic modulus can be adjusted by varying the porosity. Thus, once an improved dielectric material is identified, i.e. one with a higher normalized wall elastic modulus, the target dielectric constant can be obtained by varying the porosity.

The term "normalized wall elastic modulus", as used herein, is the wall elastic modulus of a material that is normalized to a wall with a dielectric constant of 4.2, which is the dielectric constant of a $SiO_2$ dense oxide material. Once the dielectric constant ($\kappa$) and the elastic modulus (E) of a material are measured, the normalized wall elastic modulus ($E_0'$) can be calculated. The $E_0'$ of the material is calculated using Maxwell's relationship for mixed dielectrics applied to porous materials, the measured value for dielectric constant ($\kappa$), a wall $\kappa_{SiO2}$ of 4.2, Day's 2-d circular hole model for elastic modulus extended to 3-d cylindrical pores with the modulus measured perpendicular to the pore axes, and the measured value for E. While the derivation for the normalized wall elastic modulus is based upon cylindrical pores in the extension of the Day model and spherical inclusions in the Maxwell model, it is anticipated that other types and forms or porosity, i.e., non-cylindrical, open porosity, closed porosity, etc., would fall within the scope of the present invention.

A void fraction value is first calculated from the Maxwell equation using the observed value for $\kappa$ of the material and a value for the wall $\kappa$ of 4.2, corresponding to the dielectric constant of dense, amorphous silica. The dielectric constant of the material is preferably less than 4.2 since $\kappa_{SiO2}$ is 4.2. The Maxwell equation was rearranged to solve for porosity or void fraction, as a function of measured $\kappa$ and wall $\kappa$, as provided in Equation (1):

$$\chi_P = \frac{\left[\frac{2}{3} + \frac{1}{3 \times \kappa_{SiO2}}\right] \times (\kappa_{SiO2} - \kappa)}{\left[\frac{2}{3} + \frac{1}{3 \times \kappa_{SiO2}}\right] \times (\kappa_{SiO2} - \kappa) + \kappa - 1} \quad \text{Equation (1)}$$

where:
$\kappa_{SiO2} = 4.2$
$\chi_p$ = void fraction value
$\kappa$ = measured value of dielectric constant The normalized wall elastic modulus may then be calculated based on Day's 2-d circular hole model for elastic modulus using Equation (2). The equation is valid for void fractions less than $q_c$, the critical porosity at which the pores touch, and beyond which the modulus is predicted to be zero. For materials with a wall κ of 4.2, this determines a minimum κ value=1.23 for composites with E>0.

Day et al. 2-d circular hole model:

$$\frac{E_{2d}^*}{E_0} = \left[\left(\frac{1-q/q_c}{1+q/mq_l}\right)\left(1 + \frac{q}{q_c} + \alpha\theta\left(\frac{q}{q_c}\right)^2 + \alpha(1-\theta)\left(\frac{q}{q_c}\right)^3\right)\right]^m \quad \text{Equation (2)}$$

where
q=void fraction
$q_c$=0.9069=percolation threshold, void fraction at which circles overlap and modulus goes to zero
$q_1$=⅓=initial slope
m=1.5=critical exponent
α=−0.251=parameter to get correct critical amplitude
θ=−1.83=free fitting parameter The Day 2-d circular hole model for elastic modulus is extended to 3-d cylindrical pores with the modulus measured perpendicular to the pore axes as provided in the Equation (3). The normalized wall elastic modulus can be calculated using the calculated void fraction value from Equation (1), the elastic modulus for 2-d circular holes from Equation (2), the observed value for E, and a value for Poisson's ratio (ν) of 0.25.

3-d extension perpendicular to the cylinders:

$$\frac{E_0}{E_{3d\perp}^*} = \frac{\nu^2}{1-q} + \frac{1-\nu^2}{E_{2d}^*/E_0} \quad \text{Equation (3)}$$

where
ν=Poisson's ratio=0.25
q=void fraction
$E_0$=wall elastic modulus

When q is set equal to the void fraction value $\chi_p$ obtained from the measured value of κ and Equation (1), and $E^*_{3d\perp}$ is set equal to the measured value of elastic modulus, E, then $E_0$ becomes $E_0'$, the normalized wall elastic modulus, giving the following equation, Equation (4), for $E_0'$:

methods. In certain embodiments of the present invention, non-contact induced spreading forces such as the process described in pending U.S. Pat. Application Attorney's Docket 2001-030-SMX 3122 entitled "Apparatus and Methods for Forming Films on Substrates", may be used to apply the mixture, which is incorporated herein by reference in its entirety. Further related processes may be used to apply the mixture include oscillating non-contact induced spreading forces, gravity-induced spreading forces, wetting-induced spreading forces, or combinations thereof.

The materials of the present invention preferably comprise silica. The term "silica", "silica based", or "silica containing", as used herein, is a material that has silicon (Si) and oxygen (O) atoms, and possibly additional substituents such as, but not limited to, other elements such as H, B, C, P, or halide atoms or organic groups such as alkyl groups or aryl groups. In certain preferred embodiments, the material may further comprise silicon-carbon bonds having a total number of Si—C bonds to the total number of Si atoms ranging from between about 20 to about 80 mole percent, and more preferably from between about 40 to about 60 mole percent.

The film of the present invention is preferably formed from a mixture. The mixture may be prepared prior to forming the film or the mixture may form during at least a portion of the film forming process. Depending upon the film formation method, the mixture may be deposited onto a substrate as a liquid, vapor, gas, or aerosol of the mixture.

The mixture generally comprises an at least one silica source and at least one porogen. The mixture may further include other constituents such as, but not limited to, water, solvent(s), catalyst, and/or ionic additives. The weight ratio of weight of porogen to the weight of porogen and weight of $SiO_2$ ranges from 0.9 to 0.1. The preferred range may vary depending the desired dielectric constant of the material produced from the mixture because the dielectric constant of the material is inversely proportional to the weight ratio of the porogen. The weight of $SiO_2$ is calculated from the total number of moles of silicon introduced by the silica sources within the mixture. This is not meant to imply that the silica sources are completely converted to $SiO_2$. The weight ratio of solvent to silica is about 30:1 wherein the solvent may include water. The weight ratio of ionic additive to weight of porogen is 0.5 to 0. The molar ratio of R, or organic constituents, to Si ranges from 0.2 to 0.8. The molar ratio of $$E_0' = E \times \left[\frac{\nu^2}{1-q} + (1-\nu^2) \times \left[\left(\frac{1-q/q_c}{1+q/mq_l}\right)\left(1 + \frac{q}{q_c} + \alpha\theta\left(\frac{q}{q_c}\right)^2 + \alpha(1-\theta)\left(\frac{q}{q_c}\right)^3\right)\right]^m\right] \quad \text{Equation (4)}$$

Preferably the normalized wall elastic modulus is 16 GPa or greater, more preferably 18 GPa or greater.

The material of the present invention may be formed into a film from a precursor composition or mixture using a variety of different methods. Some examples of processes that may be used to form the film include plasma enhanced chemical vapor deposition ("PECVD"), high density PECVD, photon assisted CVD, plasma-photon assisted CVD ("PPECVD"), CVD of a liquid polymer precursor, or transport polymerization ("TP"). U.S. Pat. Nos. 6,171,945 and 6,054,206 provide some exemplary CVD methods that may be used with the present invention. Other processes that can be used to form the film include spin-on deposition water to OR, where OR is an organic group bonded to silicon through an oxygen atom, e.g. ethoxy functionality on TEOS, ranges from 40 to 1.

The mixture employs chemicals that meet the requirements of the electronics industry because they do not contain contaminants, which reduce the efficiency of preparation of integrated circuits. Constituents like halogen-containing mineral acids, cationic surfactants with halide counter ions, and anionic surfactants with alkali metal counter ions are preferably avoided in the mixture because they may contribute undesirable counter ions to the materials of the invention. The mixtures of the present invention preferably contain contaminating metals in amounts less than 1 parts per million ("ppm"), preferably less than 200 parts per billion ("ppb"), and more preferably less than 50 ppb. Consequently, materials of the invention may preferably contain contaminating metals in amounts less than 1 parts per million ("ppm"), preferably less than 200 parts per billion ("ppb"), and more preferably less than 50 ppb. Materials of the invention preferably contain contaminating halides in amounts less than 1 ppm, preferably less than 750 ppb, and more preferably less than 500 ppb. The chemical reagents within the mixture contain contaminating metals in amounts less than 1 parts per million ("ppm"), preferably less than 200 parts per billion ("ppb"), and more preferably less than 50 ppb. In certain preferred embodiments, if the chemical reagent contains 1 ppm or greater of contaminating metals, the chemical reagent may be purified prior to addition to the mixture.

As mentioned previously, the mixture comprises at least one silica source. A "silica source", as used herein, is a compound having silicon (Si) and oxygen (O) and possibly additional substituents such as, but not limited to, other elements such as H, B, C, P, or halide atoms and organic groups such as alkyl groups; or aryl groups. The term "alkyl" as used herein includes linear, branched, or cyclic alkyl groups, containing from 1 to 24 carbon atoms, preferably from 1 to 12 carbon atoms, and more preferably from 1 to 5 carbon atoms. This term applies also to alkyl moieties contained in other groups such as haloalkyl, alkaryl, or aralkyl. The term "alkyl" further applies to alkyl moieties that are substituted, for example with carbonyl functionality. The term "aryl" as used herein six to twelve member carbon rings having aromatic character. The term "aryl" also applies to aryl moieties that are substituted. The silica source may include materials that have a high number of Si—O bonds, but can further include Si—O—Si bridges, Si—R—Si bridges, Si—C bonds, Si—H bonds, Si—F bonds, or C—H bonds. It is preferred that the at least one silica source imparts a minimum of Si—OH bonds in the dielectric material.

The following are non-limiting examples of silica sources suitable for use in the mixture and method of the present invention. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R_aSi(OR^1)_{4-a}Si$, when a is 2, the two R groups need not be identical to each other or to $R^1$.

The term "monovalent organic group" as used herein relates to an organic group bonded to an element of interest, such as Si or O, through a single C bond, i.e., Si—C or O—C. Examples of monovalent organic groups include an alkyl or an aryl group. The alkyl group may be a linear, branched, or cyclic alkyl group having from 1 to 5 carbon atoms such as, for example, a methyl, ethyl, propyl, butyl, or pentyl group. Examples of aryl groups suitable as the monovalent organic group include phenyl, methylphenyl, ethylphenyl and fluorophenyl. In certain embodiments, one or more hydrogens within the alkyl group may be substituted with an additional atom such as a halide atom (i.e., fluorine), or an oxygen atom to give a carbonyl functionality.

In certain embodiments, the at least one silica source may be represented by the following formula: $R_aSi(OR^1)_{4-a}$, wherein R independently represents a hydrogen atom, a fluorine atom, or a monovalent organic group; $R^1$ independently represents a monovalent organic group; and a is an integer ranging from 1 to 2. Specific examples of the compounds represented by $R_aSi(OR^1)_{4-a}$ include: methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltin-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane; sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, isobutyltrimethoxysilane, isobutyltriethoxysilane, isobutyltri-n-propoxysilane, isobutyltriisopropoxysilane, isobutyltri-n-butoxysilane, isobutyltri-sec-butoxysilane, isobutyltri-tert-butoxysilane, isobutyltriphenoxysilane, n-pentyltrimethoxysilane, n-pentyltriethoxysilane, n-pentyltri-n-propoxysilane, n-pentyltriisopropoxysilane, n-pentyltri-n-butoxysilane, n-pentyltri-sec-butoxysilane, n-pentyltri-tert-butoxysilane, n-pentyltriphenoxysilane; sec-pentyltrimethoxysilane, sec-pentyltriethoxysilane, sec-pentyltri-n-propoxysilane, sec-pentyltriisopropoxysilane, sec-pentyltri-n-butoxysilane, sec-pentyltri-sec-butoxysilane, sec-pentyltri-tert-butoxysilane, sec-pentyltriphenoxysilane, tert-pentyltrimethoxysilane, tert-pentyltriethoxysilane, tert-pentyltri-n-propoxysilane, tert-pentyltriisopropoxysilane, tert-pentyltri-n-butoxysilane, tert-pentyltri-sec-butoxysilane, tert-pentyltri-tert-butoxysilane, tert-pentyltriphenoxysilane, isopentyltrimethoxysilane, isopentyltriethoxysilane, isopentyltri-n-propoxysilane, isopentyltriisopropoxysilane, isopentyltri-n-butoxysilane, isopentyltri-sec-butoxysilane, isopentyltri-tert-butoxysilane, isopentyltriphenoxysilane, neo-pentyltrimethoxysilane, neo-pentyltriethoxysilane, neo-pentyltri-n-propoxysilane, neo-pentyltriisopropoxysilane, neo-pentyltri-n-butoxysilane, neo-pentyltri-sec-butoxysilane, neo-pentyltri-neo-butoxysilane, neo-pentyltriphenoxysilane phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, δ-trifluoropropyltrimethoxysilane, δ-trifluoropropyltriethoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyidi-tert-butoxysilane, dimethyldiphenoxysilane, diethyldimethoxysilane, diethyidiethoxysilane, diethyldi-n-propoxysilane, diethyldiisopropoxysilane, diethyldi-n-butoxysilane, diethyldi-sec-butoxysilane, diethyidi-tert-butoxysilane, diethyldiphenoxysilane, di-n-propyldimethoxysilane, di-n-propyldimethoxysilane, di-n-propyidi-n-propoxysilane, di-n-propyldiisopropoxysilane, di-n-propyldi-n-butoxysilane, di-n-propyldi-sec-butoxysilane, di-n-propyidi-tert-butoxysilane, di-n-propyldiphenoxysilane, diisopropyldimethoxysilane, diisopropyidiethoxysilane, diisopropyldi-n-propoxysilane, diisopropyldiisopropoxysilane, diisopropyldi-n-butoxysilane, diisopropyldi-sec-butoxysilane, diisopropyidi-tert-butoxysilane, diisopropyldiphenoxysilane, di-n-butyldimethoxysilane, di-n-butyldiethoxysilane, di-n-butyldi-n-propoxysilane, di-n-butyidiisopropoxysilane, di-n-butyidi-n-butoxysilane, di-n-butyidi-sec-butoxysilane, di-n-butyldi-tert-butoxysilane, di-n-butyldiphenoxysilane, di-sec-butyldimethoxysilane, di-sec-butyidiethoxysilane, di-sec-butyldi-n-propoxysilane, di-sec-butyidiisopropoxysilane, di-sec-butyldi-n-butoxysilane, di-sec-butyldi-sec-butoxysilane, di-sec-butyidi-tert-butoxysilane, di-sec-butyldiphenoxysilane, di-tert-butyldimethoxysilane, di-tert-butyidiethoxysilane, di-tert-butyldi-n-propoxysilane, di-tert-butyldiisopropoxysilane, di-tert-butyidi-n-butoxysilane, di-tert-butyidi-sec-butoxysilane, di-tert-butyldi-tert-butoxysilane, di-tert-butyldiphenoxysilane, diphenyldimethoxysilane, diphenyidiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, methyineopentyldimethoxysilane, methylneopentyldiethoxysilane, methyldimethoxysilane, ethyldimethoxysilane, n-propyldimethoxysilane, isopropyldimethoxysilane, n-butyldimethoxysilane, sec-butyldimethoxysilane, tert-butyidimethoxysilane, isobutyidimethoxysilane, n-pentyidimethoxysilane, sec-pentyldimethoxysilane, tert-pentyidimethoxysilane, isopentyidimethoxysilane, neopentyidimethoxysilane, neohexyldimethoxysilane, cyclohexyldimethoxysilane, phenyldimethoxysilane, methyldiethoxysilane, ethyidiethoxysilane, n-propyldiethoxysilane, isopropyldiethoxysilane, n-butyldiethoxysilane, sec-butyidiethoxysilane, tert-butyidiethoxysilane, isobutyldiethoxysilane, n-pentyldiethoxysilane, sec-pentyldiethoxysilane, tert-pentyidiethoxysilane, isopentyldiethoxysilane, neopentyldiethoxysilane, neohexyldiethoxysilane, cyclohexyldiethoxysilane, phenyidiethoxysilane, trimethoxysilane, triethoxysilane, tri-n-propoxysilane, triisopropoxysilane, tri-n-butoxysilane, tri-sec-butoxysilane, tri-tert-butoxysilane, triphenoxysilane. Of the above compounds, the preferred compounds are methyltrimethoxysilane, methyltriethoxysilane, methyltri-n-propoxysilane, methyltriisopropoxysilane, ethyltrimethoxysilane, ethyltriethoxysilane, dimethyldimethoxysilane, dimethyldiethoxysilane, diethyldimethoxysilane, and diethyldiethoxysilane.

The at least one silica source may be a compound having the formula $Si(OR^2)_4$ wherein $R^2$ independently represents a monovalent organic group. Specific examples of the compounds represented by $Si(OR^2)_4$ include tetramethoxysilane, tetraethoxysilane, tetra-n-propoxysilane, tetraisopropoxysilane tetra-n-butoxysilane, tetra-sec-butoxysilane, tetra-tert-butoxysilane, tetraacetoxysilane, and tetraphenoxysilane. Of the above, the preferred compounds are tetramethoxysilane, tetraethoxysilane, tetra-n-propoxysilane, or tetraisopropoxysilane, tetraphenoxysilane.

The at least one silica source may be a compound having the formula $R^3{}_b(R^4O)_{3-b}Si-(R^7)-Si(OR^5)_{3-c}R^6{}_c$, wherein $R^3$ and $R^6$ are independently a hydrogen atom, a fluorine atom, or a monovalent organic group; $R^4$ and $R^5$ are independently a monovalent organic group; b and c may be the same or different and each is a number ranging from 0 to 2; $R^7$ is an oxygen atom, a phenylene group, or a group represented by $-(CH_2)_n-$, wherein n is an integer ranging from 1 to 6; or combinations thereof. Specific examples of these compounds wherein $R^7$ is an oxygen atom include: hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyidisiloxane, 1,1,1,3,3-pentamethoxy-3-phenyldisiloxane, 1,1,1,3,3-pentaethoxy-3-phenyldisiloxane, 1,1,3,3-tetramethoxy-1,3-dimethyldisiloxane, 1,1,3,3-tetraethoxy-1,3-dimethyidisiloxane, 1,1,3,3-tetramethoxy-1,3-diphenyldisiloxane, 1,1,3,3-tetraethoxy-1,3-diphenyldisiloxane, 1,1,3-trimethoxy-1,3,3-trimethyidisiloxane, 1,1,3-triethoxy-1,3,3-trimethyidisiloxane, 1,1,3-trimethoxy-1,3,3-triphenyldisiloxane, 1,1,3-triethoxy-1,3,3-triphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane. Of those, preferred compounds are hexamethoxydisiloxane, hexaethoxydisiloxane, hexaphenoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyidisiloxane, 1,3-diethoxy-1,1,3,3-tetramethyidisiloxane, 1,3-dimethoxy-1,1,3,3-tetraphenyldisiloxane; 1,3-diethoxy-1,1,3,3-tetraphenyldisiloxane. Specific examples of these compounds wherein $R^7$ is a group represented by $-(CH_2)_n-$ include: bis(trimethoxysilyl)methane, bis(triethoxysilyl)methane, bis(triphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, 1,2-bis(trimethoxysilyl)ethane, 1,2-bis(triethoxysilyl)ethane, 1,2-bis(triphenoxysilyl)ethane, 1,2-bis(dimethoxymethylsilyl)ethane, 1,2-bis(diethoxymethylsilyl)ethane, 1,2-bis(dimethoxyphenylsilyl)ethane, 1,2-bis(diethoxyphenylsilyl)ethane, 1,2-bis(methoxydimethylsilyl)ethane, 1,2-bis(ethoxydimethylsilyl)ethane, 1,2-bis(methoxydiphenylsilyl)ethane, 1,2-bis(ethoxydiphenylsilyl)ethane, 1,3-bis(trimethoxysilyl)propane, 1,3-bis(triethoxysilyl)propane, 1,3-bis(triphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane; 1,3-bis(ethoxydiphenylsilyl) propane. Of those, preferred compounds are bis(trimethoxysilyl)methane, bis(triethoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane and bis (ethoxydiphenylsilyl)methane.

In certain preferred embodiments of the present invention, $R^1$ of the formula $R_aSi(OR^1)_{4-a}$; $R^2$ of the formula $Si(OR^2)_4$; and $R^4$ and/or $R^5$ of the formula $R^3{}_b(R^4O)_{3-b}Si-(R^7)-Si(OR^5)_{3-c}R^6{}_c$ can each independently be a monovalent organic group of the formula:

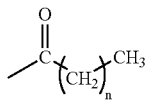

wherein n is an integer ranging from 0 to 4. Specific examples of these compounds include: tetraacetoxysilane, methyltriacetoxysilane, ethyltriacetoxysilane, n-propyltriacetoxysilane, isopropyltriacetoxysilane, n-butyltriacetoxysilane, sec-butyltriacetoxysilane, tert-butyltriacetoxysilane, isobutyltriacetoxysilane, n-pentyltriacetoxysilane, sec-pentyltriacetoxysilane, tert-pentyltriacetoxysilane, isopentyltriacetoxysilane, neopentyltriacetoxysilane, phenyltriacetoxysilane, dimethyldiacetoxysilane, diethyidiacetoxysilane, di-n-propyidiacetoxysilane, diisopropyidiacetoxysilane, di-n-butyldiacetoxysilane, di-sec-butyidiacetoxysilane, di-tert-butyldiacetoxysilane, diphenyldiacetoxysilane, triacetoxysilane. Of these compounds, tetraacetoxysilane and methyltriacetoxysilane are preferred.

Other examples of the at least one silica source may include a fluorinated silane or fluorinated siloxane such as those provided in U.S. Pat. No. 6,258,407.

Another example of at least one silica source may include compounds that produce a Si—H bond upon elimination.

Still further examples of the at least one silica source are found in the non-hydrolytic chemistry methods described, for example, in the references Hay et al., "Synthesis of Organic-Inorganic Hybrids via the Non-hydrolytic Sol-Gel Process", Chem. Mater., 13, 3396–3403 (2001) or Hay, et al., "A Versatile Route to Organically-Modified Silicas and Porous Silicas via the Non-Hydrolytic Sol-Gel Process", J. Mater. Chem., 10, 1811–1818 (2000).

Yet another example of at least one silica source may include colloidal silica, fumed silica, or silicic acid starting materials.

Still other examples of silica sources include silsesquioxanes such as hydrogen silsesquioxanes (HSQ, $HSiO_{1.5}$) and methyl silsesquioxanes (MSQ, $RSiO_{1.5}$ where R is a methyl group).

In certain preferred embodiments, the at least one silica source may preferably have an at least one carboxylic acid ester bonded to the Si atom. In addition to the at least one silica source wherein the silica source has at least one Si atom having an carboxylate group attached thereto, the mixture may further comprise additional silica sources that may not necessarily have the carboxylate attached to the Si atom.

In preferred embodiments, a combination of hydrophilic and hydrophobic silica sources is used in the mixture. In preferred embodiments, the ratio of hydrophobic silica source to the total amount of silica source is greater than about 0.2 molar ratio, preferably from 0.2 to 0.8 molar ratio. The term "hydrophilic", as used herein, refers to compounds wherein the silicon atom can crosslink through at least four bonds. Some examples of hydrophilic sources include alkoxysilanes having an alkoxy functionality and can at least partially crosslink, i.e. a Si atom with four methoxy, ethoxy, propoxy, acetoxy, etc. groups, or materials with carbon or oxygen bonds between Si atoms and all other functionality on the Si atoms being an alkoxide. If the Si atoms do not fully crosslink, residual Si—OH groups may be present as terminal groups that can adsorb water. The term hydrophobic source refers to compounds where at least one of the alkoxy functionalities has been replaced with a terminal Si—C or Si—F bond, i.e. Si-methyl, Si-ethyl, Si-phenyl, Si-cyclohexyl, etc., that would not generate a hydroxyl after hydrolysis. In these sources, the silicon would crosslink with less than four bridges even when fully crosslinked as a result of hydrolysis and condensation of Si—OH groups if the terminal group remains intact. In certain preferred embodiments, the hydrophobic silica source contains a methyl group attached to the silicon atom.

The at least one silica source may be added to the mixture as the product of hydrolysis and condensation. Hydrolysis and condensation of the silica source occurs by adding water and a catalyst to a solvent and adding the silica source at a time, intermittently or continuously, and conducting hydrolysis and condensation reactions while stirring the mixture at a temperature range generally from −30 to 100° C., preferably from 20 to 100° C., for 0 to 24 hours. The composition can be regulated to provide a desired solid content by conducting concentration or dilution with the solvent in each step of the preparation.

The hydrolysis and condensation of the silica source can occur at any point during the formation of the film, i.e., before adding to the mixture, after adding to the mixture, prior to or during curing, etc. For example, in certain embodiments of the present invention, the at least one silica source is combined with the solvent, water, and surfactant in a first vessel, the ionic additive and catalyst are combined in a second vessel, and the contents of the second vessel are gradually added to the first vessel and mixed. It is envisioned that a variety of different orders of addition to the mixture can be used without departing from the spirit of the present invention. In certain embodiments, the at least one silica source is at least partially hydrolyzed at a low pAcid value, i.e., from about 1 to 2.2 to substantially reach hydrolysis equilibrium, and then the pAcid value is increased to a range of from 2.2 to 9 to at least partially condense the at least one silica source. The pAcid value is a measurement of the acidity of the mixture as defined herein.

The mixture may further include a carboxylate. In certain embodiments, the carboxylate that is added to the mixture may be selected from the group consisting of carboxylic acid, a carboxylate anion, a carboxylic acid ester, or combinations thereof. Examples of carboxylic acids include formic, acetic, propionic, maleic, oxalic, glycolic, glyoxalic, or mixtures thereof. Examples of carboxylic acid ester compounds include ethyl acetate, acetic anhydride, and ethoxylated fatty acids. The carboxylate compound may be added as a separate ingredient, be formed within the mixture upon the dissolution of the chemical reagent within the mixture; and/or be part of at least one silica source wherein at least one carboxylic acid ester is bonded to the Si atom, such as tetraacetoxysilane, methyltriacetoxysilane, etc. The carboxylic acid esters may react in the presence of water and/or catalyst to generate carboxylic acid. In some instances, the carboxylate compound may act as the catalyst within the mixture for the hydrolysis and condensation of the at least one silica source.

The catalyst suitable for the present invention includes any organic or inorganic acid or base that can catalyze the hydrolysis of substitutents from the silica source in the presence of water, and/or the condensation of two silica sources to form an Si—O—Si bridge. The catalyst can be an organic base such as, but not limited to, quaternary ammonium salts and hydroxides, such as ammonium or tetramethylammonium, amines such as primary, secondary, and tertiary amines, and amine oxides. The catalyst can also be an acid such as, but not limited to, nitric acid, maleic, oxalic, acetic, formic, glycolic, glyoxalic acid, or mixtures thereof.

In preferred embodiments, the catalyst comprises a non-halide containing acid, preferably nitric acid. In certain preferred embodiments, the catalyst may comprise a strong acid catalyst, i.e., have a $pK_a$ that is 2 or less, to maintain the pAcid value of the mixture at a range of from 2.2 to 9.

The term solvent as used herein refers to any liquid or supercritical fluid that provides solubility with the reagents, adjusts the film thickness, provides sufficient optical clarity for subsequent processing steps, such as lithography, and is substantially removed upon curing. Solvents that are suitable for the use in the present invention may include any solvent that, for example, exhibits solubility with the reagents, affects the viscosity of the mixture, and/or affects the surface tension of the mixture upon deposition onto the substrate. Solvents can be alcohol solvents, ketone solvents, amide solvents, or ester solvents. In certain embodiments, one or more solvents used in the present invention have relatively low boiling points, i.e., below 160° C. These solvents include, but are not limited to, tetrahydrofuran, acetone, 1,4-dioxane, 1,3-dioxolane, ethyl acetate, and methyl ethyl ketone. Other solvents, that can be used in the present invention but have boiling points above 160° C., include dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, phenol, m-cresol, dimethyl sulfoxide, diphenyl ether, terphenyl, and the like. Preferred solvents include propylene glycol propyl ether (PGPE), 3-heptanol, 2-methyl-1-pentanol, 5-methyl-2-hexanol 3-hexanol, 2-heptanol, 2-hexanol, 2,3-dimethyl-3-pentanol, propylene glycol methyl ether acetate (PGMEA), ethylene glycol n-butyl ether, propylene glycol n-butyl ether (PGBE), 1-butoxy-2-propanol, 2-methyl-3-pentanol, 2-methoxyethyl acetate, 2-butoxyethanol, 2-ethoxyethyl acetoacetate, 1-pentanol, and propylene glycol methyl ether. Still further exemplary solvents include lactates, pyruvates, and diols. The solvents enumerated above may be used alone or in combination of two or more solvents. In preferred embodiments, the solvent may comprise one or more solvents with relatively low boiling points, i.e., boiling points below 160° C.

The mixture used to form the films of the present invention further comprises a porogen. A "porogen", as used herein, is a reagent that is used to generate void volume within the resultant film. Suitable porogens for use in the dielectric materials of the present invention include labile organic groups, solvents, decomposable polymers, surfactants, dendrimers, hyper-branched polymers, polyoxyalkylene compounds, organic macromolecules, or combinations thereof. Still further examples of suitable porogens include those porogens described in pending patent application, Attorney Docket 06274P2, which is assigned to the assignee of the present invention.

In certain embodiments of the present invention, the porogen may include labile organic groups. When some labile organic groups are present in the reaction mixture, the labile organic groups may contain sufficient oxygen to convert to gaseous products during the cure step. In yet other embodiments of the present invention, a film is deposited via CVD from a mixture comprising the labile organic groups with a peroxide compound followed by thermal annealing. Some examples of compounds containing labile organic groups include the compounds disclosed in U.S. Pat. No. 6,171,945, which is incorporated herein by reference in its entirety.

In some embodiments of the present invention, the porogen may be a solvent. In this connection, the solvent is generally present during at least a portion of the cross-linking of the matrix material. Solvents typically used to aid in pore formation have relatively higher boiling points, i.e., greater than 175° C., preferably greater than 200° C. Solvents suitable for use as a porogen within the mixture of the present invention include those solvents provided, for example, in U.S. Pat. No. 6,231,989.

In certain embodiments, the porogen may be a small molecule such as those described in the reference Zheng, et al., "Synthesis of Mesoporous Silica Materials with Hydroxyacetic Acid Derivatives as Templates via a Sol-Gel Process", J. Inorg. Organomet. Polymers, 10,103–113 (2000).

The porogen could also be a decomposable polymer. The decomposable polymer may be radiation decomposable, or more preferably, thermally decomposable. The term "polymer", as used herein, also encompasses the terms oligomers and/or copolymers unless expressly stated to the contrary. Radiation decomposable polymers are polymers that decompose upon exposure to radiation, e.g., ultraviolet, X-ray, electron beam, or the like. Thermally decomposable polymers undergo thermal decomposition at temperatures that approach the condensation temperature of the silica source materials and are present during at least a portion of the cross-linking. Such polymers are those which foster templating of the vitrification reaction, control and define pore size, and decompose and diffuses out of the matrix at the appropriate time in processing. Examples of these polymers include polymers that have an architecture that provides a three-dimensional structure such as, but not limited to, block copolymers, i.e., diblock, triblock, and multiblock copolymers; star block copolymers; radial diblock copolymers; graft diblock copolymers; cografted copolymers; dendrigraft copolymers; tapered block copolymers; and combinations of these architectures. Further examples of degradable polymers are found in U.S. Pat. No. 6,204,202, which is incorporated herein by reference in its entirety.

The porogen may be a hyper branched or dendrimeric polymer. Hyper branched and dendrimeric polymers generally have low solution and melt viscosities, high chemical reactivity due to surface functionality, and enhanced solubility even at higher molecular weights. Some non-limiting examples of suitable decomposable hyper-branched polymers and dendrimers are provided in "Comprehensive Polymer Science", $2^{nd}$ Supplement, Aggarwal, pp. 71–132 (1996) that is incorporated herein by reference in its entirety.

The porogen within the film-forming mixture may also be a polyoxyalkylene compound such as polyoxyalkylene nonionic surfactants, polyoxyalkylene polymers, polyoxyalkylene copolymers, polyoxyalkylene oligomers, or combinations thereof. An example of such is a polyalkylene oxide that includes an alkyl moiety ranging from $C_2$ to $C_6$ such as polyethylene oxide, polypropylene oxide, and copolymers thereof.

The porogen of the present invention could also comprise a surfactant. For silica sol-gel based films in which the porosity is introduced by the addition of surfactant that is subsequently removed, varying the amount of surfactant can vary porosity. Typical surfactants exhibit an amphiphilic nature, meaning that they can be both hydrophilic and hydrophobic at the same time. Amphiphilic surfactants possess a hydrophilic head group or groups, which have a strong affinity for water and a long hydrophobic tail that is organophilic and repels water. The surfactants can be anionic, cationic, nonionic, or amphoteric. Further classifications of surfactants include silicone surfactants, poly(alkylene oxide) surfactants, and fluorochemical surfactants. However, for the formation of dielectric layers for IC applications, non-ionic surfactants are generally preferred. Suitable surfactants for use in the mixture include, but are not limited to, octyl and nonyl phenol ethoxylates such as TRITON® X-114, X-102, X-45, X-15; alcohol ethoxylates such as BRIJ® 56 ($C_{16}H_{33}(OCH_2CH_2)_{10}OH$)(ICI), BRIJ® 58 ($C_{16}H_{33}(OCH_2CH_2)_{20}OH$)(ICI), and acetylenics diols such as SURFYNOLS® 465 and 485 (Air Products and Chemicals, Inc.). Further surfactants include polymeric compounds such as the tri-block EO-PO-EO co-polymers PLURONIC® L121, L123, L31, L81, L101 and P123 (BASF, Inc.). Still further exemplary surfactants include alcohol (primary and secondary) ethoxylates, amine ethoxylates, glucosides, glucamides, polyethylene glycols, poly (ethylene glycol-co-propylene glycol), or other surfactants provided in the reference *McCutcheon's Emulsifiers and Detergents,* North American Edition for the Year 2000 published by Manufacturers Confectioners Publishing Co. of Glen Rock, N.J.

In certain preferred embodiments, the porogen has a certain weight percent of ethylene oxide, i.e., 75% or less, preferably ranging from 5% to 75%, and more preferably ranging from 5 to 55% or less weight percent of ethylene oxide ("EO") groups. The weight percentage of EO corresponds to the total weight ethylene oxide groups (i.e., —$OCH_2CH_2$—) from all of the porogen molecules within the mixture divided by the total weight of all of the porogen molecules within the mixture, multiplied by 100. In some instances, the EO portion of the porogen molecule may exhibit polydispersity with respect to ethylene oxide chain length. Further, some unethoxylated alcohol, such as those used in the manufacture of the porogen, may factor into the weight percent of EO in the mixture. It is believed that lower weight percents of EO in the porogen may produce materials and films that have higher $E_0'$ values. While not intending to be bound by theory, it is believed that the EO within the porogen forms microporous "fingers" within the silicate walls. These microporous "fingers" undermine the mechanical properties of the film. Consequently, shorter chained or compositions without a weight percent of EO generally do not extend to the silicate walls. The controlled weight percent EO porogens of the present invention are traditionally used as defoamer agents within a composition. In this connection, the porogen has a HLB value, which is the measure of the hydrophobic-lipophobic ratio within the surfactant that ranges from 1 to 25, preferably ranging from 1 to 20, and more preferably ranging from 1 to 15. The weight percentage EO porogen may form micelles in water but not necessarily in the mixture.

In certain preferred embodiments of the present invention, it preferable that the film-forming mixture has a certain acidity level expressed by the pAcid value. The pAcid value provides an estimate of the acidity of the mixture and can be calculated from the amounts of strong acid and strong base in the mixture. For these purposes, a strong acid is defined as having a $pK_a$ of less than 2, and a strong base is defined as having a $pK_a$ of its conjugate acid of greater than 12. Examples of strong acids include $HNO_3$, HCl, both acidic protons of $H_2SO_4$, the stronger acidic proton of maleic acid, the stronger acidic proton of oxalic acid, etc. Examples of strong bases include NaOH, KOH, tetramethylammonium hydroxide (TMAH), etc. When the number of equivalents of strong acid is greater than the number of equivalents of strong base, then the pAcid value of the mixture can be calculated using the following equation (5):

$$pAcid=-\log [(\text{equivalents of strong acid}-\text{equivalents of strong base})/(\text{kg total mixture})]$$

When the number of equivalents of strong acid is less than the number of equivalents of strong base, then the pAcid value of the mixture can be calculated using the following equation (6):

$$pAcid=14+\log [(\text{equivalents of strong base}-\text{equivalents of strong acid})/(\text{kg total mixture})]$$

When the number of equivalents of strong acid equals the number of equivalents of strong base, then $$pAcid=7$$

A film-forming mixture with a relatively low acidity level, i.e., having a pAcid value that ranges from about 2.2 to about 9, may provide materials with a higher normalized wall elastic modulus. In certain preferred embodiments, the pAcid value ranges from about 3.8 to 9. In certain preferred embodiments, the pAcid value may be adjusted to this range by adding a strong acid catalyst, i.e., having a $pK_a$ of less than 2, to the mixture. Although the pAcid value is intended to be an estimate of the pH of the mixture, pAcid values for compositions containing weak acids such as acetic acid, either added to the mixture or generated in situ by hydrolysis of the silica source, may be a poor approximation of the actual pH when the amount of weak acid is substantially in excess of the equivalents of strong acid minus the equivalents of strong base. Nevertheless, even for these systems, the pAcid value of the mixture can be used as an indicator of the normalized wall elastic modulus of the resulting film.

It is preferred that the mixture has a metal content below 1 ppm. To ensure that the mixture has a metal content below 1 ppm, it is preferred that each chemical reagent has a metal content below 1 ppm. While commercially available unpurified surfactants could be used, the final films may have impurity levels far in excess of acceptable levels, and thus the surfactant should be purified. These unpurified surfactants may commonly possess alkali ion concentrations in the range from about 100 to 1000 parts per million. Some solvents may also have metal impurity levels far in excess of acceptable levels. The goal of chemical reagent purification is to reduce alkali ion impurity levels to less than 50 parts per billion. Acceptable concentrations of alkali ion impurities within the film material are less than 10 parts per billion for each alkali element.

Chemical reagent purification can be performed using common procedures, such as distillation, employment of ion exchange columns, etc. In preferred embodiments, chemical reagents with boiling points greater than about 160° C., such as surfactants and high boiling point solvents, are purified using ion exchange columns in which alkali ions can be retained and hydrogen ions released in their place. The purification process can be conducted wherein the at least chemical reagent to be purified, either neat or dissolved within solvent to provide a solution, is contacted with at least one ion exchange compound. In certain embodiments of the present invention, the at least one chemical reagent to be purified is contacted with at least one ion exchange compound. The ion exchange compound is preferably a compound that exhibits the following characteristics: has an affinity for alkali ions or the ions to be removed from the chemical reagent and has a reasonable ion exchange capacity. Examples of suitable ion exchange compounds include strong acid cation exchange resins that have sulfonic acid groups (—SO⁻₃H⁺) attached to an insoluble polymeric matrix; strong base anion exchange resins having quaternary ammonium groups, —NR₃OH⁻ wherein R is usually $CH_3$; weak base anion exchange resins that may have primary, secondary, or tertiary amines as the functional group; chromatographic resins; and mixed bed resins. Examples of strong acid cation exchange resins include Amberlite IR-120, Amberlyst A-15, Dowex HCR-S, Ionac C-249, and Purolite C-100 resins. In other embodiments of the present invention, the at least one chemical reagent is dissolved in the solvent. The solvent preferably does not foam within the mixture and/or solution; has a relative ease of removal from the solution to recover the reagent; and has a relatively low boiling point (i.e., less than about 160° C.). The solution may be then be passed through at least one ion exchange column containing at least one ion exchange compound or the at least one ion exchange compound may be added to the solution. In yet another embodiment, the at least one chemical reagent is dissolved in the solvent that is used within the mixture. In these embodiments, the degree of handling of the purified chemical reagent may be reduced. Further, the step of the removing the ion exchange resin from the mixture or solution comprising the purified chemical reagent may be avoided. In other embodiments, the solvent is removed from the solution to provide at least one purified chemical reagent. Preferably, the removing step comprises rotovapping the effluent. Preferably, the removing step is conducted under vacuum pressure and at a temperature that is within about 20° C. of the boiling point of the solvent.

In addition to the aforementioned ingredients, the film-forming mixture may further comprise an ionic additive. Ionic additives can be added to mixture, for example, if the metal impurity content is about 500 ppm or less. Generally, the ionic additive is a compound chosen from a group of cationic additives of the general composition $[(NR4)^+]_n A^{n-}$, where R can be a hydrogen atom or a monovalent organic group containing 1 to 24 carbon atoms, or mixtures of hydrogen atoms and/or monovalent organic groups, including tetramethylammonium and cetyltrimethylammonium, and $A^{n-}$ is an anion where n is the valence of the anion. Preferably, $A^{n-}$ may be chosen from the group consisting of formate, nitrate, oxalate, acetate, phosphate, carbonate, and hydroxide and combinations thereof. Tetramethylammonium salts, or more generally tetraalkylammonium salts, or tetraorganoammonium salts or organoamines in acidic media are added to surfactant templated porous oxide precursor formulations to increase the ionic content, replacing alkali ion impurities (sodium and potassium) removed during porogen purification. The amount of the ionic additive that is added to the mixture ranges from 0.1 to 5000 ppm, preferably from 0.1 to 1000 ppm, and more preferably from 0.1 to 250 ppm. In certain preferred embodiments, the ionic additive may be a strong base, i.e., have a $pK_a$ of its conjugate acid that is greater than 12, and can be used to maintain the pAcid value of the mixture at a range of from 2.2 to 9.

Alternatively, the ionic additive may be an amine or an amine oxide additive which forms an ionic ammonium type salt in the acidic precursor mixture. The suitable amine additive is selected from the group consisting of: triethylenediamine (TEDA); diethanolamine (DELA); triethanolamine, (TELA); aminopropyldiethanolamine (APDEA); bis(p-aminocyclohexyl)methane (PACM); quinuclidine (QUIN); 3-Quinuclidinol; trimethylamine (TMA); tetramethylethylendiamine, (TMEDA); tetramethyl-1,3-propanediamine (TMPDA); trimethylamine oxide (TMAO); PC-9, N,N,N-tris(N',N'-dimethyl-3-aminopropyl)amine; PC-77, 3,3'-bis(dimethylamino)-N-methyldipropylamine; CB, choline hydroxide; DMAP, 4-dimethylaminopyridine; DPA, diphenylamine; or TEPA, tetraethylenepentamine.

In embodiments where the film is formed through a spin-on approach, the mixture comprises, inter alia, at least one silica source, a porogen, a catalyst, an ionic additive, and water. In certain preferred embodiments, the mixture further comprises a solvent and a surfactant. In brief, dispensing the mixture onto a substrate and evaporating the solvent and water can form the films. The surfactant and remaining solvent and water are generally removed by curing the coated substrate to one or more temperatures and for a time sufficient to produce the low dielectric film.

The mixture may be deposited onto the substrate to form the coated substrate. The term substrate, as used herein, is any suitable composition that is formed before the dielectric film of the present invention is applied to and/or formed on that composition. Suitable substrates that may be used in conjunction with the present invention include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), and mixtures thereof. The mixture may be applied onto the substrate via a variety of methods including, but not limited to, dipping, rolling, brushing, spraying, or spin coating. The coated substrate may then be pre-heated to substantially complete the hydrolysis of the silica source, continue the crosslinking process, and drive off any remaining solvent, if present, from the film. In other embodiments such as CVD based methods, the mixture may be vaporized and/or form particulates that coat the substrate.

The coated substrate is then further heated or cured to form the dielectric film. Specific temperature and time durations will vary depending upon the ingredients within the mixture, the substrate, and the desired pore volume. In certain embodiments, the cure step is conducted at two or more temperatures rather than a controlled ramp or soak. The first temperature, typically below 300° C., may be to remove the water and/or solvent from the mixture and to further cross-linking reactions. The second temperature may be to remove the porogen and to substantially, but not necessarily completely, cross-link the material. In certain preferred embodiments of the present invention, the coated substrate is heated to one or more temperatures ranging from about 250 to about 450° C., or more preferably about 400° C. or below. The heating or cure step is conducted for a time of about 30 minutes or less, preferably about 15 minutes or less, and more preferably about 6 minutes or less. The silica source may further include residual components from processing, such as organics that were not removed after formation of the porous material.

The cure step is preferably conducted via thermal methods such as a hot plate, oven, furnace or the like. For thermal methods, the curing of the coated substrate may be conducted under controlled conditions such as atmospheric pressure using nitrogen, inert gas, air, or other $N_2/O_2$ mixtures (0–21% $O_2$), vacuum, or under reduced pressure having controlled oxygen concentration. Alternatively, the cure step may be conducted by electron-beam, ozone, plasma, X-ray, ultraviolet radiation or other means. Cure conditions such as time, temperature, and atmosphere may vary depending upon the method selected. In preferred embodiments, the curing step is conducted via a thermal method in an air, nitrogen, or inert gas atmosphere, under vacuum, or under reduced pressure having an oxygen concentration of 10% or lower.

The materials of the present invention may be further subjected to post cure steps such as a post-cure e-beam, UV, X-ray or other treatments. Unlike chemical post treatments such as those described in U.S. Pat. No. 6,329,017, these treatments may, for example, increase the mechanical integrity of the material or decrease the dielectric constant by reducing hydroxyl groups that in turn reduce sites likely to adsorb water.

By determining the normalized wall elastic modulus of a dielectric material, it may be possible to adjust the dielectric constant and elastic modulus of the film of the invention to attain the desired dielectric constant for a given application. This may be accomplished by varying the void fraction in the film. The void fraction can be varied by varying the amount of porogen in the mixture, such as surfactant or solvent.

The materials and films of the invention may be mesoporous. The term "mesoporous", as used herein, describes pore sizes that range from about 10 Å to about 500 Å, preferably from about 10 Å to about 100 Å, and most preferably from about 10 Å to about 50 Å. It is preferred that the film have pores of a narrow size range and that the pores are homogeneously distributed throughout the film. Films of the invention preferably have a porosity of about 10% to about 90%. The porosity of the films may be closed or open pore.

In certain embodiments of the present invention, the diffraction pattern of the film does not exhibit diffraction peaks at a d-spacing greater than 10 Angstroms. The diffraction pattern of the film may be obtained in a variety of ways such as, but not limited to, neutron, X-ray, small angle, grazing incidence, and reflectivity analytical techniques. For example, conventional x-ray diffraction data may be collected on a sample film using a conventional diffractometer such as a Siemens D5000 θ-θ diffractometer using CuKα radiation. Sample films may also be analyzed by X-ray reflectivity (XRR) data using, for example, a Rigaku ATX-G high-resolution diffraction system with Cu radiation from a rotating anode x-ray tube. Sample films may also be analyzed via small-angle neutron scattering (SANS) using, for example, a system such as the 30 meter NG7 SANS instrument at the NIST Center for Neutron Research.

The dielectric performance material of the present invention has mechanical properties that allow the material, when formed into a performance film, to resist cracking and enable it to be chemically/mechanically planarized. Further, the dielectric films of the present invention exhibit low shrinkage. Dielectric films of the present invention generally have a thickness that ranges from 0.05 to about 2 μm. Dielectric films of the present invention may exhibit a modulus of elasticity that ranges from about 0.5 to about 10 GPa, and generally between 2 and 6 GPa; a hardness value that ranges from about 0.2 to about 2.0 GPa, and generally from about 0.4 to about 1.2 GPa, and a refractive index determined at 633 nm of between 1.1 and 1.5. The dielectric constant is about 3.7 or less.

As mentioned previously the dielectric films and materials of the present invention are suitable for use as performance materials. The film of the present invention provides excellent insulating properties and a relatively high modulus of elasticity. The film also provides advantageous uniformity, dielectric constant stability, cracking resistance, adhesion to the underlying substrate and/or other films, controlled pore size and/or nanopore size, and surface hardness. Suitable applications for the film of the present invention include interlayer insulating films for semiconductor devices such as LSIs, system LSIs, DRAMs, SDRAMs, RDRAMs, and D-RDRAMs, protective films such as surface coat films for semiconductor devices, interlayer insulating films for multilayered printed circuit boards, and protective or insulating films for liquid-crystal display devices. Further applications include photonics, nano-scale mechanical or nano-scale electrical devices, gas separations, liquid separations, or chemical sensors.

The invention will be illustrated in more detail with reference to the following examples, but it should be understood that the present invention is not deemed to be limited thereto.

EXAMPLES

In the following examples, unless stated otherwise, properties were obtained from sample films that were spun onto a low resistance (0.01 Ωcm) single crystal silicon wafer substrate and heated to 400° C. The thickness, film refractive index, and porosity values of each film were determined by spectroscopic ellipsometry using a variable angle spectroscopic ellipsometer, Model SE 800 manufactured by Sentech Instruments GmbH, and calculated by SpectraRay software. The refractive index, film thickness, and percentage of air values were obtained by simulating the measurement using various models such as Bruggemann in the wavelength range from 400 to 800 nm with mean square error of about 1 or less. For the thickness values, the error between the simulated thickness and actual film thickness values measured by profilometry was generally less than 2%.

The dielectric constant of each sample film was determined according to ASTM Standard D150-98. The capacitance-voltage of each film were obtained at 1 MHz with a Solartron Model SI 1260 Frequency Analyzer and MSI Electronics Model Hg 401 single contact mercury probe. The error in capacitance measurements and mercury electrode area (A) was less than 1%. The substrate (wafer) capacitance ($C_{Si}$), background capacitance ($C_b$) and total capacitance ($C_T$) were measured between +20 and −20 volts and the thin film sample capacitance ($C_s$) was calculated by Equation (7):

$$C_s = C_{Si}(C_T \times C_b)/[C_{Si} - (C_T - C_b)] \qquad \text{Equation (7)}$$

The dielectric constant of each film was calculated by Equation (8) wherein d is the film thickness, A is the mercury electrode area, and $\epsilon_0$ is the dielectric constant in vacuum:

$$\varepsilon = \frac{C_s d}{\varepsilon_0 A} \qquad \text{Equation (8)}$$

The total error of the dielectric constant of the film was expected to be less than 6%.

The elastic modulus for each film was taken from 1×0.4 cm² samples cleaved from the center of the wafer and mounted onto an aluminum stub using a low-melting-temperature adhesive, CRYSTALBOND® which is manufactured by Armco Products Inc., of Valley Cottage, N.Y. Indentation tests were performed on a NANOINDENTER® Dynamic Contact Module (DCM) manufactured by MTS Systems Corporation with an ACCUTIP™ Berkovich diamond tip using the continuous stiffness measurement ("CSM") method described in the reference, Oliver et al., "An improved technique for Determining Hardness and Elastic Modulus Using Load and Displacement Sensing Indentation Experiments", J. Material Research, 1992, 7 [6], pp. 1564–1583, incorporated herein by reference in its entirety. A small oscillation was superimposed on the primary loading signal and the resultant system response was analyzed by means of a frequency-specific amplifier. The excitation frequency was held constant throughout the test at 75 Hz (DCM) and the excitation amplitude was controlled such that the resulting displacement amplitude remained constant at 1 nm (DCM).

Each indentation experiment allowed for a continuous measure of the contact stiffness, S. Using the dynamic measure of S, and established formulae for Young's modulus and hardness (Poisson's Ratio=0.18 for silica, 0.25 for low κ films), every individual indentation experiment yielded Young's modulus and hardness as a continuous function of surface penetration. An array of 5 to 10 indents was performed on each sample and a distance of approximately 20–25 microns separated successive indents. The results from each indentation experiment were examined and any "outliers" were excluded. The results for Young's modulus and hardness vs. penetration for the indentation experiments of each sample were averaged using discrete displacement windows of approximately 5 nm. Using the data in this window, an average, standard deviation, and confidence interval for each sample were then calculated. The same statistics were likewise calculated for the rest of the discrete windows. Hardness results were obtained and averaged in the same manner. Hardness and Young's modulus were reported as the measured value of hardness at the minimum of the hardness curve (at about 30–50 nm) and the measured value of modulus at the minimum of the modulus curve (at about 30–50 nm). The errors of the modulus and the hardness of the film are expected to be less than 10 percent.

The following table, Table I, provides a list of acronyms that are used in the examples and throughout the application.

TABLE I

CHEMICAL ABBREVIATIONS

| Acronym | Gen ric Nam |
|---|---|
| Silica sourc s | |
| TAS | Tetraacetoxysilane |
| TEOS | Tetraethoxysilane |
| MTES | Methyltriethoxysilane |
| MTAS | Methytriacetoxysilane |
| poly-TEOS | Polydiethoxysiloxane |
| Solvents | |
| PGMEA | propylene glycol methyl ether acetate |
| PGPE | propylene glycol propyl ether |
| EEA | 2-ethyoxyethylacetate |
| DMF | Dimethylformamide |
| IPA | 2-propanol |
| Bases | |
| TMAH | Tetramethylammonium hydroxide |
| Surfactants | |
| X114 | Triton X-114 (octyphenol ethoxylate) |
| X102 | Triton X-102 (octyphenol ethoxylate) |
| X45 | Triton X-45 (octyphenol ethoxylate) |
| X35 | Triton X-35 (octyphenol ethoxylate) |
| X15 | Triton X-15 (octyphenol ethoxylate) |
| L101 | Pluronic L101 (EO-PO-EO tri-block co-polymer) |
| L31 | Pluronic L31 (EO-PO-EQ tri-block co-polymer) |
| 15-S-5 | Tergitol 15-S-5 (secondary alcohol ethoxylate) |

Purification of Reagents

The reagents used in the following examples were analyzed via ICP/MS using a Finnigan Element 1, High resolution Inductively Coupled Plasma/Mass Spectrometer (ICP/MS), manufactured by Finnigan of Bremen, Germany, prior to addition to the reaction mixture. If the level of metal impurities in the chemical reagent exceeded 50 ppb, the reagent was purified. Depending upon its composition, reagents were purified via standard procedures such as distillation under reduced pressure or ion exchange columns in which metal ions are retained in the column and hydrogen ions are released in its place. Table A provides the elemental analysis for a variety of different reagents, as received or after the purification process described herein.

The chemical reagent purification procedure was conducted in the following manner. A quantity of ion exchange compound such as AMBERLITE IR-120 resin was rinsed with High-pressure liquid chromatography ("HPLC") grade water in its original container wherein the resin was floated for about 20 minutes. The resin was decanted and refilled as many times as needed to remove its deep color. A quantity of 2 Kg of resin was transferred to a 1 gallon wide-mouth Nalgene bottle. The resin was rinsed with HPLC water, soaked for about 1 hour, and then filtered using a 2-liter filter flask and a 7" diameter Buchner funnel with Whatman Qualitive 1 filter paper. The filtered resin slurry was transferred to another 1 gallon bottle. The rinse, soak, and filter steps were repeated until the water rinse was slightly yellow in color. The resin slurry was heated to a temperature of about 70° C. for about 2 hours under agitation. The heat-treated resin slurry was then filtered and the heating step was repeated until no color was observed in the filtrate. The heat-treated resin slurry was transferred to a dry 1-gallon bottle where it is washed with about 1.5 L of 200 proof ethanol. The ethanol resin slurry was soaked at room temperature and filtered as before. The ethanol wash was repeated until no color remained in the filtrate.

The ethanol resin slurry was added to a 30" ion exchange column at about 1" from the top. The remainder of the column reservoir was filled with ethanol. The column was capped and inverted thereby filling the top reservoir of column with the resin and displacing air in the column tube with ethanol. The column was then inverted right side up while rotating the column to form a vortex of spinning ethanol. This process was continued until all resin has settled into the column. The packing step was repeated until no apparent channeling was observed. The ethanol in the column reservoir is allowed to drain into the column. The effluent is monitored for color bleed. The ethanol rinse was repeated until no color was evident. A regulating stopcock set the flow rate of effluent to 35 ml/min.

A 10% solution of the at least one chemical reagent in ethanol was prepared in 1-gallon narrow mouth Nalgene container. An initial quantity of 300–500 ml of solution was passed through the $1^{st}$ ion exchange column and the effluent was checked for color bleed and discarded. Additional quantities of solution were passed through the $1^{st}$ ion exchange column and the remainder of the effluent was collected in another clean 1-gallon narrow mouth container. The effluent from the ½s column was passed through the $2^{nd}$ column ion exchange column and the effluent was collected after discarding the first 300 ml. The effluent was collected in either a 2 L round bottom flask (filling ½ full for rotovap procedure) or a clean (rinsed with 200 proof ethanol passed through ion exchange column) 1 gallon narrow mouth bottle. This process was repeated until all of the reagent solution has passed through the two columns to provide a purified reagent ethanol solution.

The purified reagent solution was rotovaped by using dry ice and acetone in condenser and vacuum trap using the slowest rotation speed and a slight crack in the vacuum line and water bath at room temperature. The vacuum level was adjusted until ethanol within the solution was condensed and no bumping was evident. The rotovapping process is continued in a water bath at 30° C. by adding additional purified reagent ethanol solution to the purified reagent in flask until all of column effluent solution has been rotovapped. The temperature of the bath was increased slowly to drive off residual ethanol. Afterwards, the bath temperature was increased to 60° C. and rotovapping was continued until all ethanol has been removed to yield the purified surfactant. A small sample of the purified reagent was analyzed for metal content using ICP-MS prior to use.

minutes longer than the time at which the last liquid sample is deposited on the substrate), after which orbital movement of the substrate was stopped. Orbital movement of the wafer subjected the liquid samples to a non-contact spreading force to facilitate spreading of the liquid samples on the wafer surface to form films thereon. The array of films were heated on a hot plate at 90° C. for 90 seconds, 180° C. for 90 seconds, and 400° C. for 180 seconds in an air or nitrogen atmosphere, thereby forming optically transparent thin films. The films produced through this process could then characterized directly to determine the refractive index, dielectric constant, modulus, hardness, and normalized wall elastic modulus. For the array elements, an N&K Analyzer 1500/1512 from N&K Technology, Santa Clara, Calif., was used to determine refractive index and thickness of the thin films. An SSM 495 CV Measurement System available from solid State Measurements, Pittsburgh, Pa., was used to

TABLE A

Elemental Analysis for Reagents

| Sample # | Surfactant name | ppbw Li | ppbw Na | ppbw Mg | ppbw Al | ppbw Ca | ppbw Cr | ppbw Fe | ppbw Ni | ppbw Cu | ppbw Zn | ppbw K | ppbw B |
|---|---|---|---|---|---|---|---|---|---|---|---|---|---|
| 18987-60 | Triton X-114 as rec'd | <0.2 | 8000 | <2 | <=1 | <=14 | <1 | <4 | <=0.7 | <=4 | 6 | 742000 | <17 |
| 18920-47-4 | Triton X-114 purified | <0.2 | 18 | 2 | 1 | 21 | <0.3 | 2 | <0.7 | 2 | <15 | 5 | <17 |
| 17461-50-1 | Pluronic L101 as rec'd | <1 | 96 | 3 | 4 | <5 | <1 | 6 | <1 | <5 | <5 | 2440 | <300 |
| 18263-37-1 | Pluronic L101 purified | <1 | 21.0 | 3.8 | 4.7 | 22.0 | <5 | 11.0 | <2 | <2 | 2.0 | <5 | |
| 18340-7-12 | Tergitol 15-S-9 as rec'd | | 6000 | | | | | | | | 12900 | | |
| 18263-90-1 | Tergitol 15-S-9 purified | 3.0 | <=59 | <18 | <=7 | 54.0 | <=1 | 8.0 | <12 | <33 | <=36 | <58 | <=35 |

General Process for Preparing Array Elements

A mixture was prepared containing a hydrophilic silica source and one or more hydrophobic silica sources. To the silicates, a quantity of a 4:1 volume ratio of solvent to surfactant and additional solvent was added. After the organic components were added to one another, the catalysts and water were added to the mixture in the following order: water, acid catalyst, and ionic additives. Following the addition of water, the mixture was aged at room temperature for a period ranging from approximately 5 to 10 minutes after which the aging step was repeated after the addition of the acid catalyst and ionic additive. After all the reagents were added, the mixture was agitated for less than about 5 minutes and aged at room temperature for a period ranging from 1–72 hours, depending upon the reagents within the mixture. Each of the chemical reagents within the mixture contained less than 1 ppm of metal impurities.

Figure 3:
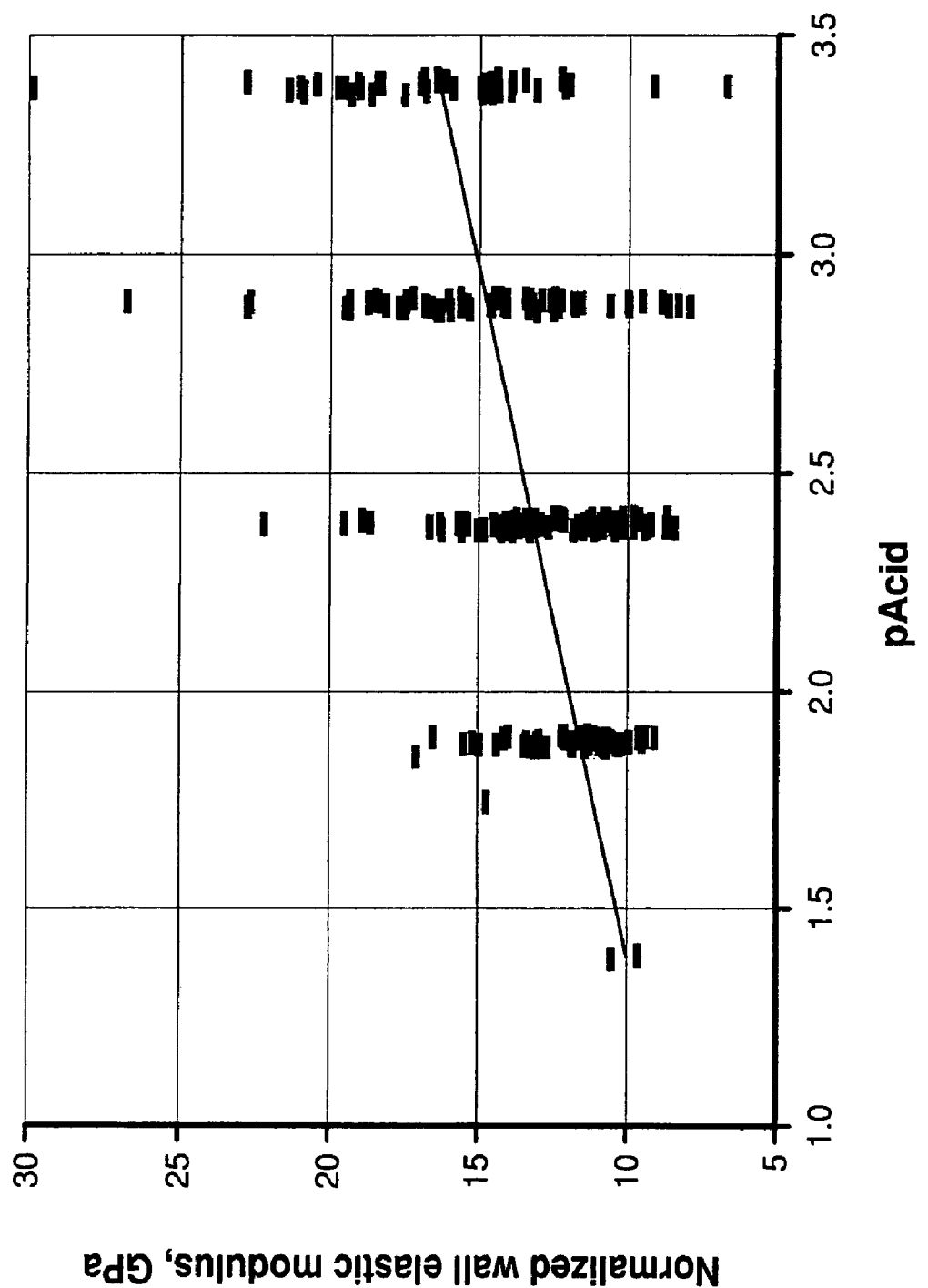
FIG. 3 provides a plot of materials of the present invention that illustrates that higher pAcid levels may result in a higher normalized wall elastic modulus.

A silicon wafer having a diameter of about 125 mm was placed in the holder of an orbital movement device described in FIG. 3 of pending U.S. Pat. App., Attorney's Docket 2001-030-SMX 3122 entitled "Apparatus and Methods for Forming Films on Substrates". The orbital movement device was operated to move the wafer at a speed of about 2200 rpm along an orbital path having a major axis of about 4.5 mm and a minor axis of about 2.25 mm.

While the wafer was moving along its orbital path, the deposition device was operated to serially dispense subsequent samples of liquid on the wafer in a generally square pattern (e.g., a matrix of five rows of five samples each), with the center-to-center spacing between adjacent samples being about 17.5 mm. The volume of each liquid sample was in the range of about 2–5 microliters. Dispensing of the liquid samples on the wafer occurred over a period of about 12 minutes, and the substrate was moved on its orbital path for a total duration of about 15 minutes (e.g., about 3 measure the capacitance of the film. Dielectric constant was calculated from the measured capacitance and the thickness of the film. A Hysitron triboindentor nanomechanical test system from Hysitron, Inc., Minneapolis, Minn., was used to determine hardness and elastic modulus by nanoindentation.

Using Polyoxyethylene-Based Porogens with a Certain wt % EO Content

Figure 1B:
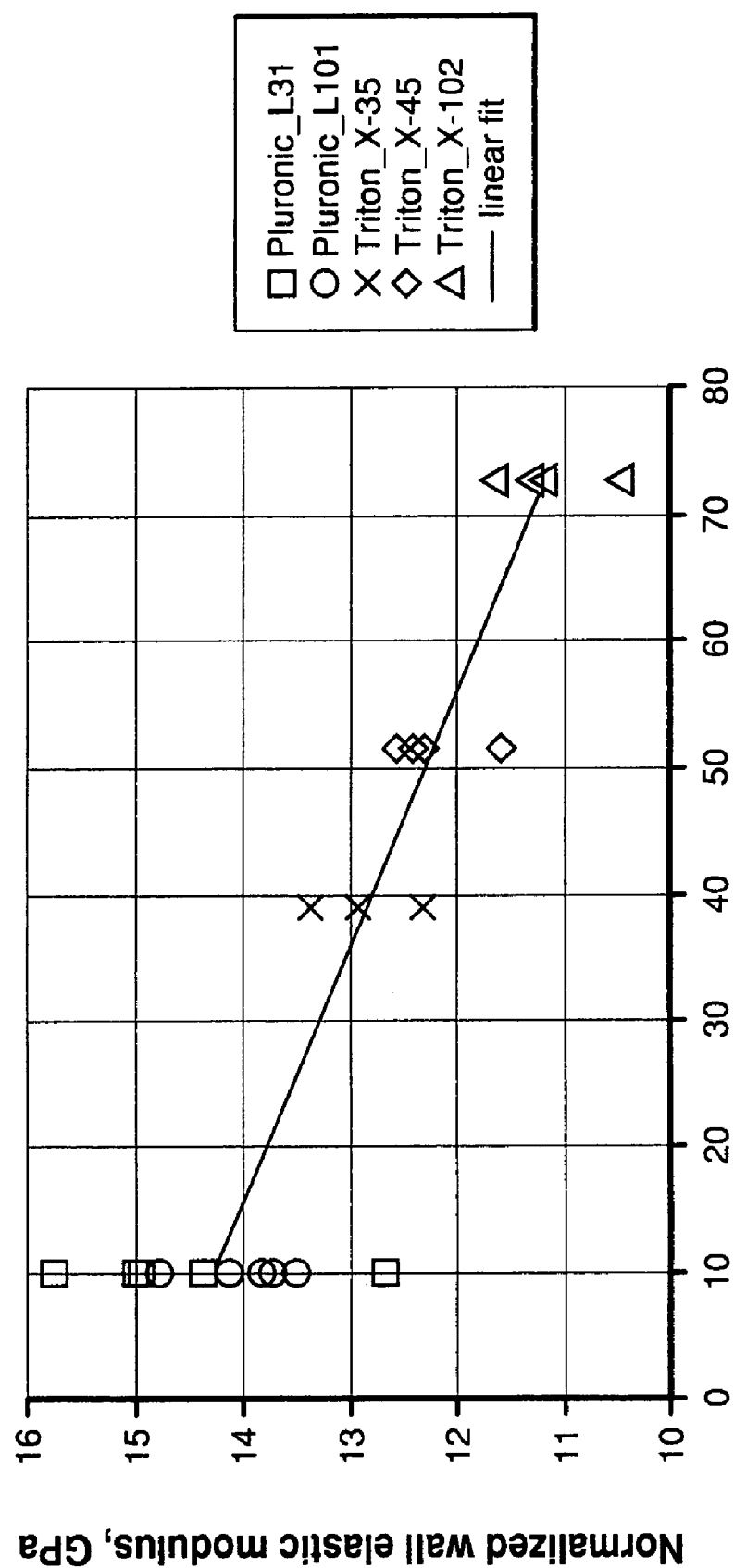

A total of 180 sample films were prepared in the same manner as the general procedure for array films except that the types and/or amounts of silica sources, polyoxyethylene-based porogen, solvent, and catalyst in the mixture were varied. These variations are provided in Table VI. The mixtures had either one porogen or a mixture of porogens. The properties of each film are provided in Table VII and illustrated in FIGS. 1a and 1b. FIGS. 1a and 1b show the effect of weight percent EO for single porogens and mixtures of porogens, respectively, on the normalized wall elastic modulus on the materials of the present invention.

As FIGS. 1a and 1b illustrate, polyoxyethylene-based porogens that have lower weight percent of ethylene oxide may provide materials with a higher normalized wall elastic modulus. The molecular weight and weight percent EO for the porogen in tables VI and VII are as follows: Pluronic L101, 3800 g/mol molecular weight and 10 wt. % EO; Pluronic L31, 1100 g/mol molecular weight and 10 wt. % EO; Triton X102, 778 g/mol molecular weight and 72.7 wt. % EO; Triton X15, 250 g/mol molecular weight and 17.6 wt. % EO; Triton X35, 338 g/mol molecular weight and 39 wt. % EO; and Triton X45, 426 g/mol molecular weight and 51.6 wt. % EO.

FIG. 1a illustrates that for compositions having only one surfactant as a porogen, the lower weight percentage of ethoxylation leads to higher normalized wall elastic modulus values. Linear regression analysis using the "least squares" method to fit a line through the data provides a R square value of 0.79 and a Significance F of value of $4.0 \times 10^{-8}$. Although the R square value of 0.79 indicates that the effect of the weight percent EO explains only 79% of the variance of the data, the value of $4.0 \times 10^{-8}$ for the Significance F indicates that the trend in $E_0'$ with weight percent EO in the porogen is highly significant. Referring to FIG. 1b, for compositions having a mixture of porogens, while the R square value of 0.45 is lower than that of FIG. 1a, the value of the Significance F of $1.0 \times 10^{-17}$ still indicates that the trend is highly significant. Higher $E_0'$ values yield a low dielectric constant performance film with improved properties.

Effect of Selection of Hydrophobic Source Containing A Carboxylate Group on Properties of Dielectric Material—Array Elements Sample films were prepared in the same manner as the general process for preparing array elements to compare the effect on film properties by using MTAS that contains a carboxylate, i.e., has a carboxylic acid ester bonded to the Si atom, as a hydrophobic source rather than MTES. The volume of each reagent dispensed into individual microtiter wells is provided in Table IIa for MTES-based compositions and Table IIb for MTAS-based compositions. The mixtures were dispensed, agitated, and heated as in the general procedure to prepare array elements to films. The properties of each film are provided in Tables IIIa and IIIb for MTES-based compositions and MTAS-based compositions, respectively.

Figure 2:
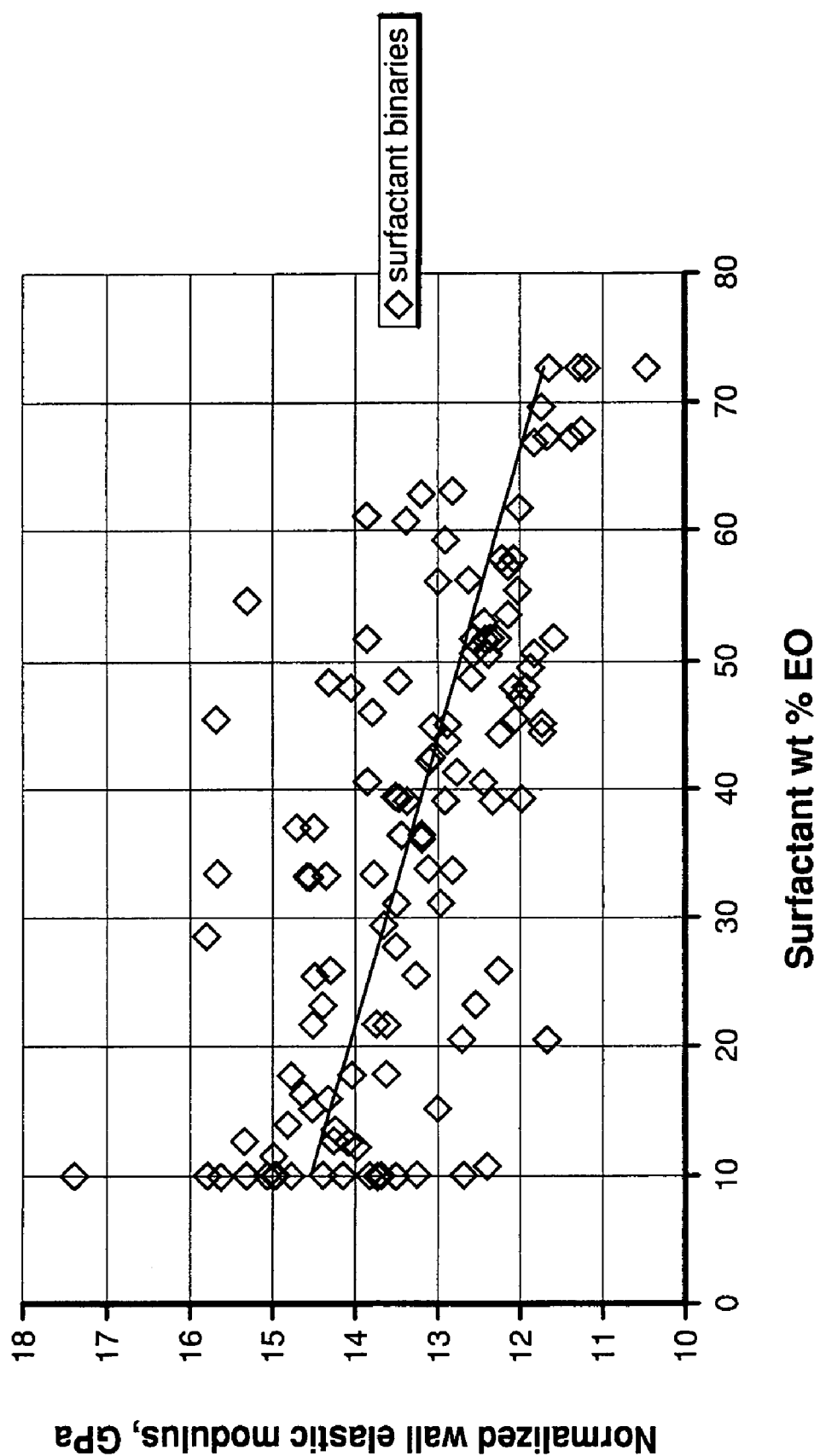
FIG. 2 provides a plot of elastic modulus vs. dielectric constant for materials of the present invention having a normalized wall elastic modulus greater than 16 GPa and using MTAS as the hydrophobic silica source compared to materials having a normalized wall elastic modulus less than 16 GPa and using MTES as the hydrophobic silica source.

FIG. 2 provides a plot of elastic modulus vs. dielectric constant for materials of the present invention having a normalized wall elastic modulus greater than 16 GPa and using MTAS as the hydrophobic silica source compared to materials having a normalized wall elastic modulus less than 16 GPa and using MTES as the hydrophobic silica source wherein ethoxylated octylphenols is used in both materials as the porogens. As FIG. 2 illustrates, the use of MTAS as the hydrophobic source that has an acetoxy ligand rather than MTES that has an ethoxy ligand with ethoxylated octylphenols as the porogen may provide materials with a higher normalized wall elastic modulus. Compositions that contained MTAS rather than MTES exhibited a normalized wall elastic modulus of 16 GPa or greater. Further, MTAS-containing compositions having a pAcid greater than 3.8 exhibited a normalized wall elastic modulus of 16 or greater. A higher normalized wall elastic modulus indicates an improved low dielectric constant film.

TABLE IIa

MTES Examples

| LIBID | R | C | $H_2O$ | $HNO_3$ | MTES | PGPE | TEOS | TMAH | Triton_X-45 | pAcid |
|---|---|---|---|---|---|---|---|---|---|---|
| 122946 | 1 | 4 | 0.60815 | 0.00006 | 0.02162 | 0.32422 | 0.04017 | 0.00005 | 0.00574 | 3.87 |
| 122947 | 2 | 5 | 0.49988 | 0.00015 | 0.02839 | 0.40361 | 0.05276 | 0.00014 | 0.01507 | 3.89 |
| 122948 | 2 | 2 | 0.60085 | 0.00005 | 0.03551 | 0.32865 | 0.02907 | 0.00005 | 0.00581 | 5.90 |
| 122948 | 4 | 2 | 0.61073 | 0.00011 | 0.02878 | 0.31337 | 0.03519 | 0.00011 | 0.01170 | 6.02 |
| 122948 | 5 | 2 | 0.68271 | 0.00012 | 0.03217 | 0.23245 | 0.03934 | 0.00012 | 0.01308 | 7.39 |
| 122949 | 1 | 1 | 0.49009 | 0.00007 | 0.03663 | 0.42089 | 0.04480 | 0.00007 | 0.00745 | 5.88 |
| 122949 | 1 | 2 | 0.67481 | 0.00006 | 0.03171 | 0.24814 | 0.03878 | 0.00006 | 0.00644 | 5.94 |
| 122949 | 1 | 5 | 0.57841 | 0.00016 | 0.03286 | 0.30992 | 0.06105 | 0.00016 | 0.01744 | 5.64 |
| 122949 | 3 | 2 | 0.56618 | 0.00012 | 0.05335 | 0.32344 | 0.04368 | 0.00012 | 0.01310 | 5.81 |
| 122949 | 4 | 2 | 0.67134 | 0.00009 | 0.04836 | 0.24417 | 0.02605 | 0.00009 | 0.00989 | 6.62 |
| 122949 | 5 | 2 | 0.49308 | 0.00011 | 0.03694 | 0.41333 | 0.04517 | 0.00011 | 0.01126 | 5.83 |
| 122949 | 5 | 4 | 0.60312 | 0.00011 | 0.04351 | 0.31784 | 0.02344 | 0.00011 | 0.01187 | 5.72 |

TABLE IIb

MTAS Examples

| LIBID | R | C | $H_2O$ | $HNO_3$ | MTAS | PGPE | TEOS | TMAH | Triton_X-45 | pAcid |
|---|---|---|---|---|---|---|---|---|---|---|
| 122952 | 3 | 3 | 0.48464 | 0.00016 | 0.02754 | 0.42062 | 0.05118 | 0.00015 | 0.01570 | 3.89 |
| 122953 | 5 | 4 | 0.59355 | 0.00007 | 0.02110 | 0.34000 | 0.03921 | 0.00006 | 0.00602 | 3.90 |
| 122954 | 2 | 3 | 0.65512 | 0.00010 | 0.03880 | 0.26345 | 0.03176 | 0.00010 | 0.01067 | 5.77 |
| 122954 | 2 | 4 | 0.47638 | 0.00015 | 0.03582 | 0.42774 | 0.04379 | 0.00015 | 0.01597 | 5.80 |
| 122954 | 3 | 2 | 0.66671 | 0.00013 | 0.03144 | 0.24913 | 0.03844 | 0.00013 | 0.01402 | 6.02 |
| 122954 | 5 | 2 | 0.47340 | 0.00011 | 0.03550 | 0.43560 | 0.04341 | 0.00011 | 0.01187 | 5.82 |
| 122955 | 2 | 5 | 0.54393 | 0.00013 | 0.05130 | 0.34839 | 0.04200 | 0.00013 | 0.01412 | 6.78 |
| 122955 | 3 | 2 | 0.48162 | 0.00011 | 0.02731 | 0.42844 | 0.05074 | 0.00011 | 0.01167 | 5.83 |
| 122955 | 3 | 4 | 0.53967 | 0.00009 | 0.05077 | 0.35852 | 0.04156 | 0.00009 | 0.00931 | 5.90 |
| 122955 | 3 | 5 | 0.46211 | 0.00007 | 0.04347 | 0.45071 | 0.03559 | 0.00007 | 0.00797 | 5.87 |
| 122955 | 4 | 3 | 0.58566 | 0.00006 | 0.02753 | 0.34690 | 0.03366 | 0.00006 | 0.00614 | 5.90 |
| 122955 | 5 | 3 | 0.57752 | 0.00006 | 0.03414 | 0.35400 | 0.02795 | 0.00006 | 0.00626 | 5.90 |

TABLE IIIb

Film Properties - MTES Compositions

| LIBID | R | C | r fractiv index | thickn ss, Angstroms | elastic modulus, GPa | hardn ss, GPa | dielctric constant | $E_0'$, GPa |
|---|---|---|---|---|---|---|---|---|
| 122946 | 1 | 4 | 1.2246 | 6573 | 4.48 | 0.50 | 2.70 | 13.9 |
| 122947 | 2 | 5 | 1.1686 | 8437 | 2.33 | 0.32 | 2.31 | 11.6 |

TABLE IIIb-continued

Film Properties - MTES Compositions

| LIBID | R | C | r fractiv index | thickn ss, Angstroms | elastic modulus, GPa | hardn ss, GPa | diel ctric con stant | Eo', GPa |
|---|---|---|---|---|---|---|---|---|
| 122948 | 2 | 2 | 1.2178 | 5308 | 3.24 | 0.47 | 2.39 | 14.5 |
| 122948 | 4 | 2 | 1.1688 | 6148 | 2.06 | 0.31 | 2.11 | 14.1 |
| 122948 | 5 | 2 | 1.1725 | 9441 | 1.81 | 0.30 | 2.13 | 11.9 |
| 122949 | 1 | 1 | 1.2063 | 6741 | 3.07 | 0.38 | 2.42 | 13.2 |
| 122949 | 1 | 2 | 1.2183 | 8338 | 3.24 | 0.38 | 2.43 | 13.7 |
| 122949 | 3 | 2 | 1.1979 | 11517 | 1.94 | 0.33 | 2.16 | 12.2 |
| 122949 | 4 | 2 | 1.2060 | 9005 | 1.83 | 0.33 | 2.13 | 12.1 |
| 122949 | 5 | 2 | 1.1872 | 7627 | 2.51 | 0.36 | 2.23 | 14.1 |
| 122949 | 5 | 4 | 1.1904 | 7022 | 1.50 | 0.26 | 2.07 | 11.0 |

TABLE IIIb

Film Properties - MTAS Compositions

| LIBID | R | C | re-fractive index | thick-ness, Angstroms | elastic modulus, GPa | hard-ness, GPa | di-electric constant | Eo', GPa |
|---|---|---|---|---|---|---|---|---|
| 122952 | 3 | 3 | 1.1684 | 3328 | 1.81 | 0.25 | 1.92 | 18.1 |
| 122953 | 5 | 4 | 1.2256 | 5681 | 4.54 | 0.62 | 2.35 | 21.4 |
| 122954 | 2 | 3 | 1.1939 | 8044 | 2.38 | 0.41 | 2.06 | 17.8 |
| 122954 | 2 | 4 | 1.1747 | 5572 | 2.08 | 0.32 | 2.00 | 17.5 |
| 122954 | 3 | 2 | 1.1711 | 9925 | 2.00 | 0.34 | 1.91 | 20.4 |
| 122954 | 5 | 2 | 1.1944 | 5046 | 2.44 | 0.38 | 2.02 | 19.7 |
| 122955 | 2 | 5 | 1.2046 | 7421 | 2.54 | 0.40 | 1.91 | 25.9 |
| 122955 | 3 | 2 | 1.1851 | 3410 | 2.60 | 0.32 | 2.02 | 21.0 |
| 122955 | 3 | 4 | 1.2287 | 6362 | 3.16 | 0.51 | 2.13 | 20.9 |
| 122955 | 3 | 5 | 1.2293 | 4434 | 3.63 | 0.50 | 2.11 | 24.8 |
| 122955 | 4 | 3 | 1.2259 | 6034 | 4.36 | 0.59 | 2.23 | 24.5 |
| 122955 | 5 | 3 | 1.2276 | 5887 | 3.70 | 0.57 | 2.08 | 26.7 |

Effect of P-Acid Levels on Normalized Wall Elastic Modulus

A total of 540 sample films were prepared in the same manner as the general procedure for array films except that the types and/or amounts of the silica sources, the ethoxylated triblock copolymer porogen, solvent, and catalyst in the mixture were varied. These variations are provided in Table VIII. All of the films obtained were transparent. The properties of each film are provided in Table IX and illustrated in FIG. 3

As FIG. 3 illustrates, the use low acid levels, or a pAcid value which ranges from about 2.2 to about 9, with ethoxylated triblock copolymers as the porogen may provide materials with a higher normalized wall elastic modulus.

FIG. 3 illustrates that higher pAcid levels may result in a higher normalized wall elastic modulus. Linear regression analysis using the "least squares" method to fit a line through the data provides an R square value of 0.23 and a Significance F value of $1.1 \times 10^{-14}$. Although the R square value of 0.23 indicates that the effect of pAcid only explains 23% of the variance in the data, the value of $1.1 \times 10^{-14}$ for the Significance F indicates that the trend in Eo' is highly significant. These examples illustrate that pAcid values in the range of 2.2 to 9 may improve the performance of the film and films having a normalized wall elastic modulus of 16 GPa or greater can be obtained.

TABLE VI

USING POLYOXYETHYLENE-BASED POROGENS WITH A CERTAIN WT % EO CONTENT-
Composition of Array Elements (mole Fractions)

| LIBID | R | C | H2O | HNO3 | MTES | PGPE | Pluronic_L101 | Pluronic_L31 | TEOS | TMAH | Triton_X-102 | Triton_X-15 | Triton_X-35 | Triton_X-45 | wt % EO in surfactant |
|---|---|---|---|---|---|---|---|---|---|---|---|---|---|---|---|
| 122844 | 1 | 1 | 0.51326 | 0.00089 | 0.04711 | 0.39410 | 0.00000 | 0.00421 | 0.04033 | 0.00010 | 0.00000 | 0.00000 | 0.00000 | 0.00000 | 10.0 |
| 122844 | 1 | 2 | 0.51257 | 0.00089 | 0.04705 | 0.39357 | 0.00000 | 0.00383 | 0.04027 | 0.00010 | 0.00000 | 0.00173 | 0.00000 | 0.00000 | 10.7 |
| 122844 | 1 | 3 | 0.51187 | 0.00089 | 0.04698 | 0.39304 | 0.00000 | 0.00344 | 0.04022 | 0.00010 | 0.00000 | 0.00346 | 0.00000 | 0.00000 | 11.4 |
| 122844 | 1 | 4 | 0.51119 | 0.00089 | 0.04692 | 0.39251 | 0.00000 | 0.00305 | 0.04016 | 0.00010 | 0.00000 | 0.00518 | 0.00000 | 0.00000 | 12.1 |
| 122844 | 1 | 5 | 0.51050 | 0.00089 | 0.04686 | 0.39198 | 0.00000 | 0.00267 | 0.04011 | 0.00010 | 0.00000 | 0.00690 | 0.00000 | 0.00000 | 12.8 |
| 122844 | 2 | 1 | 0.50981 | 0.00089 | 0.04680 | 0.39146 | 0.00000 | 0.00228 | 0.04006 | 0.00010 | 0.00000 | 0.00862 | 0.00000 | 0.00000 | 13.5 |
| 122844 | 3 | 4 | 0.50885 | 0.00088 | 0.04671 | 0.39071 | 0.00000 | 0.00038 | 0.03998 | 0.00010 | 0.00000 | 0.00000 | 0.01239 | 0.00000 | 36.4 |
| 122844 | 3 | 5 | 0.50841 | 0.00088 | 0.04667 | 0.39038 | 0.00000 | 0.00000 | 0.03995 | 0.00010 | 0.00000 | 0.00000 | 0.01362 | 0.00000 | 39.0 |
| 122844 | 4 | 1 | 0.51104 | 0.00089 | 0.04691 | 0.39240 | 0.00000 | 0.00229 | 0.04015 | 0.00010 | 0.00000 | 0.00000 | 0.00622 | 0.00000 | 23.2 |
| 122844 | 4 | 2 | 0.51060 | 0.00089 | 0.04687 | 0.39206 | 0.00000 | 0.00191 | 0.04012 | 0.00010 | 0.00000 | 0.00000 | 0.00746 | 0.00000 | 25.8 |
| 122844 | 4 | 3 | 0.51016 | 0.00089 | 0.04683 | 0.39172 | 0.00000 | 0.00152 | 0.04008 | 0.00010 | 0.00000 | 0.00000 | 0.00870 | 0.00000 | 28.5 |
| 122844 | 4 | 4 | 0.50972 | 0.00089 | 0.04679 | 0.39139 | 0.00000 | 0.00114 | 0.04005 | 0.00010 | 0.00000 | 0.00000 | 0.00993 | 0.00000 | 31.1 |
| 122844 | 4 | 5 | 0.50928 | 0.00088 | 0.04675 | 0.39105 | 0.00000 | 0.00076 | 0.04001 | 0.00010 | 0.00000 | 0.00000 | 0.01116 | 0.00000 | 33.7 |
| 122844 | 5 | 1 | 0.51326 | 0.00089 | 0.04711 | 0.39410 | 0.00000 | 0.00421 | 0.04033 | 0.00010 | 0.00000 | 0.00000 | 0.00000 | 0.00000 | 10.0 |
| 122844 | 5 | 2 | 0.51281 | 0.00089 | 0.04707 | 0.39376 | 0.00000 | 0.00383 | 0.04029 | 0.00010 | 0.00000 | 0.00000 | 0.00125 | 0.00000 | 12.6 |
| 122844 | 5 | 3 | 0.51237 | 0.00089 | 0.04703 | 0.39342 | 0.00000 | 0.00344 | 0.04026 | 0.00010 | 0.00000 | 0.00000 | 0.00250 | 0.00000 | 15.3 |
| 122844 | 5 | 4 | 0.51193 | 0.00089 | 0.04699 | 0.39308 | 0.00000 | 0.00306 | 0.04022 | 0.00010 | 0.00000 | 0.00000 | 0.00374 | 0.00000 | 17.9 |
| 122844 | 5 | 5 | 0.51148 | 0.00089 | 0.04695 | 0.39274 | 0.00000 | 0.00267 | 0.04019 | 0.00010 | 0.00000 | 0.00000 | 0.00498 | 0.00000 | 20.6 |
| 122845 | 1 | 1 | 0.51326 | 0.00089 | 0.04711 | 0.39410 | 0.00000 | 0.00421 | 0.04033 | 0.00010 | 0.00000 | 0.00000 | 0.00000 | 0.00000 | 10.0 |

TABLE VI-continued

USING POLYOXYETHYLENE-BASED POROGENS WITH A CERTAIN WT % EO CONTENT-
Composition of Array Elements (mole Fractions)

| LIBID | R | C | H2O | HNO3 | MTES | PGPE | Pluronic_L101 | Pluronic_L31 | TEOS | TMAH | Triton_X-102 | Triton_X-15 | Triton_X-35 | Triton_X-45 | wt % EO in surfactant |
|---|---|---|---|---|---|---|---|---|---|---|---|---|---|---|---|
| 122845 | 1 | 2 | 0.51292 | 0.00089 | 0.04708 | 0.39384 | 0.00000 | 0.00383 | 0.04030 | 0.00010 | 0.00000 | 0.00000 | 0.00000 | 0.00104 | 13.9 |
| 122845 | 1 | 3 | 0.51259 | 0.00089 | 0.04705 | 0.39359 | 0.00000 | 0.00344 | 0.04027 | 0.00010 | 0.00000 | 0.00000 | 0.00000 | 0.00207 | 17.9 |
| 122845 | 1 | 4 | 0.51225 | 0.00089 | 0.04702 | 0.39333 | 0.00000 | 0.00306 | 0.04025 | 0.00010 | 0.00000 | 0.00000 | 0.00000 | 0.00311 | 21.7 |
| 122845 | 1 | 5 | 0.51192 | 0.00089 | 0.04699 | 0.39307 | 0.00000 | 0.00267 | 0.04022 | 0.00010 | 0.00000 | 0.00000 | 0.00000 | 0.00414 | 25.6 |
| 122845 | 2 | 1 | 0.51158 | 0.00089 | 0.04696 | 0.39282 | 0.00000 | 0.00229 | 0.04019 | 0.00010 | 0.00000 | 0.00000 | 0.00000 | 0.00517 | 29.4 |
| 122845 | 2 | 2 | 0.51125 | 0.00089 | 0.04693 | 0.39256 | 0.00000 | 0.00191 | 0.04017 | 0.00010 | 0.00000 | 0.00000 | 0.00000 | 0.00620 | 33.2 |
| 122845 | 2 | 3 | 0.51092 | 0.00089 | 0.04690 | 0.39230 | 0.00000 | 0.00153 | 0.04014 | 0.00010 | 0.00000 | 0.00000 | 0.00000 | 0.00723 | 36.9 |
| 122845 | 2 | 4 | 0.51059 | 0.00089 | 0.04687 | 0.39205 | 0.00000 | 0.00114 | 0.04012 | 0.00010 | 0.00000 | 0.00000 | 0.00000 | 0.00826 | 40.6 |
| 122845 | 2 | 5 | 0.51025 | 0.00089 | 0.04684 | 0.39179 | 0.00000 | 0.00076 | 0.04009 | 0.00010 | 0.00000 | 0.00000 | 0.00000 | 0.00928 | 44.3 |
| 122845 | 3 | 1 | 0.50992 | 0.00089 | 0.04681 | 0.39154 | 0.00000 | 0.00038 | 0.04006 | 0.00010 | 0.00000 | 0.00000 | 0.00000 | 0.01031 | 48.0 |
| 122845 | 3 | 2 | 0.50959 | 0.00089 | 0.04677 | 0.39128 | 0.00000 | 0.00000 | 0.04004 | 0.00010 | 0.00000 | 0.00000 | 0.00000 | 0.01133 | 51.6 |
| 122845 | 3 | 4 | 0.51326 | 0.00089 | 0.04711 | 0.39410 | 0.00000 | 0.00421 | 0.04033 | 0.00010 | 0.00000 | 0.00000 | 0.00000 | 0.00000 | 10.0 |
| 122845 | 3 | 5 | 0.51316 | 0.00089 | 0.04710 | 0.39403 | 0.00000 | 0.00383 | 0.04032 | 0.00010 | 0.00057 | 0.00000 | 0.00000 | 0.00000 | 16.0 |
| 122845 | 4 | 1 | 0.51307 | 0.00089 | 0.04709 | 0.39396 | 0.00000 | 0.00345 | 0.04031 | 0.00010 | 0.00114 | 0.00000 | 0.00000 | 0.00000 | 21.9 |
| 122845 | 4 | 2 | 0.51297 | 0.00089 | 0.04709 | 0.39388 | 0.00000 | 0.00306 | 0.04030 | 0.00010 | 0.00170 | 0.00000 | 0.00000 | 0.00000 | 27.7 |
| 122845 | 4 | 3 | 0.51288 | 0.00089 | 0.04708 | 0.39381 | 0.00000 | 0.00268 | 0.04030 | 0.00010 | 0.00227 | 0.00000 | 0.00000 | 0.00000 | 33.5 |
| 122845 | 4 | 4 | 0.51278 | 0.00089 | 0.04707 | 0.39374 | 0.00000 | 0.00230 | 0.04029 | 0.00010 | 0.00284 | 0.00000 | 0.00000 | 0.00000 | 39.2 |
| 122845 | 4 | 5 | 0.51269 | 0.00089 | 0.04706 | 0.39366 | 0.00000 | 0.00191 | 0.04028 | 0.00010 | 0.00340 | 0.00000 | 0.00000 | 0.00000 | 44.9 |
| 122845 | 5 | 1 | 0.51259 | 0.00089 | 0.04705 | 0.39359 | 0.00000 | 0.00153 | 0.04027 | 0.00010 | 0.00397 | 0.00000 | 0.00000 | 0.00000 | 50.6 |
| 122845 | 5 | 2 | 0.51250 | 0.00089 | 0.04704 | 0.39352 | 0.00000 | 0.00115 | 0.04027 | 0.00010 | 0.00454 | 0.00000 | 0.00000 | 0.00000 | 56.2 |
| 122845 | 5 | 4 | 0.51231 | 0.00089 | 0.04702 | 0.39337 | 0.00000 | 0.00038 | 0.04025 | 0.00010 | 0.00567 | 0.00000 | 0.00000 | 0.00000 | 67.2 |
| 122845 | 5 | 5 | 0.51222 | 0.00089 | 0.04702 | 0.39330 | 0.00000 | 0.00000 | 0.04024 | 0.00010 | 0.00624 | 0.00000 | 0.00000 | 0.00000 | 72.7 |
| 122846 | 1 | 1 | 0.51326 | 0.00089 | 0.04711 | 0.39410 | 0.00000 | 0.00421 | 0.04033 | 0.00010 | 0.00000 | 0.00000 | 0.00000 | 0.00000 | 10.0 |
| 122846 | 1 | 2 | 0.51340 | 0.00089 | 0.04712 | 0.39421 | 0.00011 | 0.00383 | 0.04034 | 0.00010 | 0.00000 | 0.00000 | 0.00000 | 0.00000 | 10.0 |
| 122846 | 1 | 3 | 0.51354 | 0.00089 | 0.04714 | 0.39432 | 0.00022 | 0.00345 | 0.04035 | 0.00010 | 0.00000 | 0.00000 | 0.00000 | 0.00000 | 10.0 |
| 122846 | 1 | 4 | 0.51368 | 0.00089 | 0.04715 | 0.39442 | 0.00033 | 0.00307 | 0.04036 | 0.00010 | 0.00000 | 0.00000 | 0.00000 | 0.00000 | 10.0 |
| 122846 | 1 | 5 | 0.51382 | 0.00089 | 0.04716 | 0.39453 | 0.00044 | 0.00268 | 0.04037 | 0.00010 | 0.00000 | 0.00000 | 0.00000 | 0.00000 | 10.0 |
| 122846 | 2 | 1 | 0.51396 | 0.00089 | 0.04718 | 0.39464 | 0.00056 | 0.00230 | 0.04038 | 0.00010 | 0.00000 | 0.00000 | 0.00000 | 0.00000 | 10.0 |
| 122846 | 2 | 2 | 0.51410 | 0.00089 | 0.04719 | 0.39475 | 0.00067 | 0.00192 | 0.04039 | 0.00010 | 0.00000 | 0.00000 | 0.00000 | 0.00000 | 10.0 |
| 122846 | 2 | 3 | 0.51424 | 0.00089 | 0.04720 | 0.39485 | 0.00078 | 0.00154 | 0.04040 | 0.00010 | 0.00000 | 0.00000 | 0.00000 | 0.00000 | 10.0 |
| 122846 | 2 | 4 | 0.51438 | 0.00089 | 0.04721 | 0.39496 | 0.00089 | 0.00115 | 0.04041 | 0.00010 | 0.00000 | 0.00000 | 0.00000 | 0.00000 | 10.0 |
| 122846 | 2 | 5 | 0.51452 | 0.00089 | 0.04723 | 0.39507 | 0.00100 | 0.00077 | 0.04043 | 0.00010 | 0.00000 | 0.00000 | 0.00000 | 0.00000 | 10.0 |
| 122846 | 3 | 2 | 0.51480 | 0.00089 | 0.04725 | 0.39528 | 0.00122 | 0.00000 | 0.04045 | 0.00010 | 0.00000 | 0.00000 | 0.00000 | 0.00000 | 10.0 |
| 122846 | 3 | 5 | 0.50898 | 0.00089 | 0.04672 | 0.39082 | 0.00011 | 0.00000 | 0.03999 | 0.00010 | 0.00000 | 0.00000 | 0.01240 | 0.00000 | 36.4 |
| 122846 | 4 | 1 | 0.50956 | 0.00089 | 0.04677 | 0.39126 | 0.00022 | 0.00000 | 0.04004 | 0.00010 | 0.00000 | 0.00000 | 0.01117 | 0.00000 | 33.7 |
| 122846 | 4 | 2 | 0.51014 | 0.00089 | 0.04682 | 0.39170 | 0.00033 | 0.00000 | 0.04008 | 0.00010 | 0.00000 | 0.00000 | 0.00994 | 0.00000 | 31.1 |
| 122846 | 4 | 4 | 0.51129 | 0.00089 | 0.04693 | 0.39259 | 0.00055 | 0.00000 | 0.04017 | 0.00010 | 0.00000 | 0.00000 | 0.00747 | 0.00000 | 25.8 |
| 122846 | 4 | 5 | 0.51188 | 0.00089 | 0.04698 | 0.39304 | 0.00066 | 0.00000 | 0.04022 | 0.00010 | 0.00000 | 0.00000 | 0.00623 | 0.00000 | 23.2 |
| 122846 | 5 | 1 | 0.51246 | 0.00089 | 0.04704 | 0.39349 | 0.00077 | 0.00000 | 0.04026 | 0.00010 | 0.00000 | 0.00000 | 0.00499 | 0.00000 | 20.6 |
| 122846 | 5 | 3 | 0.51363 | 0.00089 | 0.04715 | 0.39438 | 0.00100 | 0.00000 | 0.04036 | 0.00010 | 0.00000 | 0.00000 | 0.00250 | 0.00000 | 15.3 |
| 122846 | 5 | 4 | 0.51421 | 0.00089 | 0.04720 | 0.39483 | 0.00111 | 0.00000 | 0.04040 | 0.00010 | 0.00000 | 0.00000 | 0.00125 | 0.00000 | 12.6 |
| 122846 | 5 | 5 | 0.51480 | 0.00089 | 0.04725 | 0.39528 | 0.00122 | 0.00000 | 0.04045 | 0.00010 | 0.00000 | 0.00000 | 0.00000 | 0.00000 | 10.0 |
| 122847 | 1 | 1 | 0.50959 | 0.00089 | 0.04677 | 0.39128 | 0.00000 | 0.00000 | 0.04004 | 0.00010 | 0.00000 | 0.00000 | 0.00000 | 0.01133 | 51.6 |
| 122847 | 1 | 2 | 0.51006 | 0.00089 | 0.04682 | 0.39164 | 0.00011 | 0.00000 | 0.04007 | 0.00010 | 0.00000 | 0.00000 | 0.00000 | 0.01031 | 48.0 |
| 122847 | 1 | 3 | 0.51053 | 0.00089 | 0.04686 | 0.39201 | 0.00022 | 0.00000 | 0.04011 | 0.00010 | 0.00000 | 0.00000 | 0.00000 | 0.00929 | 44.3 |
| 122847 | 1 | 4 | 0.51100 | 0.00089 | 0.04690 | 0.39237 | 0.00033 | 0.00000 | 0.04015 | 0.00010 | 0.00000 | 0.00000 | 0.00000 | 0.00826 | 40.6 |
| 122847 | 1 | 5 | 0.51147 | 0.00089 | 0.04695 | 0.39273 | 0.00044 | 0.00000 | 0.04019 | 0.00010 | 0.00000 | 0.00000 | 0.00000 | 0.00724 | 36.9 |
| 122847 | 2 | 1 | 0.51194 | 0.00089 | 0.04699 | 0.39309 | 0.00055 | 0.00000 | 0.04022 | 0.00010 | 0.00000 | 0.00000 | 0.00000 | 0.00621 | 33.2 |
| 122847 | 2 | 3 | 0.51289 | 0.00089 | 0.04708 | 0.39382 | 0.00078 | 0.00000 | 0.04030 | 0.00010 | 0.00000 | 0.00000 | 0.00000 | 0.00415 | 25.6 |
| 122847 | 2 | 5 | 0.51384 | 0.00089 | 0.04717 | 0.39455 | 0.00100 | 0.00000 | 0.04037 | 0.00010 | 0.00000 | 0.00000 | 0.00000 | 0.00208 | 17.9 |
| 122847 | 3 | 2 | 0.51480 | 0.00089 | 0.04725 | 0.39528 | 0.00122 | 0.00000 | 0.04045 | 0.00010 | 0.00000 | 0.00000 | 0.00000 | 0.00000 | 10.0 |
| 122847 | 3 | 4 | 0.51222 | 0.00089 | 0.04702 | 0.39330 | 0.00000 | 0.00000 | 0.04024 | 0.00010 | 0.00624 | 0.00000 | 0.00000 | 0.00000 | 72.7 |
| 122847 | 3 | 5 | 0.51245 | 0.00089 | 0.04704 | 0.39348 | 0.00011 | 0.00000 | 0.04026 | 0.00010 | 0.00567 | 0.00000 | 0.00000 | 0.00000 | 67.2 |
| 122847 | 4 | 1 | 0.51268 | 0.00089 | 0.04706 | 0.39366 | 0.00022 | 0.00000 | 0.04028 | 0.00010 | 0.00511 | 0.00000 | 0.00000 | 0.00000 | 61.7 |
| 122847 | 4 | 2 | 0.51292 | 0.00089 | 0.04708 | 0.39384 | 0.00033 | 0.00000 | 0.04030 | 0.00010 | 0.00454 | 0.00000 | 0.00000 | 0.00000 | 56.2 |
| 122847 | 4 | 3 | 0.51315 | 0.00089 | 0.04710 | 0.39402 | 0.00044 | 0.00000 | 0.04032 | 0.00010 | 0.00398 | 0.00000 | 0.00000 | 0.00000 | 50.6 |
| 122847 | 4 | 4 | 0.51339 | 0.00089 | 0.04712 | 0.39420 | 0.00055 | 0.00000 | 0.04030 | 0.00010 | 0.00341 | 0.00000 | 0.00000 | 0.00000 | 44.9 |
| 122847 | 4 | 5 | 0.51362 | 0.00089 | 0.04714 | 0.39438 | 0.00067 | 0.00000 | 0.04035 | 0.00010 | 0.00284 | 0.00000 | 0.00000 | 0.00000 | 39.2 |
| 122847 | 5 | 1 | 0.51386 | 0.00089 | 0.04717 | 0.39456 | 0.00078 | 0.00000 | 0.04037 | 0.00010 | 0.00228 | 0.00000 | 0.00000 | 0.00000 | 33.5 |
| 122847 | 5 | 3 | 0.51433 | 0.00089 | 0.04721 | 0.39492 | 0.00100 | 0.00000 | 0.04041 | 0.00010 | 0.00114 | 0.00000 | 0.00000 | 0.00000 | 21.9 |
| 122847 | 5 | 5 | 0.51480 | 0.00089 | 0.04725 | 0.39528 | 0.00122 | 0.00000 | 0.04045 | 0.00010 | 0.00000 | 0.00000 | 0.00000 | 0.00000 | 10.0 |
| 122848 | 1 | 3 | 0.50738 | 0.00088 | 0.04657 | 0.38956 | 0.00022 | 0.00000 | 0.03986 | 0.00010 | 0.00000 | 0.01543 | 0.00000 | 0.00000 | 16.3 |
| 122848 | 3 | 2 | 0.51482 | 0.00089 | 0.04725 | 0.39527 | 0.00122 | 0.00000 | 0.04045 | 0.00010 | 0.00000 | 0.00000 | 0.00000 | 0.00000 | 10.0 |
| 122848 | 4 | 4 | 0.50750 | 0.00088 | 0.04658 | 0.38965 | 0.00000 | 0.00000 | 0.03987 | 0.00010 | 0.00000 | 0.01029 | 0.00000 | 0.00513 | 33.2 |
| 122848 | 4 | 5 | 0.50785 | 0.00088 | 0.04661 | 0.38992 | 0.00000 | 0.00000 | 0.03990 | 0.00010 | 0.00000 | 0.00858 | 0.00000 | 0.00616 | 36.3 |
| 122848 | 5 | 1 | 0.50820 | 0.00088 | 0.04664 | 0.39019 | 0.00000 | 0.00000 | 0.03993 | 0.00010 | 0.00000 | 0.00687 | 0.00000 | 0.00719 | 39.4 |
| 122848 | 5 | 2 | 0.50855 | 0.00088 | 0.04668 | 0.39046 | 0.00000 | 0.00000 | 0.03995 | 0.00010 | 0.00000 | 0.00516 | 0.00000 | 0.00822 | 42.5 |
| 122848 | 5 | 3 | 0.50891 | 0.00088 | 0.04671 | 0.39073 | 0.00000 | 0.00000 | 0.03998 | 0.00010 | 0.00000 | 0.00344 | 0.00000 | 0.00926 | 45.5 |
| 122848 | 5 | 4 | 0.50926 | 0.00088 | 0.04674 | 0.39100 | 0.00000 | 0.00000 | 0.04001 | 0.00010 | 0.00000 | 0.00172 | 0.00000 | 0.01029 | 48.6 |
| 122848 | 5 | 5 | 0.50961 | 0.00089 | 0.04677 | 0.39127 | 0.00000 | 0.00000 | 0.04004 | 0.00010 | 0.00000 | 0.00000 | 0.00000 | 0.01133 | 51.6 |
| 122849 | 2 | 2 | 0.50927 | 0.00089 | 0.04670 | 0.39101 | 0.00000 | 0.00000 | 0.04001 | 0.00010 | 0.00338 | 0.00861 | 0.00000 | 0.00000 | 47.9 |
| 122849 | 2 | 3 | 0.50986 | 0.00089 | 0.04680 | 0.39146 | 0.00000 | 0.00000 | 0.04006 | 0.00010 | 0.00395 | 0.00689 | 0.00000 | 0.00000 | 52.9 |

TABLE VI-continued

USING POLYOXYETHYLENE-BASED POROGENS WITH A CERTAIN WT % EO CONTENT-
Composition of Array Elements (mole Fractions)

| LIBID | R | C | H2O | HNO3 | MTES | PGPE | Pluronic_L101 | Pluronic_L31 | TEOS | TMAH | Triton_X-102 | Triton_X-15 | Triton_X-35 | Triton_X-45 | wt % EO in surfactant |
|---|---|---|---|---|---|---|---|---|---|---|---|---|---|---|---|
| 122849 | 2 | 4 | 0.51045 | 0.00089 | 0.04685 | 0.39192 | 0.00000 | 0.00000 | 0.04010 | 0.00010 | 0.00452 | 0.00518 | 0.00000 | 0.00000 | 57.9 |
| 122849 | 2 | 5 | 0.51105 | 0.00089 | 0.04690 | 0.39237 | 0.00000 | 0.00000 | 0.04015 | 0.00010 | 0.00509 | 0.00345 | 0.00000 | 0.00000 | 62.8 |
| 122849 | 3 | 1 | 0.51164 | 0.00089 | 0.04696 | 0.39283 | 0.00000 | 0.00000 | 0.04020 | 0.00010 | 0.00566 | 0.00173 | 0.00000 | 0.00000 | 67.8 |
| 122849 | 3 | 2 | 0.51224 | 0.00089 | 0.04701 | 0.39328 | 0.00000 | 0.00000 | 0.04024 | 0.00010 | 0.00624 | 0.00000 | 0.00000 | 0.00000 | 72.7 |
| 122849 | 5 | 5 | 0.50843 | 0.00089 | 0.04666 | 0.39036 | 0.00000 | 0.00000 | 0.03994 | 0.00010 | 0.00000 | 0.00000 | 0.01362 | 0.00000 | 39.0 |
| 122850 | 1 | 1 | 0.51224 | 0.00089 | 0.04701 | 0.39328 | 0.00000 | 0.00000 | 0.04024 | 0.00010 | 0.00624 | 0.00000 | 0.00000 | 0.00000 | 72.7 |
| 122850 | 1 | 2 | 0.51189 | 0.00089 | 0.04698 | 0.39302 | 0.00000 | 0.00000 | 0.04022 | 0.00010 | 0.00567 | 0.00000 | 0.00125 | 0.00000 | 69.8 |
| 122850 | 1 | 3 | 0.51154 | 0.00089 | 0.04695 | 0.39275 | 0.00000 | 0.00000 | 0.04019 | 0.00010 | 0.00510 | 0.00000 | 0.00249 | 0.00000 | 66.8 |
| 122850 | 1 | 5 | 0.51085 | 0.00089 | 0.04689 | 0.39222 | 0.00000 | 0.00000 | 0.04013 | 0.00010 | 0.00396 | 0.00000 | 0.00498 | 0.00000 | 60.8 |
| 122850 | 2 | 1 | 0.51050 | 0.00089 | 0.04685 | 0.39195 | 0.00000 | 0.00000 | 0.04011 | 0.00010 | 0.00339 | 0.00000 | 0.00622 | 0.00000 | 57.8 |
| 122850 | 2 | 2 | 0.51015 | 0.00089 | 0.04682 | 0.39168 | 0.00000 | 0.00000 | 0.04008 | 0.00010 | 0.00282 | 0.00000 | 0.00746 | 0.00000 | 54.7 |
| 122850 | 2 | 3 | 0.50981 | 0.00089 | 0.04679 | 0.39142 | 0.00000 | 0.00000 | 0.04005 | 0.00010 | 0.00226 | 0.00000 | 0.00869 | 0.00000 | 51.6 |
| 122850 | 2 | 4 | 0.50946 | 0.00089 | 0.04676 | 0.39115 | 0.00000 | 0.00000 | 0.04002 | 0.00010 | 0.00169 | 0.00000 | 0.00993 | 0.00000 | 48.5 |
| 122850 | 2 | 5 | 0.50912 | 0.00088 | 0.04673 | 0.39089 | 0.00000 | 0.00000 | 0.04000 | 0.00010 | 0.00113 | 0.00000 | 0.01116 | 0.00000 | 45.4 |
| 122850 | 3 | 1 | 0.50877 | 0.00088 | 0.04670 | 0.39063 | 0.00000 | 0.00000 | 0.03997 | 0.00010 | 0.00056 | 0.00000 | 0.01239 | 0.00000 | 42.2 |
| 122850 | 3 | 2 | 0.50843 | 0.00088 | 0.04666 | 0.39036 | 0.00000 | 0.00000 | 0.03994 | 0.00010 | 0.00000 | 0.00000 | 0.01362 | 0.00000 | 39.0 |
| 122851 | 1 | 1 | 0.50961 | 0.00089 | 0.04677 | 0.39127 | 0.00000 | 0.00000 | 0.04004 | 0.00010 | 0.00000 | 0.00000 | 0.00000 | 0.01133 | 51.6 |
| 122851 | 1 | 2 | 0.50950 | 0.00089 | 0.04676 | 0.39119 | 0.00000 | 0.00000 | 0.04003 | 0.00010 | 0.00000 | 0.00000 | 0.00124 | 0.01030 | 50.5 |
| 122851 | 1 | 3 | 0.50939 | 0.00089 | 0.04675 | 0.39110 | 0.00000 | 0.00000 | 0.04002 | 0.00010 | 0.00000 | 0.00000 | 0.00248 | 0.00927 | 49.4 |
| 122851 | 1 | 4 | 0.50929 | 0.00089 | 0.04674 | 0.39102 | 0.00000 | 0.00000 | 0.04001 | 0.00010 | 0.00000 | 0.00000 | 0.00372 | 0.00824 | 48.3 |
| 122851 | 1 | 5 | 0.50918 | 0.00088 | 0.04673 | 0.39094 | 0.00000 | 0.00000 | 0.04000 | 0.00010 | 0.00000 | 0.00000 | 0.00496 | 0.00720 | 47.1 |
| 122851 | 2 | 1 | 0.50907 | 0.00088 | 0.04672 | 0.39086 | 0.00000 | 0.00000 | 0.03999 | 0.00010 | 0.00000 | 0.00000 | 0.00620 | 0.00617 | 46.0 |
| 122851 | 2 | 2 | 0.50897 | 0.00088 | 0.04671 | 0.39077 | 0.00000 | 0.00000 | 0.03999 | 0.00010 | 0.00000 | 0.00000 | 0.00744 | 0.00514 | 44.9 |
| 122851 | 2 | 3 | 0.50886 | 0.00088 | 0.04670 | 0.39069 | 0.00000 | 0.00000 | 0.03998 | 0.00010 | 0.00000 | 0.00000 | 0.00868 | 0.00411 | 43.7 |
| 122851 | 2 | 5 | 0.50864 | 0.00088 | 0.04668 | 0.39053 | 0.00000 | 0.00000 | 0.03996 | 0.00010 | 0.00000 | 0.00000 | 0.01115 | 0.00206 | 41.4 |
| 122851 | 3 | 4 | 0.50961 | 0.00089 | 0.04677 | 0.39127 | 0.00000 | 0.00000 | 0.04004 | 0.00010 | 0.00000 | 0.00000 | 0.00000 | 0.01133 | 51.6 |
| 122851 | 3 | 5 | 0.50985 | 0.00089 | 0.04679 | 0.39145 | 0.00000 | 0.00000 | 0.04005 | 0.00010 | 0.00056 | 0.00000 | 0.00000 | 0.01031 | 53.5 |
| 122851 | 4 | 1 | 0.51009 | 0.00089 | 0.04682 | 0.39163 | 0.00000 | 0.00000 | 0.04007 | 0.00010 | 0.00113 | 0.00000 | 0.00000 | 0.00928 | 55.4 |
| 122851 | 4 | 2 | 0.51032 | 0.00089 | 0.04684 | 0.39182 | 0.00000 | 0.00000 | 0.04009 | 0.00010 | 0.00169 | 0.00000 | 0.00000 | 0.00825 | 57.4 |
| 122851 | 4 | 3 | 0.51056 | 0.00089 | 0.04686 | 0.39200 | 0.00000 | 0.00000 | 0.04011 | 0.00010 | 0.00226 | 0.00000 | 0.00000 | 0.00722 | 59.3 |
| 122851 | 4 | 4 | 0.51080 | 0.00089 | 0.04688 | 0.39218 | 0.00000 | 0.00000 | 0.04013 | 0.00010 | 0.00283 | 0.00000 | 0.00000 | 0.00619 | 61.2 |
| 122851 | 4 | 5 | 0.51104 | 0.00089 | 0.04690 | 0.39237 | 0.00000 | 0.00000 | 0.04015 | 0.00010 | 0.00339 | 0.00000 | 0.00000 | 0.00516 | 63.1 |

TABLE VII

USING POLYOXYETHYLENE-BASED POROGENS WITH A CERTAIN WT % EO CONTENT, Pr perti s

| LIBID | R | C | refractive index | thickness, Angstroms | elastic modulus, GPa | hardness, GPa | dielectric constant | Eo', GPa |
|---|---|---|---|---|---|---|---|---|
| 122844 | 1 | 1 | 1.2075 | 8015 | 2.17 | 0.32 | 2.13 | 14.4 |
| 122844 | 1 | 2 | 1.2110 | 7855 | 2.32 | 0.32 | 2.26 | 12.4 |
| 122844 | 1 | 3 | 1.2181 | 7533 | 2.64 | 0.41 | 2.22 | 15.0 |
| 122844 | 1 | 4 | 1.2218 | 7480 | 2.83 | 0.44 | 2.32 | 14.0 |
| 122844 | 1 | 5 | 1.2291 | 6628 | 3.09 | 0.48 | 2.37 | 14.2 |
| 122844 | 2 | 1 | 1.2409 | 6631 | 3.49 | 0.52 | 2.46 | 14.2 |
| 122844 | 3 | 4 | 1.2299 | 6674 | 3.25 | 0.48 | 2.46 | 13.2 |
| 122844 | 3 | 5 | 1.2389 | 6505 | 3.20 | 0.53 | 2.47 | 12.9 |
| 122844 | 4 | 1 | 1.2239 | 7838 | 2.83 | 0.45 | 2.30 | 14.4 |
| 122844 | 4 | 2 | 1.2287 | 7584 | 3.09 | 0.49 | 2.36 | 14.3 |
| 122844 | 4 | 3 | 1.2258 | 7193 | 3.14 | 0.55 | 2.30 | 15.8 |
| 122844 | 4 | 4 | 1.2282 | 6902 | 3.20 | 0.54 | 2.43 | 13.5 |
| 122844 | 4 | 5 | 1.2324 | 6903 | 3.23 | 0.51 | 2.48 | 12.8 |
| 122844 | 5 | 1 | 1.2119 | 8628 | 2.24 | 0.35 | 2.12 | 14.9 |
| 122844 | 5 | 2 | 1.2104 | 8369 | 2.34 | 0.37 | 2.13 | 15.3 |
| 122844 | 5 | 3 | 1.2092 | 8377 | 2.46 | 0.42 | 2.20 | 14.5 |
| 122844 | 5 | 4 | 1.2091 | 7511 | 2.51 | 0.35 | 2.23 | 14.0 |
| 122844 | 5 | 5 | 1.2211 | 7586 | 2.66 | 0.40 | 2.34 | 12.7 |
| 122845 | 1 | 1 | 1.2089 | 8645 | 2.37 | 0.41 | 2.16 | 15.0 |
| 122845 | 1 | 2 | 1.2037 | 9197 | 2.33 | 0.36 | 2.15 | 14.8 |
| 122845 | 1 | 3 | 1.2067 | 8832 | 2.41 | 0.38 | 2.18 | 14.8 |
| 122845 | 1 | 4 | 1.2012 | 8543 | 2.51 | 0.40 | 2.21 | 14.5 |
| 122845 | 1 | 5 | 1.2074 | 8204 | 2.47 | 0.40 | 2.20 | 14.5 |
| 122845 | 2 | 1 | 1.2148 | 8325 | 2.50 | 0.41 | 2.25 | 13.6 |
| 122845 | 2 | 2 | 1.2104 | 8686 | 2.63 | 0.41 | 2.24 | 14.6 |
| 122845 | 2 | 3 | 1.2104 | 8207 | 2.64 | 0.44 | 2.24 | 14.7 |
| 122845 | 2 | 4 | 1.2164 | 7677 | 2.69 | 0.44 | 2.29 | 13.8 |
| 122845 | 2 | 5 | 1.2190 | 8131 | 2.53 | 0.40 | 2.36 | 11.7 |
| 122845 | 3 | 1 | 1.2255 | 8770 | 2.70 | 0.44 | 2.40 | 11.9 |
| 122845 | 3 | 2 | 1.2240 | 7893 | 2.81 | 0.47 | 2.40 | 12.4 |
| 122845 | 3 | 4 | 1.2076 | 8956 | 2.47 | 0.42 | 2.15 | 15.8 |
| 122845 | 3 | 5 | 1.2086 | 8747 | 2.40 | 0.39 | 2.19 | 14.3 |
| 122845 | 4 | 1 | 1.2083 | 9540 | 2.28 | 0.37 | 2.18 | 13.7 |
| 122845 | 4 | 2 | 1.1999 | 9005 | 2.24 | 0.36 | 2.18 | 13.5 |
| 122845 | 4 | 3 | 1.2004 | 8829 | 2.27 | 0.37 | 2.18 | 13.8 |
| 122845 | 4 | 4 | 1.2029 | 9197 | 2.34 | 0.39 | 2.22 | 13.5 |
| 122845 | 4 | 5 | 1.2057 | 9105 | 2.31 | 0.37 | 2.22 | 13.1 |
| 122845 | 5 | 1 | 1.2054 | 9105 | 2.23 | 0.38 | 2.24 | 12.4 |
| 122845 | 5 | 2 | 1.2045 | 9482 | 2.33 | 0.38 | 2.25 | 12.6 |
| 122845 | 5 | 4 | 1.1960 | 10025 | 2.20 | 0.34 | 2.27 | 11.7 |
| 122845 | 5 | 5 | 1.1926 | 9568 | 2.07 | 0.34 | 2.23 | 11.7 |
| 122846 | 1 | 1 | 1.2246 | 7829 | 2.14 | 0.31 | 2.19 | 12.7 |
| 122846 | 1 | 2 | 1.2056 | 8808 | 2.08 | 0.29 | 2.13 | 13.7 |
| 122846 | 1 | 3 | 1.2142 | 8632 | 2.49 | 0.36 | 2.15 | 15.8 |
| 122846 | 1 | 4 | 1.1999 | 9235 | 2.27 | 0.35 | 2.11 | 15.6 |
| 122846 | 1 | 5 | 1.2031 | 8507 | 2.35 | 0.36 | 2.07 | 17.4 |
| 122846 | 2 | 1 | 1.2169 | 9658 | 2.25 | 0.37 | 2.11 | 15.3 |
| 122846 | 2 | 2 | 1.1986 | 9642 | 2.24 | 0.37 | 2.10 | 15.6 |
| 122846 | 2 | 3 | 1.1919 | 9432 | 2.22 | 0.37 | 2.11 | 15.3 |
| 122846 | 2 | 4 | 1.2017 | 10013 | 2.27 | 0.38 | 2.13 | 15.0 |

TABLE VII-continued

USING POLYOXYETHYLENE-BASED POROGENS WITH A CERTAIN WT % EO CONTENT, Properties

| LIBID | R | C | refractive index | thickness, Angstroms | elastic modulus, GPa | hardness, GPa | dielectric constant | Eo', GPa |
|---|---|---|---|---|---|---|---|---|
| 122846 | 2 | 5 | 1.1940 | 9340 | 1.87 | 0.31 | 2.09 | 13.2 |
| 122846 | 3 | 2 | 1.2016 | 10016 | 2.10 | 0.35 | 2.12 | 14.1 |
| 122846 | 3 | 5 | 1.2368 | 7375 | 3.38 | 0.53 | 2.48 | 13.4 |
| 122846 | 4 | 1 | 1.2320 | 8262 | 3.09 | 0.45 | 2.43 | 13.1 |
| 122846 | 4 | 2 | 1.2271 | 8304 | 3.16 | 0.47 | 2.46 | 13.0 |
| 122846 | 4 | 4 | 1.2147 | 8039 | 2.72 | 0.43 | 2.38 | 12.3 |
| 122846 | 4 | 5 | 1.2141 | 8619 | 2.55 | 0.42 | 2.32 | 12.5 |
| 122846 | 5 | 1 | 1.2020 | 10421 | 2.42 | 0.40 | 2.33 | 11.7 |
| 122846 | 5 | 3 | 1.1999 | 10403 | 2.21 | 0.35 | 2.20 | 13.0 |
| 122846 | 5 | 4 | 1.1903 | 10491 | 1.97 | 0.31 | 2.09 | 14.1 |
| 122846 | 5 | 5 | 1.1894 | 10610 | 1.90 | 0.30 | 2.08 | 13.7 |
| 122847 | 1 | 1 | 1.2247 | 7731 | 2.72 | 0.37 | 2.38 | 12.3 |
| 122847 | 1 | 2 | 1.2184 | 7749 | 2.45 | 0.33 | 2.32 | 12.1 |
| 122847 | 1 | 3 | 1.2118 | 7842 | 2.39 | 0.35 | 2.29 | 12.2 |
| 122847 | 1 | 4 | 1.2119 | 8392 | 2.49 | 0.37 | 2.31 | 12.4 |
| 122847 | 1 | 5 | 1.2123 | 8790 | 2.64 | 0.43 | 2.24 | 14.5 |
| 122847 | 2 | 1 | 1.1914 | 9629 | 2.60 | 0.41 | 2.24 | 14.4 |
| 122847 | 2 | 3 | 1.1866 | 9238 | 2.24 | 0.37 | 2.20 | 13.3 |
| 122847 | 2 | 5 | 1.1887 | 9823 | 2.06 | 0.35 | 2.13 | 13.6 |
| 122847 | 3 | 2 | 1.1875 | 10667 | 1.97 | 0.34 | 2.10 | 13.8 |
| 122847 | 3 | 4 | 1.1945 | 9373 | 2.12 | 0.33 | 2.27 | 11.2 |
| 122847 | 3 | 5 | 1.1953 | 8763 | 2.12 | 0.32 | 2.26 | 11.4 |
| 122847 | 4 | 1 | 1.1916 | 10025 | 2.12 | 0.33 | 2.22 | 12.0 |
| 122847 | 4 | 2 | 1.1982 | 9510 | 2.15 | 0.34 | 2.18 | 13.0 |
| 122847 | 4 | 3 | 1.1920 | 10689 | 2.07 | 0.33 | 2.18 | 12.6 |
| 122847 | 4 | 4 | 1.1892 | 9629 | 1.94 | 0.32 | 2.18 | 11.7 |
| 122847 | 4 | 5 | 1.1909 | 10870 | 2.08 | 0.36 | 2.21 | 12.0 |
| 122847 | 5 | 1 | 1.1882 | 10504 | 2.06 | 0.36 | 2.05 | 15.7 |
| 122847 | 5 | 3 | 1.1883 | 11476 | 2.01 | 0.33 | 2.12 | 13.6 |
| 122847 | 5 | 5 | 1.1889 | 11391 | 1.96 | 0.31 | 2.10 | 13.5 |
| 122848 | 1 | 3 | 1.2849 | 6053 | 4.46 | 0.69 | 2.65 | 14.6 |
| 122848 | 3 | 2 | 1.2001 | 9888 | 2.03 | 0.37 | 2.08 | 14.8 |
| 122848 | 4 | 4 | 1.2657 | 7187 | 4.14 | 0.75 | 2.59 | 14.5 |
| 122848 | 4 | 5 | 1.2538 | 6996 | 3.55 | 0.57 | 2.54 | 13.2 |
| 122848 | 5 | 1 | 1.2490 | 6888 | 3.46 | 0.55 | 2.50 | 13.5 |
| 122848 | 5 | 2 | 1.2393 | 7910 | 3.15 | 0.54 | 2.45 | 13.1 |
| 122848 | 5 | 3 | 1.2407 | 8095 | 2.95 | 0.52 | 2.46 | 12.1 |
| 122848 | 5 | 4 | 1.2330 | 8077 | 2.99 | 0.48 | 2.44 | 12.6 |
| 122848 | 5 | 5 | 1.2232 | 8072 | 2.61 | 0.43 | 2.35 | 12.3 |
| 122849 | 2 | 2 | 1.2356 | 7681 | 3.44 | 0.56 | 2.46 | 14.1 |
| 122849 | 2 | 3 | 1.2232 | 7666 | 2.94 | 0.46 | 2.43 | 12.4 |
| 122849 | 2 | 4 | 1.2164 | 8040 | 2.71 | 0.44 | 2.39 | 12.1 |
| 122849 | 2 | 5 | 1.2086 | 8682 | 2.72 | 0.52 | 2.33 | 13.2 |
| 122849 | 3 | 1 | 1.1981 | 9372 | 2.23 | 0.35 | 2.30 | 11.3 |
| 122849 | 3 | 2 | 1.1880 | 9010 | 1.98 | 0.36 | 2.22 | 11.3 |
| 122849 | 5 | 5 | 1.2360 | 7777 | 3.11 | 0.48 | 2.42 | 13.4 |
| 122850 | 1 | 1 | 1.1964 | 9291 | 2.03 | 0.31 | 2.29 | 10.5 |
| 122850 | 1 | 2 | 1.1975 | 9351 | 2.26 | 0.33 | 2.28 | 11.7 |
| 122850 | 1 | 3 | 1.1959 | 9142 | 2.33 | 0.36 | 2.30 | 11.8 |
| 122850 | 1 | 5 | 1.2125 | 7299 | 2.64 | 0.42 | 2.30 | 13.4 |
| 122850 | 2 | 1 | 1.2111 | 8504 | 2.66 | 0.45 | 2.37 | 12.2 |
| 122850 | 2 | 2 | 1.2317 | 8240 | 3.27 | 0.55 | 2.36 | 15.3 |
| 122850 | 2 | 3 | 1.2238 | 7801 | 3.19 | 0.54 | 2.41 | 13.9 |
| 122850 | 2 | 4 | 1.2300 | 7471 | 3.28 | 0.55 | 2.45 | 13.5 |
| 122850 | 2 | 5 | 1.2353 | 7672 | 3.30 | 0.54 | 2.34 | 15.7 |
| 122850 | 3 | 1 | 1.2373 | 7424 | 3.50 | 0.59 | 2.53 | 13.1 |
| 122850 | 3 | 2 | 1.2370 | 7632 | 3.32 | 0.57 | 2.54 | 12.3 |
| 122851 | 1 | 1 | 1.2196 | 7568 | 2.53 | 0.34 | 2.37 | 11.6 |
| 122851 | 1 | 2 | 1.2246 | 7641 | 2.56 | 0.34 | 2.37 | 11.8 |
| 122851 | 1 | 3 | 1.2095 | 7058 | 2.68 | 0.36 | 2.39 | 11.9 |
| 122851 | 1 | 4 | 1.2233 | 7648 | 2.90 | 0.41 | 2.32 | 14.3 |
| 122851 | 1 | 5 | 1.2188 | 8022 | 2.98 | 0.48 | 2.47 | 12.0 |
| 122851 | 2 | 1 | 1.2299 | 7918 | 2.98 | 0.50 | 2.36 | 13.8 |
| 122851 | 2 | 2 | 1.2371 | 8039 | 3.07 | 0.53 | 2.44 | 12.9 |
| 122851 | 2 | 3 | 1.2205 | 7132 | 3.14 | 0.51 | 2.46 | 12.9 |
| 122851 | 2 | 5 | 1.2352 | 7233 | 2.98 | 0.46 | 2.42 | 12.8 |
| 122851 | 3 | 4 | 1.2196 | 7462 | 2.77 | 0.47 | 2.38 | 12.6 |
| 122851 | 3 | 5 | 1.2167 | 8250 | 2.69 | 0.45 | 2.38 | 12.2 |
| 122851 | 4 | 1 | 1.2294 | 8775 | 2.46 | 0.41 | 2.32 | 12.0 |
| 122851 | 4 | 2 | 1.2217 | 8856 | 2.50 | 0.42 | 2.33 | 12.1 |
| 122851 | 4 | 3 | 1.2154 | 8120 | 2.54 | 0.43 | 2.30 | 12.9 |
| 122851 | 4 | 4 | 1.2083 | 8461 | 2.53 | 0.45 | 2.25 | 13.9 |
| 122851 | 4 | 5 | 1.2076 | 8226 | 2.39 | 0.40 | 2.26 | 12.8 |

TABLE VIII

EFFECT OF PACID LEVELS ON NORMALIZED WALL ELASTIC MODULUS - Composition of Array Elements (mol Fractions)

| LIBID | R | C | H2O | HNO3 | MTES | PGPE | Pluronic_L101 | TEOS | TMAH | pAcid |
|---|---|---|---|---|---|---|---|---|---|
| 119410 | 1 | 1 | 0.69235 | 0.00231 | 0.03537 | 0.24894 | 0.00083 | 0.02018 | 0.00002 | 1.39 |
| 119410 | 1 | 3 | 0.69555 | 0.00230 | 0.02922 | 0.24680 | 0.00110 | 0.02501 | 0.00002 | 1.39 |
| 119410 | 2 | 1 | 0.63377 | 0.00100 | 0.03081 | 0.30671 | 0.00116 | 0.02638 | 0.00017 | 1.88 |
| 119410 | 2 | 2 | 0.63736 | 0.00099 | 0.02447 | 0.30445 | 0.00115 | 0.03142 | 0.00017 | 1.88 |
| 119410 | 3 | 1 | 0.66471 | 0.00094 | 0.03231 | 0.27297 | 0.00121 | 0.02767 | 0.00018 | 1.90 |
| 119410 | 3 | 2 | 0.66824 | 0.00094 | 0.02565 | 0.27085 | 0.00120 | 0.03294 | 0.00018 | 1.90 |
| 119410 | 3 | 3 | 0.66325 | 0.00094 | 0.03391 | 0.28133 | 0.00106 | 0.01936 | 0.00015 | 1.88 |
| 119410 | 3 | 4 | 0.66678 | 0.00093 | 0.02803 | 0.27905 | 0.00105 | 0.02400 | 0.00015 | 1.88 |
| 119410 | 3 | 5 | 0.67020 | 0.00093 | 0.02225 | 0.27685 | 0.00104 | 0.02857 | 0.00015 | 1.88 |
| 119410 | 4 | 1 | 0.59037 | 0.00091 | 0.04132 | 0.34282 | 0.00097 | 0.02358 | 0.00002 | 1.88 |
| 119410 | 4 | 2 | 0.59768 | 0.00091 | 0.02717 | 0.33805 | 0.00127 | 0.03489 | 0.00003 | 1.88 |
| 119410 | 4 | 4 | 0.59416 | 0.00091 | 0.03420 | 0.34047 | 0.00096 | 0.02928 | 0.00002 | 1.88 |
| 119410 | 5 | 2 | 0.67049 | 0.00089 | 0.02225 | 0.27690 | 0.00078 | 0.02857 | 0.00011 | 1.87 |
| 119410 | 5 | 3 | 0.69287 | 0.00089 | 0.03542 | 0.24934 | 0.00111 | 0.02022 | 0.00016 | 1.89 |
| 119410 | 5 | 4 | 0.69627 | 0.00088 | 0.02927 | 0.24725 | 0.00110 | 0.02506 | 0.00016 | 1.89 |
| 119410 | 5 | 5 | 0.69961 | 0.00088 | 0.02322 | 0.24522 | 0.00109 | 0.02982 | 0.00016 | 1.89 |
| 119411 | 1 | 1 | 0.69889 | 0.00229 | 0.02318 | 0.24476 | 0.00109 | 0.02977 | 0.00002 | 1.39 |
| 119411 | 1 | 4 | 0.58998 | 0.00104 | 0.04134 | 0.34294 | 0.00097 | 0.02360 | 0.00014 | 1.88 |
| 119411 | 1 | 5 | 0.59380 | 0.00103 | 0.03421 | 0.34057 | 0.00096 | 0.02929 | 0.00014 | 1.88 |

TABLE VIII-continued

EFFECT OF PACID LEVELS ON NORMALIZED WALL
ELASTIC MODULUS - Composition of Array Elements (mol Fractions)

| LIBID | R | C | H2O | HNO3 | MTES | PGPE | Pluronic_L101 | TEOS | TMAH | pAcid |
|---|---|---|---|---|---|---|---|---|---|---|
| 119411 | 2 | 1 | 0.62237 | 0.00098 | 0.04361 | 0.30698 | 0.00102 | 0.02489 | 0.00015 | 1.89 |
| 119411 | 2 | 2 | 0.62616 | 0.00097 | 0.03608 | 0.30474 | 0.00102 | 0.03089 | 0.00015 | 1.89 |
| 119411 | 2 | 5 | 0.63403 | 0.00096 | 0.03082 | 0.30681 | 0.00087 | 0.02639 | 0.00013 | 1.87 |
| 119411 | 3 | 3 | 0.59015 | 0.00092 | 0.04131 | 0.34273 | 0.00129 | 0.02358 | 0.00003 | 1.88 |
| 119411 | 4 | 2 | 0.66143 | 0.00091 | 0.03910 | 0.27520 | 0.00092 | 0.02232 | 0.00013 | 1.89 |
| 119411 | 4 | 4 | 0.66355 | 0.00090 | 0.03392 | 0.28136 | 0.00080 | 0.01936 | 0.00012 | 1.87 |
| 119411 | 4 | 5 | 0.66503 | 0.00090 | 0.03232 | 0.27303 | 0.00091 | 0.02767 | 0.00013 | 1.89 |
| 119411 | 5 | 3 | 0.63050 | 0.00086 | 0.03724 | 0.30896 | 0.00116 | 0.02126 | 0.00002 | 1.88 |
| 119412 | 1 | 1 | 0.59755 | 0.00103 | 0.02718 | 0.33824 | 0.00096 | 0.03491 | 0.00014 | 1.88 |
| 119412 | 1 | 2 | 0.63009 | 0.00100 | 0.03725 | 0.30906 | 0.00117 | 0.02126 | 0.00017 | 1.88 |
| 119412 | 1 | 4 | 0.63071 | 0.00085 | 0.03725 | 0.30903 | 0.00087 | 0.02126 | 0.00002 | 1.87 |
| 119412 | 2 | 1 | 0.63764 | 0.00095 | 0.02447 | 0.30452 | 0.00086 | 0.03143 | 0.00013 | 1.87 |
| 119412 | 2 | 2 | 0.66110 | 0.00095 | 0.03909 | 0.27515 | 0.00122 | 0.02231 | 0.00018 | 1.90 |
| 119412 | 2 | 3 | 0.62630 | 0.00085 | 0.03606 | 0.30455 | 0.00135 | 0.03087 | 0.00003 | 1.90 |
| 119412 | 2 | 4 | 0.63776 | 0.00085 | 0.02446 | 0.30435 | 0.00115 | 0.03141 | 0.00002 | 1.88 |
| 119412 | 3 | 1 | 0.59394 | 0.00092 | 0.03419 | 0.34037 | 0.00128 | 0.02927 | 0.00003 | 1.88 |
| 119412 | 3 | 3 | 0.69657 | 0.00084 | 0.02928 | 0.24730 | 0.00082 | 0.02507 | 0.00012 | 1.88 |
| 119412 | 3 | 5 | 0.63023 | 0.00084 | 0.02865 | 0.30247 | 0.00101 | 0.03679 | 0.00002 | 1.89 |
| 119412 | 4 | 2 | 0.66703 | 0.00090 | 0.02804 | 0.27913 | 0.00079 | 0.02400 | 0.00012 | 1.87 |
| 119412 | 4 | 4 | 0.66382 | 0.00080 | 0.03391 | 0.28131 | 0.00080 | 0.01935 | 0.00002 | 1.87 |
| 119412 | 4 | 5 | 0.67056 | 0.00080 | 0.02224 | 0.27677 | 0.00104 | 0.02856 | 0.00002 | 1.88 |
| 119412 | 5 | 1 | 0.62256 | 0.00086 | 0.04358 | 0.30674 | 0.00136 | 0.02487 | 0.00003 | 1.90 |
| 119412 | 5 | 2 | 0.63412 | 0.00085 | 0.03081 | 0.30666 | 0.00116 | 0.02637 | 0.00002 | 1.88 |
| 119412 | 5 | 4 | 0.66732 | 0.00080 | 0.02803 | 0.27905 | 0.00079 | 0.02400 | 0.00002 | 1.87 |
| 119412 | 5 | 5 | 0.66155 | 0.00080 | 0.03907 | 0.27503 | 0.00122 | 0.02230 | 0.00003 | 1.90 |
| 119413 | 1 | 1 | 0.62276 | 0.00085 | 0.04360 | 0.30688 | 0.00102 | 0.02488 | 0.00002 | 1.89 |
| 119413 | 1 | 2 | 0.63435 | 0.00085 | 0.03081 | 0.30673 | 0.00087 | 0.02638 | 0.00002 | 1.87 |
| 119413 | 1 | 3 | 0.63001 | 0.00085 | 0.02864 | 0.30236 | 0.00134 | 0.03678 | 0.00002 | 1.90 |
| 119413 | 1 | 4 | 0.69316 | 0.00085 | 0.03543 | 0.24939 | 0.00083 | 0.02022 | 0.00012 | 1.88 |
| 119413 | 2 | 4 | 0.66364 | 0.00081 | 0.03390 | 0.28123 | 0.00106 | 0.01935 | 0.00002 | 1.88 |
| 119413 | 3 | 3 | 0.66513 | 0.00079 | 0.03230 | 0.27288 | 0.00121 | 0.02766 | 0.00003 | 1.90 |
| 119413 | 3 | 5 | 0.66176 | 0.00079 | 0.03908 | 0.27512 | 0.00092 | 0.02231 | 0.00002 | 1.89 |
| 119413 | 4 | 3 | 0.66712 | 0.00080 | 0.02803 | 0.27899 | 0.00105 | 0.02399 | 0.00002 | 1.88 |
| 119413 | 5 | 2 | 0.66863 | 0.00079 | 0.02564 | 0.27078 | 0.00120 | 0.03293 | 0.00003 | 1.90 |
| 119415 | 1 | 1 | 0.66536 | 0.00079 | 0.03231 | 0.27295 | 0.00091 | 0.02767 | 0.00002 | 1.89 |
| 119415 | 1 | 2 | 0.66198 | 0.00078 | 0.03910 | 0.27521 | 0.00061 | 0.02231 | 0.00001 | 1.88 |
| 119415 | 1 | 3 | 0.66887 | 0.00078 | 0.02565 | 0.27083 | 0.00090 | 0.03294 | 0.00002 | 1.89 |
| 119415 | 2 | 3 | 0.59004 | 0.00047 | 0.04135 | 0.34306 | 0.00129 | 0.02360 | 0.00019 | 2.38 |
| 119415 | 2 | 4 | 0.59380 | 0.00047 | 0.03423 | 0.34073 | 0.00128 | 0.02930 | 0.00019 | 2.38 |
| 119415 | 2 | 5 | 0.59755 | 0.00047 | 0.02719 | 0.33840 | 0.00128 | 0.03492 | 0.00019 | 2.38 |
| 119415 | 3 | 1 | 0.66145 | 0.00042 | 0.03911 | 0.27529 | 0.00122 | 0.02232 | 0.00018 | 2.40 |
| 119415 | 3 | 2 | 0.59413 | 0.00042 | 0.03423 | 0.34080 | 0.00096 | 0.02931 | 0.00014 | 2.38 |
| 119415 | 3 | 3 | 0.59791 | 0.00042 | 0.02720 | 0.33844 | 0.00096 | 0.03493 | 0.00014 | 2.38 |
| 119415 | 3 | 4 | 0.66506 | 0.00042 | 0.03233 | 0.27311 | 0.00121 | 0.02768 | 0.00018 | 2.40 |
| 119415 | 3 | 5 | 0.66857 | 0.00042 | 0.02567 | 0.27101 | 0.00120 | 0.03296 | 0.00018 | 2.40 |
| 119415 | 4 | 1 | 0.69321 | 0.00039 | 0.03544 | 0.24946 | 0.00111 | 0.02023 | 0.00016 | 2.39 |
| 119415 | 4 | 2 | 0.63439 | 0.00039 | 0.03084 | 0.30699 | 0.00087 | 0.02640 | 0.00013 | 2.37 |
| 119415 | 4 | 3 | 0.69662 | 0.00039 | 0.02929 | 0.24738 | 0.00110 | 0.02507 | 0.00016 | 2.39 |
| 119415 | 4 | 4 | 0.63803 | 0.00039 | 0.02448 | 0.30467 | 0.00086 | 0.03144 | 0.00013 | 2.37 |
| 119415 | 4 | 5 | 0.69995 | 0.00039 | 0.02324 | 0.24534 | 0.00109 | 0.02984 | 0.00016 | 2.39 |
| 119415 | 5 | 1 | 0.66739 | 0.00036 | 0.02805 | 0.27928 | 0.00079 | 0.02402 | 0.00012 | 2.37 |
| 119415 | 5 | 3 | 0.67084 | 0.00036 | 0.02226 | 0.27705 | 0.00078 | 0.02859 | 0.00011 | 2.37 |
| 119417 | 1 | 1 | 0.69324 | 0.00075 | 0.03541 | 0.24926 | 0.00111 | 0.02021 | 0.00002 | 1.89 |
| 119417 | 1 | 2 | 0.69664 | 0.00075 | 0.02926 | 0.24718 | 0.00110 | 0.02505 | 0.00002 | 1.89 |
| 119417 | 1 | 3 | 0.69344 | 0.00074 | 0.03542 | 0.24933 | 0.00083 | 0.02022 | 0.00002 | 1.88 |
| 119417 | 1 | 4 | 0.69999 | 0.00074 | 0.02322 | 0.24513 | 0.00109 | 0.02981 | 0.00002 | 1.89 |
| 119417 | 1 | 5 | 0.69684 | 0.00074 | 0.02927 | 0.24725 | 0.00082 | 0.02506 | 0.00002 | 1.88 |
| 119417 | 2 | 1 | 0.62243 | 0.00046 | 0.04362 | 0.30703 | 0.00136 | 0.02489 | 0.00020 | 2.40 |
| 119417 | 2 | 2 | 0.62617 | 0.00046 | 0.03609 | 0.30483 | 0.00135 | 0.03090 | 0.00020 | 2.40 |
| 119417 | 2 | 3 | 0.62986 | 0.00046 | 0.02867 | 0.30266 | 0.00134 | 0.03681 | 0.00020 | 2.40 |
| 119417 | 2 | 4 | 0.63045 | 0.00043 | 0.03728 | 0.30923 | 0.00117 | 0.02128 | 0.00017 | 2.38 |
| 119417 | 2 | 5 | 0.63411 | 0.00043 | 0.03083 | 0.30691 | 0.00116 | 0.02640 | 0.00017 | 2.38 |
| 119417 | 3 | 1 | 0.62273 | 0.00041 | 0.04364 | 0.30715 | 0.00102 | 0.02490 | 0.00015 | 2.39 |
| 119417 | 3 | 2 | 0.62651 | 0.00041 | 0.03610 | 0.30491 | 0.00102 | 0.03091 | 0.00015 | 2.39 |
| 119417 | 3 | 3 | 0.63024 | 0.00041 | 0.02867 | 0.30271 | 0.00101 | 0.03681 | 0.00015 | 2.39 |
| 119417 | 3 | 4 | 0.66363 | 0.00040 | 0.03392 | 0.28146 | 0.00106 | 0.01937 | 0.00015 | 2.38 |
| 119417 | 3 | 5 | 0.66714 | 0.00040 | 0.02805 | 0.27920 | 0.00105 | 0.02401 | 0.00015 | 2.38 |
| 119417 | 4 | 3 | 0.66540 | 0.00038 | 0.03234 | 0.27316 | 0.00091 | 0.02768 | 0.00013 | 2.39 |
| 119417 | 5 | 1 | 0.69348 | 0.00035 | 0.03545 | 0.24953 | 0.00083 | 0.02023 | 0.00012 | 2.38 |
| 119417 | 5 | 3 | 0.69689 | 0.00035 | 0.02929 | 0.24744 | 0.00082 | 0.02508 | 0.00012 | 2.38 |
| 119417 | 5 | 5 | 0.70025 | 0.00035 | 0.02324 | 0.24538 | 0.00082 | 0.02985 | 0.00012 | 2.38 |
| 119418 | 1 | 1 | 0.69365 | 0.00074 | 0.03543 | 0.24940 | 0.00055 | 0.02022 | 0.00001 | 1.88 |
| 119418 | 2 | 1 | 0.63769 | 0.00043 | 0.02448 | 0.30465 | 0.00115 | 0.03144 | 0.00017 | 2.38 |
| 119418 | 2 | 2 | 0.59034 | 0.00042 | 0.04137 | 0.34315 | 0.00097 | 0.02361 | 0.00014 | 2.38 |

TABLE VIII-continued

EFFECT OF PACID LEVELS ON NORMALIZED WALL ELASTIC MODULUS - Composition of Array Elements (mol Fractions)

| LIBID | R | C | H2O | HNO3 | MTES | PGPE | Pluronic_L101 | TEOS | TMAH | pAcid |
|---|---|---|---|---|---|---|---|---|---|---|
| 119418 | 2 | 5 | 0.59449 | 0.00030 | 0.03422 | 0.34070 | 0.00096 | 0.02930 | 0.00002 | 2.38 |
| 119418 | 3 | 1 | 0.67056 | 0.00040 | 0.02226 | 0.27700 | 0.00104 | 0.02859 | 0.00015 | 2.38 |
| 119418 | 3 | 2 | 0.63075 | 0.00039 | 0.03728 | 0.30930 | 0.00087 | 0.02128 | 0.00013 | 2.37 |
| 119418 | 4 | 1 | 0.66892 | 0.00037 | 0.02567 | 0.27104 | 0.00090 | 0.03296 | 0.00013 | 2.39 |
| 119418 | 4 | 2 | 0.66391 | 0.00036 | 0.03393 | 0.28151 | 0.00080 | 0.01937 | 0.00012 | 2.37 |
| 119418 | 4 | 4 | 0.63107 | 0.00028 | 0.03727 | 0.30921 | 0.00087 | 0.02127 | 0.00002 | 2.37 |
| 119418 | 5 | 3 | 0.63471 | 0.00028 | 0.03083 | 0.30690 | 0.00087 | 0.02639 | 0.00002 | 2.37 |
| 119418 | 5 | 4 | 0.63058 | 0.00028 | 0.02866 | 0.30264 | 0.00101 | 0.03681 | 0.00002 | 2.39 |
| 119419 | 1 | 2 | 0.59051 | 0.00031 | 0.04133 | 0.34294 | 0.00129 | 0.02359 | 0.00003 | 2.38 |
| 119419 | 1 | 4 | 0.59427 | 0.00031 | 0.03421 | 0.34061 | 0.00128 | 0.02929 | 0.00003 | 2.38 |
| 119419 | 2 | 1 | 0.62289 | 0.00029 | 0.04361 | 0.30694 | 0.00136 | 0.02489 | 0.00003 | 2.40 |
| 119419 | 2 | 2 | 0.62662 | 0.00029 | 0.03608 | 0.30474 | 0.00135 | 0.03089 | 0.00003 | 2.40 |
| 119419 | 2 | 3 | 0.63088 | 0.00029 | 0.03726 | 0.30911 | 0.00117 | 0.02127 | 0.00002 | 2.38 |
| 119419 | 2 | 4 | 0.63037 | 0.00029 | 0.02865 | 0.30253 | 0.00134 | 0.03680 | 0.00003 | 2.40 |
| 119419 | 2 | 5 | 0.63451 | 0.00029 | 0.03082 | 0.30681 | 0.00116 | 0.02639 | 0.00002 | 2.38 |
| 119419 | 3 | 2 | 0.62336 | 0.00028 | 0.04363 | 0.30713 | 0.00068 | 0.02490 | 0.00001 | 2.38 |
| 119419 | 4 | 1 | 0.59805 | 0.00031 | 0.02718 | 0.33826 | 0.00128 | 0.03491 | 0.00003 | 2.38 |
| 119419 | 4 | 2 | 0.59070 | 0.00030 | 0.04135 | 0.34305 | 0.00097 | 0.02360 | 0.00002 | 2.38 |
| 119419 | 4 | 3 | 0.63812 | 0.00029 | 0.02447 | 0.30453 | 0.00115 | 0.03142 | 0.00002 | 2.38 |
| 119419 | 5 | 1 | 0.62311 | 0.00028 | 0.04362 | 0.30705 | 0.00102 | 0.02490 | 0.00002 | 2.39 |
| 119419 | 5 | 3 | 0.66400 | 0.00027 | 0.03391 | 0.28138 | 0.00106 | 0.01936 | 0.00002 | 2.38 |
| 119421 | 1 | 1 | 0.66190 | 0.00027 | 0.03909 | 0.27518 | 0.00122 | 0.02231 | 0.00003 | 2.40 |
| 119421 | 1 | 2 | 0.66748 | 0.00027 | 0.02804 | 0.27914 | 0.00105 | 0.02400 | 0.00002 | 2.38 |
| 119421 | 1 | 3 | 0.66548 | 0.00027 | 0.03232 | 0.27302 | 0.00121 | 0.02767 | 0.00003 | 2.40 |
| 119421 | 1 | 4 | 0.67094 | 0.00027 | 0.02225 | 0.27690 | 0.00104 | 0.02858 | 0.00002 | 2.38 |
| 119421 | 1 | 5 | 0.66898 | 0.00027 | 0.02566 | 0.27092 | 0.00120 | 0.03295 | 0.00003 | 2.40 |
| 119421 | 3 | 3 | 0.62254 | 0.00028 | 0.04363 | 0.30709 | 0.00136 | 0.02490 | 0.00020 | 2.90 |
| 119421 | 3 | 4 | 0.62625 | 0.00028 | 0.03610 | 0.30491 | 0.00135 | 0.03090 | 0.00020 | 2.90 |
| 119421 | 3 | 5 | 0.63000 | 0.00028 | 0.02867 | 0.30269 | 0.00134 | 0.03682 | 0.00020 | 2.90 |
| 119421 | 4 | 1 | 0.63422 | 0.00025 | 0.03084 | 0.30697 | 0.00116 | 0.02640 | 0.00017 | 2.88 |
| 119421 | 4 | 2 | 0.63783 | 0.00025 | 0.02449 | 0.30468 | 0.00115 | 0.03144 | 0.00017 | 2.88 |
| 119421 | 4 | 3 | 0.69332 | 0.00023 | 0.03544 | 0.24950 | 0.00111 | 0.02203 | 0.00016 | 2.89 |
| 119421 | 4 | 4 | 0.66374 | 0.00023 | 0.03393 | 0.28151 | 0.00106 | 0.01937 | 0.00015 | 2.88 |
| 119421 | 4 | 5 | 0.69672 | 0.00023 | 0.02929 | 0.24741 | 0.00110 | 0.02508 | 0.00016 | 2.89 |
| 119422 | 1 | 1 | 0.66420 | 0.00027 | 0.03392 | 0.28144 | 0.00080 | 0.01936 | 0.00002 | 2.37 |
| 119422 | 1 | 2 | 0.66767 | 0.00026 | 0.02804 | 0.27920 | 0.00079 | 0.02401 | 0.00002 | 2.37 |
| 119422 | 1 | 3 | 0.66211 | 0.00026 | 0.03910 | 0.27526 | 0.00092 | 0.02232 | 0.00002 | 2.39 |
| 119422 | 1 | 4 | 0.67111 | 0.00026 | 0.02226 | 0.27698 | 0.00078 | 0.02858 | 0.00002 | 2.37 |
| 119422 | 1 | 5 | 0.66569 | 0.00026 | 0.03233 | 0.27311 | 0.00091 | 0.02768 | 0.00002 | 2.39 |
| 119422 | 2 | 1 | 0.69358 | 0.00025 | 0.03543 | 0.24939 | 0.00111 | 0.02022 | 0.00002 | 2.39 |
| 119422 | 2 | 2 | 0.69696 | 0.00025 | 0.02928 | 0.24732 | 0.00110 | 0.02507 | 0.00002 | 2.39 |
| 119422 | 2 | 3 | 0.70034 | 0.00025 | 0.02323 | 0.24525 | 0.00109 | 0.02983 | 0.00002 | 2.39 |
| 119422 | 2 | 4 | 0.69378 | 0.00025 | 0.03544 | 0.24946 | 0.00083 | 0.02023 | 0.00002 | 2.38 |
| 119422 | 2 | 5 | 0.69718 | 0.00025 | 0.02928 | 0.24737 | 0.00082 | 0.02507 | 0.00002 | 2.38 |
| 119422 | 3 | 1 | 0.59015 | 0.00028 | 0.04136 | 0.34312 | 0.00129 | 0.02361 | 0.00019 | 2.88 |
| 119422 | 3 | 2 | 0.59395 | 0.00028 | 0.03423 | 0.34077 | 0.00128 | 0.02931 | 0.00019 | 2.88 |
| 119422 | 3 | 3 | 0.59767 | 0.00027 | 0.02720 | 0.33847 | 0.00128 | 0.03493 | 0.00019 | 2.88 |
| 119422 | 3 | 4 | 0.66156 | 0.00026 | 0.03911 | 0.27534 | 0.00122 | 0.02233 | 0.00018 | 2.90 |
| 119422 | 3 | 5 | 0.66517 | 0.00025 | 0.03234 | 0.27316 | 0.00121 | 0.02769 | 0.00018 | 2.90 |
| 119422 | 4 | 1 | 0.62284 | 0.00023 | 0.04364 | 0.30721 | 0.00102 | 0.02491 | 0.00015 | 2.89 |
| 119422 | 4 | 2 | 0.66725 | 0.00023 | 0.02805 | 0.27924 | 0.00105 | 0.02401 | 0.00015 | 2.88 |
| 119422 | 4 | 3 | 0.59045 | 0.00023 | 0.04137 | 0.34321 | 0.00097 | 0.02361 | 0.00014 | 2.87 |
| 119422 | 4 | 4 | 0.70006 | 0.00023 | 0.02324 | 0.24538 | 0.00109 | 0.02984 | 0.00016 | 2.89 |
| 119423 | 1 | 1 | 0.66922 | 0.00026 | 0.02567 | 0.27097 | 0.00090 | 0.03296 | 0.00002 | 2.39 |
| 119423 | 2 | 1 | 0.70053 | 0.00024 | 0.02324 | 0.24532 | 0.00082 | 0.02984 | 0.00002 | 2.38 |
| 119423 | 2 | 2 | 0.69399 | 0.00024 | 0.03545 | 0.24952 | 0.00055 | 0.02023 | 0.00001 | 2.38 |
| 119423 | 3 | 1 | 0.63056 | 0.00025 | 0.03728 | 0.30929 | 0.00117 | 0.02128 | 0.00017 | 2.88 |
| 119423 | 3 | 2 | 0.66868 | 0.00025 | 0.02567 | 0.27105 | 0.00120 | 0.03297 | 0.00018 | 2.89 |
| 119423 | 4 | 1 | 0.67067 | 0.00023 | 0.02226 | 0.27705 | 0.00104 | 0.02859 | 0.00015 | 2.88 |
| 119423 | 4 | 2 | 0.59428 | 0.00023 | 0.03424 | 0.34084 | 0.00096 | 0.02931 | 0.00014 | 2.87 |
| 119423 | 4 | 4 | 0.62674 | 0.00011 | 0.03608 | 0.30479 | 0.00135 | 0.03089 | 0.00003 | 2.90 |
| 119423 | 4 | 5 | 0.63048 | 0.00011 | 0.02866 | 0.30258 | 0.00134 | 0.03680 | 0.00003 | 2.90 |
| 119423 | 5 | 3 | 0.59082 | 0.00011 | 0.04136 | 0.34312 | 0.00097 | 0.02361 | 0.00002 | 2.88 |
| 119423 | 5 | 4 | 0.59462 | 0.00011 | 0.03423 | 0.34076 | 0.00096 | 0.02930 | 0.00002 | 2.88 |
| 119423 | 5 | 5 | 0.59835 | 0.00011 | 0.02720 | 0.33844 | 0.00096 | 0.03493 | 0.00002 | 2.87 |
| 119424 | 2 | 1 | 0.69390 | 0.00015 | 0.03546 | 0.24961 | 0.00055 | 0.02024 | 0.00008 | 2.88 |
| 119424 | 2 | 4 | 0.59062 | 0.00012 | 0.04134 | 0.34300 | 0.00129 | 0.02360 | 0.00003 | 2.88 |
| 119424 | 2 | 5 | 0.59440 | 0.00012 | 0.03422 | 0.34065 | 0.00128 | 0.02930 | 0.00003 | 2.88 |
| 119424 | 3 | 1 | 0.63097 | 0.00011 | 0.03727 | 0.30919 | 0.00117 | 0.02128 | 0.00002 | 2.88 |
| 119424 | 3 | 2 | 0.63463 | 0.00011 | 0.03082 | 0.30687 | 0.00116 | 0.02639 | 0.00002 | 2.88 |
| 119424 | 3 | 3 | 0.63821 | 0.00011 | 0.02448 | 0.30460 | 0.00115 | 0.03143 | 0.00002 | 2.88 |
| 119424 | 3 | 4 | 0.62323 | 0.00010 | 0.04363 | 0.30709 | 0.00102 | 0.02490 | 0.00002 | 2.89 |
| 119424 | 4 | 3 | 0.59815 | 0.00012 | 0.02719 | 0.33833 | 0.00128 | 0.03492 | 0.00003 | 2.88 |
| 119424 | 5 | 1 | 0.62300 | 0.00011 | 0.04361 | 0.30699 | 0.00136 | 0.02489 | 0.00003 | 2.90 |

TABLE VIII-continued

EFFECT OF PACID LEVELS ON NORMALIZED WALL
ELASTIC MODULUS - Composition of Array Elements (mol Fractions)

| LIBID | R | C | H2O | HNO3 | MTES | PGPE | Pluronic_L101 | TEOS | TMAH | pAcid |
|---|---|---|---|---|---|---|---|---|---|---|
| 119424 | 5 | 2 | 0.63070 | 0.00010 | 0.02867 | 0.30269 | 0.00101 | 0.03681 | 0.00002 | 2.89 |
| 119499 | 1 | 1 | 0.66200 | 0.00010 | 0.03910 | 0.27524 | 0.00122 | 0.02232 | 0.00003 | 2.90 |
| 119499 | 1 | 3 | 0.66559 | 0.00010 | 0.03233 | 0.27307 | 0.00121 | 0.02768 | 0.00003 | 2.90 |
| 119499 | 1 | 5 | 0.63118 | 0.00010 | 0.03728 | 0.30927 | 0.00087 | 0.02128 | 0.00002 | 2.87 |
| 119499 | 2 | 2 | 0.66223 | 0.00010 | 0.03911 | 0.27531 | 0.00092 | 0.02232 | 0.00002 | 2.89 |
| 119499 | 2 | 4 | 0.66580 | 0.00010 | 0.03234 | 0.27315 | 0.00091 | 0.02769 | 0.00002 | 2.89 |
| 119499 | 2 | 5 | 0.69370 | 0.00010 | 0.03543 | 0.24942 | 0.00111 | 0.02023 | 0.00002 | 2.89 |
| 119499 | 3 | 1 | 0.70044 | 0.00009 | 0.02323 | 0.24529 | 0.00109 | 0.02983 | 0.00002 | 2.89 |
| 119499 | 3 | 2 | 0.67120 | 0.00009 | 0.02227 | 0.27705 | 0.00078 | 0.02859 | 0.00002 | 2.87 |
| 119499 | 3 | 4 | 0.69389 | 0.00009 | 0.03544 | 0.24950 | 0.00083 | 0.02023 | 0.00002 | 2.88 |
| 119499 | 4 | 3 | 0.62258 | 0.00023 | 0.04363 | 0.30710 | 0.00136 | 0.02490 | 0.00020 | 3.40 |
| 119499 | 4 | 4 | 0.62632 | 0.00022 | 0.03610 | 0.30490 | 0.00135 | 0.03090 | 0.00020 | 3.40 |
| 119499 | 4 | 5 | 0.63001 | 0.00022 | 0.02867 | 0.30273 | 0.00135 | 0.03682 | 0.00020 | 3.40 |
| 119499 | 5 | 1 | 0.63426 | 0.00020 | 0.03084 | 0.30698 | 0.00116 | 0.02640 | 0.00017 | 3.38 |
| 119499 | 5 | 2 | 0.63787 | 0.00019 | 0.02449 | 0.30470 | 0.00115 | 0.03144 | 0.00017 | 3.38 |
| 119499 | 5 | 3 | 0.69337 | 0.00018 | 0.03544 | 0.24950 | 0.00111 | 0.02023 | 0.00016 | 3.39 |
| 119499 | 5 | 4 | 0.69674 | 0.00018 | 0.02930 | 0.24744 | 0.00110 | 0.02508 | 0.00016 | 3.39 |
| 119499 | 5 | 5 | 0.70010 | 0.00018 | 0.02324 | 0.24539 | 0.00109 | 0.02984 | 0.00016 | 3.39 |
| 119500 | 1 | 1 | 0.66910 | 0.00010 | 0.02566 | 0.27095 | 0.00120 | 0.03295 | 0.00003 | 2.90 |
| 119500 | 1 | 2 | 0.63483 | 0.00010 | 0.03083 | 0.30695 | 0.00087 | 0.02640 | 0.00002 | 2.87 |
| 119500 | 1 | 3 | 0.63840 | 0.00010 | 0.02448 | 0.30469 | 0.00086 | 0.03144 | 0.00002 | 2.87 |
| 119500 | 1 | 4 | 0.66410 | 0.00010 | 0.03392 | 0.28143 | 0.00106 | 0.01936 | 0.00002 | 2.88 |
| 119500 | 1 | 5 | 0.66758 | 0.00010 | 0.02805 | 0.27919 | 0.00105 | 0.02401 | 0.00002 | 2.88 |
| 119500 | 2 | 2 | 0.66934 | 0.00010 | 0.02567 | 0.27101 | 0.00090 | 0.03296 | 0.00002 | 2.89 |
| 119500 | 2 | 4 | 0.66429 | 0.00010 | 0.03393 | 0.28150 | 0.00080 | 0.01937 | 0.00002 | 2.87 |
| 119500 | 2 | 5 | 0.69710 | 0.00010 | 0.02928 | 0.24734 | 0.00110 | 0.02507 | 0.00002 | 2.89 |
| 119500 | 3 | 2 | 0.69729 | 0.00009 | 0.02929 | 0.24741 | 0.00082 | 0.02508 | 0.00002 | 2.88 |
| 119500 | 3 | 5 | 0.70064 | 0.00009 | 0.02324 | 0.24536 | 0.00082 | 0.02984 | 0.00002 | 2.88 |
| 119500 | 4 | 1 | 0.59019 | 0.00022 | 0.04136 | 0.34315 | 0.00120 | 0.02361 | 0.00019 | 3.38 |
| 119500 | 4 | 2 | 0.59395 | 0.00022 | 0.03423 | 0.34081 | 0.00128 | 0.02931 | 0.00019 | 3.38 |
| 119500 | 4 | 3 | 0.59770 | 0.00021 | 0.02720 | 0.33849 | 0.00128 | 0.03493 | 0.00019 | 3.38 |
| 119500 | 4 | 4 | 0.66160 | 0.00020 | 0.03911 | 0.27535 | 0.00122 | 0.02233 | 0.00018 | 3.40 |
| 119500 | 4 | 5 | 0.66521 | 0.00020 | 0.03234 | 0.27317 | 0.00121 | 0.02769 | 0.00018 | 3.40 |
| 119500 | 5 | 1 | 0.66376 | 0.00018 | 0.03393 | 0.28154 | 0.00106 | 0.01937 | 0.00015 | 3.38 |
| 119500 | 5 | 2 | 0.66727 | 0.00018 | 0.02805 | 0.27928 | 0.00105 | 0.02402 | 0.00015 | 3.38 |
| 119500 | 5 | 3 | 0.67071 | 0.00018 | 0.02226 | 0.27706 | 0.00104 | 0.02859 | 0.00015 | 3.37 |
| 119500 | 5 | 4 | 0.62287 | 0.00018 | 0.04365 | 0.30722 | 0.00102 | 0.02491 | 0.00015 | 3.39 |
| 119500 | 5 | 5 | 0.62669 | 0.00017 | 0.03610 | 0.30496 | 0.00102 | 0.03091 | 0.00015 | 3.39 |
| 119501 | 1 | 1 | 0.67104 | 0.00010 | 0.02226 | 0.27696 | 0.00104 | 0.02858 | 0.00002 | 2.88 |
| 119501 | 1 | 3 | 0.59432 | 0.00017 | 0.03424 | 0.34086 | 0.00096 | 0.02931 | 0.00014 | 3.37 |
| 119501 | 1 | 4 | 0.59806 | 0.00017 | 0.02721 | 0.33853 | 0.00096 | 0.03494 | 0.00014 | 3.38 |
| 119501 | 1 | 5 | 0.66195 | 0.00016 | 0.03912 | 0.27539 | 0.00092 | 0.02233 | 0.00013 | 3.39 |
| 119501 | 2 | 2 | 0.66778 | 0.00009 | 0.02805 | 0.27925 | 0.00079 | 0.02401 | 0.00002 | 2.87 |
| 119501 | 2 | 3 | 0.66553 | 0.00016 | 0.03235 | 0.27324 | 0.00091 | 0.02769 | 0.00013 | 3.39 |
| 119501 | 2 | 4 | 0.66904 | 0.00016 | 0.02568 | 0.27111 | 0.00090 | 0.03297 | 0.00013 | 3.39 |
| 119501 | 2 | 5 | 0.66753 | 0.00014 | 0.02806 | 0.27934 | 0.00079 | 0.02402 | 0.00012 | 3.37 |
| 119501 | 3 | 3 | 0.67099 | 0.00014 | 0.02227 | 0.27711 | 0.00078 | 0.02859 | 0.00011 | 3.37 |
| 119501 | 4 | 1 | 0.66871 | 0.00020 | 0.02567 | 0.27107 | 0.00120 | 0.03297 | 0.00018 | 3.40 |
| 119501 | 4 | 2 | 0.63060 | 0.00020 | 0.03728 | 0.30931 | 0.00117 | 0.02128 | 0.00017 | 3.38 |
| 119501 | 4 | 3 | 0.63073 | 0.00012 | 0.02868 | 0.30285 | 0.00067 | 0.03684 | 0.00010 | 3.38 |
| 119501 | 4 | 5 | 0.63845 | 0.00011 | 0.02450 | 0.30483 | 0.00057 | 0.03146 | 0.00008 | 3.36 |
| 119501 | 5 | 1 | 0.63036 | 0.00017 | 0.02868 | 0.30280 | 0.00101 | 0.03683 | 0.00015 | 3.39 |
| 119501 | 5 | 2 | 0.59049 | 0.00017 | 0.04138 | 0.34324 | 0.00097 | 0.02362 | 0.00014 | 3.37 |
| 119502 | 1 | 2 | 0.63457 | 0.00015 | 0.03084 | 0.30704 | 0.00087 | 0.02640 | 0.00013 | 3.37 |
| 119502 | 1 | 3 | 0.63815 | 0.00015 | 0.02449 | 0.30477 | 0.00086 | 0.03145 | 0.00013 | 3.37 |
| 119502 | 1 | 4 | 0.69364 | 0.00014 | 0.03545 | 0.24957 | 0.00083 | 0.02024 | 0.00012 | 3.38 |
| 119502 | 1 | 5 | 0.69703 | 0.00014 | 0.02930 | 0.24749 | 0.00082 | 0.02508 | 0.00012 | 3.38 |
| 119502 | 3 | 2 | 0.66783 | 0.00010 | 0.02806 | 0.27938 | 0.00053 | 0.02402 | 0.00008 | 3.36 |
| 119502 | 3 | 4 | 0.65041 | 0.00115 | 0.03370 | 0.28505 | 0.00082 | 0.02880 | 0.00006 | 1.75 |
| 119502 | 3 | 5 | 0.81435 | 0.00061 | 0.01790 | 0.15137 | 0.00044 | 0.01530 | 0.00003 | 1.85 |
| 119502 | 4 | 1 | 0.70040 | 0.00014 | 0.02325 | 0.24543 | 0.00082 | 0.02985 | 0.00012 | 3.38 |
| 119502 | 4 | 2 | 0.66406 | 0.00014 | 0.03394 | 0.28157 | 0.00080 | 0.01937 | 0.00012 | 3.37 |
| 119502 | 5 | 2 | 0.63121 | 0.00011 | 0.03730 | 0.30942 | 0.00058 | 0.02129 | 0.00009 | 3.36 |

TABLE IX

EFFECT OF PACID LEVELS ON NORMALIZED WALL ELASTIC MODULUS, Properties

| LIBID | R | C | refractive index | thickness, Angstroms | elastic modulus, GPa | hardness, GPa | dielectric constant | Eo', GPa |
|---|---|---|---|---|---|---|---|---|
| 119410 | 1 | 1 | 1.2001 | 10631 | 1.57 | 0.24 | 2.12 | 10.5 |
| 119410 | 1 | 3 | 1.1714 | 11429 | 1.35 | 0.19 | 2.09 | 9.6 |
| 119410 | 2 | 1 | 1.1618 | 9046 | 1.24 | 0.19 | 1.96 | 11.4 |
| 119410 | 2 | 2 | 1.1608 | 9515 | 1.46 | 0.19 | 2.04 | 11.3 |
| 119410 | 3 | 1 | 1.1640 | 11338 | 1.38 | 0.23 | 1.84 | 16.5 |
| 119410 | 3 | 2 | 1.1643 | 12851 | 1.42 | 0.22 | 1.99 | 12.1 |
| 119410 | 3 | 3 | 1.1643 | 11585 | 1.23 | 0.23 | 1.84 | 15.0 |
| 119410 | 3 | 4 | 1.1612 | 12488 | 1.16 | 0.20 | 1.97 | 10.4 |
| 119410 | 3 | 5 | 1.1561 | 11976 | 1.35 | 0.20 | 2.05 | 10.2 |
| 119410 | 4 | 1 | 1.1861 | 9957 | 1.54 | 0.28 | 2.05 | 11.8 |
| 119410 | 4 | 2 | 1.1654 | 10374 | 1.53 | 0.22 | 2.14 | 9.9 |
| 119410 | 4 | 4 | 1.1849 | 8940 | 1.87 | 0.30 | 2.09 | 13.3 |
| 119410 | 5 | 2 | 1.1808 | 10174 | 1.99 | 0.29 | 2.22 | 11.4 |
| 119410 | 5 | 3 | 1.1729 | 13653 | 1.21 | 0.22 | 2.03 | 9.6 |
| 119410 | 5 | 4 | 1.1600 | 13308 | 1.15 | 0.18 | 1.92 | 11.6 |
| 119410 | 5 | 5 | 1.1607 | 13610 | 1.40 | 0.20 | 2.02 | 11.4 |
| 119411 | 1 | 1 | 1.1683 | 11054 | 1.53 | 0.21 | 2.15 | 9.7 |
| 119411 | 1 | 4 | 1.1882 | 8523 | 1.30 | 0.20 | 2.01 | 10.7 |
| 119411 | 1 | 5 | 1.1873 | 8396 | 1.70 | 0.27 | 2.12 | 11.5 |
| 119411 | 2 | 1 | 1.1933 | 9762 | 1.52 | 0.29 | 2.08 | 10.9 |
| 119411 | 2 | 2 | 1.1864 | 9924 | 1.77 | 0.30 | 2.14 | 11.5 |
| 119411 | 2 | 5 | 1.1841 | 9290 | 1.71 | 0.27 | 2.11 | 11.8 |
| 119411 | 3 | 3 | 1.1703 | 9502 | 1.25 | 0.22 | 1.97 | 11.2 |
| 119411 | 4 | 2 | 1.1906 | 11189 | 1.49 | 0.28 | 2.07 | 11.0 |
| 119411 | 4 | 4 | 1.1839 | 9691 | 1.49 | 0.29 | 2.08 | 10.7 |
| 119411 | 4 | 5 | 1.1850 | 11582 | 1.62 | 0.28 | 2.11 | 11.0 |
| 119411 | 5 | 3 | 1.1693 | 10567 | 1.16 | 0.21 | 1.92 | 11.5 |
| 119412 | 1 | 1 | 1.1865 | 8314 | 2.02 | 0.27 | 2.13 | 13.4 |
| 119412 | 1 | 2 | 1.1648 | 9874 | 1.33 | 0.23 | 1.86 | 15.5 |
| 119412 | 1 | 4 | 1.1847 | 9688 | 1.53 | 0.25 | 2.04 | 11.8 |
| 119412 | 2 | 1 | 1.1858 | 8961 | 2.22 | 0.34 | 2.19 | 13.2 |
| 119412 | 2 | 2 | 1.1671 | 12255 | 1.49 | 0.31 | 1.95 | 14.0 |
| 119412 | 2 | 3 | 1.1655 | 11207 | 1.33 | 0.23 | 1.96 | 12.2 |
| 119412 | 2 | 4 | 1.1591 | 10107 | 1.46 | 0.21 | 2.04 | 11.3 |
| 119412 | 3 | 1 | 1.1693 | 8855 | 1.52 | 0.25 | 1.92 | 15.2 |
| 119412 | 3 | 3 | 1.1754 | 11514 | 1.70 | 0.30 | 2.10 | 11.8 |
| 119412 | 3 | 5 | 1.1866 | 9864 | 2.04 | 0.31 | 2.27 | 10.8 |
| 119412 | 4 | 2 | 1.1840 | 10584 | 1.67 | 0.29 | 2.05 | 12.9 |
| 119412 | 4 | 4 | 1.1874 | 10031 | 1.55 | 0.31 | 2.02 | 12.6 |
| 119412 | 4 | 5 | 1.1612 | 11041 | 1.46 | 0.23 | 2.06 | 10.9 |
| 119412 | 5 | 1 | 1.1782 | 10909 | 1.20 | 0.22 | 1.94 | 11.3 |
| 119412 | 5 | 2 | 1.1701 | 10049 | 1.39 | 0.24 | 1.95 | 13.0 |
| 119412 | 5 | 4 | 1.1932 | 9774 | 1.82 | 0.32 | 2.08 | 13.1 |
| 119412 | 5 | 5 | 1.1710 | 12038 | 1.13 | 0.22 | 1.93 | 11.1 |
| 119413 | 1 | 1 | 1.1963 | 9147 | 1.54 | 0.25 | 2.10 | 10.6 |
| 119413 | 1 | 2 | 1.1826 | 9248 | 1.79 | 0.26 | 2.18 | 10.8 |
| 119413 | 1 | 3 | 1.1605 | 10529 | 1.45 | 0.20 | 2.01 | 12.1 |
| 119413 | 1 | 4 | 1.1931 | 10802 | 1.65 | 0.30 | 2.02 | 13.4 |
| 119413 | 2 | 4 | 1.1655 | 10198 | 1.13 | 0.20 | 1.82 | 14.4 |
| 119413 | 3 | 3 | 1.1607 | 13983 | 1.31 | 0.22 | 2.08 | 9.4 |
| 119413 | 3 | 5 | 1.1896 | 11285 | 1.45 | 0.26 | 2.08 | 10.5 |
| 119413 | 4 | 3 | 1.1681 | 10381 | 1.39 | 0.24 | 1.94 | 13.4 |
| 119413 | 5 | 2 | 1.1685 | 11941 | 1.54 | 0.24 | 2.07 | 11.4 |
| 119415 | 1 | 1 | 1.1956 | 9764 | 1.77 | 0.26 | 2.07 | 12.9 |
| 119415 | 1 | 2 | 1.2227 | 9047 | 2.28 | 0.34 | 2.31 | 11.3 |
| 119415 | 1 | 3 | 1.1915 | 9811 | 2.21 | 0.29 | 2.27 | 11.7 |
| 119415 | 2 | 3 | 1.1674 | 8488 | 1.35 | 0.25 | 1.89 | 14.5 |
| 119415 | 2 | 4 | 1.1627 | 8549 | 1.42 | 0.23 | 1.96 | 13.1 |
| 119415 | 2 | 5 | 1.1615 | 8624 | 1.45 | 0.18 | 2.06 | 10.9 |
| 119415 | 3 | 1 | 1.1640 | 10414 | 0.96 | 0.18 | 1.87 | 10.8 |
| 119415 | 3 | 2 | 1.1882 | 7688 | 1.94 | 0.33 | 2.20 | 11.5 |
| 119415 | 3 | 3 | 1.1908 | 7778 | 2.68 | 0.37 | 2.28 | 13.9 |
| 119415 | 3 | 4 | 1.1573 | 11010 | 1.44 | 0.25 | 1.94 | 13.7 |
| 119415 | 3 | 5 | 1.1531 | 11868 | 1.46 | 0.22 | 2.13 | 9.6 |
| 119415 | 4 | 1 | 1.1670 | 11075 | 0.99 | 0.19 | 1.69 | 18.9 |
| 119415 | 4 | 2 | 1.1933 | 7937 | 2.02 | 0.34 | 2.07 | 14.8 |
| 119415 | 4 | 3 | 1.1591 | 11736 | 1.21 | 0.21 | 1.88 | 13.1 |
| 119415 | 4 | 4 | 1.1860 | 7668 | 2.46 | 0.36 | 2.18 | 15.0 |
| 119415 | 4 | 5 | 1.1592 | 11670 | 1.43 | 0.21 | 2.09 | 10.1 |
| 119415 | 5 | 1 | 1.1936 | 8590 | 1.92 | 0.32 | 2.02 | 15.6 |
| 119415 | 5 | 3 | 1.1917 | 8748 | 2.58 | 0.38 | 2.29 | 13.3 |
| 119417 | 1 | 1 | 1.1539 | 10910 | 0.84 | 0.14 | 1.72 | 14.1 |
| 119417 | 1 | 2 | 1.1602 | 11338 | 1.26 | 0.20 | 1.94 | 12.1 |
| 119417 | 1 | 3 | 1.1818 | 10327 | 1.32 | 0.23 | 1.99 | 11.4 |
| 119417 | 1 | 4 | 1.1591 | 11183 | 1.40 | 0.19 | 2.14 | 9.1 |
| 119417 | 1 | 5 | 1.1906 | 11069 | 1.90 | 0.31 | 2.31 | 9.5 |
| 119417 | 2 | 1 | 1.1701 | 9957 | 1.24 | 0.24 | 1.92 | 12.3 |
| 119417 | 2 | 2 | 1.1619 | 9907 | 1.38 | 0.25 | 1.97 | 12.4 |
| 119417 | 2 | 3 | 1.1571 | 9905 | 1.53 | 0.25 | 2.13 | 10.1 |
| 119417 | 2 | 4 | 1.1438 | 6252 | 1.04 | 0.17 | 1.81 | 13.6 |
| 119417 | 2 | 5 | 1.1642 | 8629 | 1.28 | 0.20 | 1.96 | 11.7 |
| 119417 | 3 | 1 | 1.1874 | 9671 | 1.58 | 0.29 | 2.13 | 10.4 |
| 119417 | 3 | 2 | 1.1964 | 9197 | 2.19 | 0.35 | 2.16 | 13.8 |
| 119417 | 3 | 3 | 1.1836 | 10144 | 2.26 | 0.36 | 2.32 | 11.2 |
| 119417 | 3 | 4 | 1.1621 | 9573 | 0.98 | 0.18 | 1.86 | 11.1 |
| 119417 | 3 | 5 | 1.1642 | 9064 | 1.22 | 0.21 | 1.90 | 12.6 |
| 119417 | 4 | 3 | 1.1864 | 10177 | 1.83 | 0.33 | 2.04 | 14.1 |
| 119417 | 5 | 1 | 1.2061 | 9617 | 1.66 | 0.35 | 1.80 | 22.2 |
| 119417 | 5 | 3 | 1.1914 | 9441 | 1.82 | 0.30 | 2.00 | 15.4 |
| 119417 | 5 | 5 | 1.1779 | 9785 | 1.99 | 0.32 | 2.36 | 9.2 |
| 119418 | 1 | 1 | 1.2195 | 10425 | 1.94 | 0.33 | 2.27 | 10.2 |
| 119418 | 2 | 1 | 1.1606 | 9209 | 1.45 | 0.21 | 2.12 | 9.8 |
| 119418 | 2 | 2 | 1.1942 | 7911 | 1.54 | 0.26 | 2.25 | 8.4 |
| 119418 | 2 | 5 | 1.1961 | 7830 | 1.93 | 0.26 | 2.22 | 11.0 |
| 119418 | 3 | 1 | 1.1633 | 8804 | 1.35 | 0.19 | 1.90 | 14.1 |
| 119418 | 3 | 2 | 1.1907 | 8434 | 1.47 | 0.28 | 2.09 | 10.4 |
| 119418 | 4 | 1 | 1.1858 | 9003 | 1.98 | 0.32 | 1.92 | 19.5 |
| 119418 | 4 | 2 | 1.1952 | 9330 | 1.53 | 0.28 | 2.05 | 11.8 |
| 119418 | 4 | 4 | 1.1917 | 8672 | 1.47 | 0.26 | 2.06 | 11.1 |
| 119418 | 5 | 3 | 1.1944 | 7699 | 1.96 | 0.33 | 2.01 | 16.2 |
| 119418 | 5 | 4 | 1.1882 | 8584 | 2.12 | 0.32 | 2.26 | 11.3 |
| 119419 | 1 | 2 | 1.1573 | 8583 | 0.88 | 0.16 | 1.81 | 11.4 |
| 119419 | 1 | 4 | 1.1555 | 8509 | 1.04 | 0.16 | 1.89 | 11.2 |
| 119419 | 2 | 1 | 1.1582 | 11204 | 0.89 | 0.17 | 1.86 | 10.2 |
| 119419 | 2 | 2 | 1.1591 | 10441 | 1.13 | 0.20 | 1.99 | 9.8 |
| 119419 | 2 | 3 | 1.1607 | 9770 | 1.01 | 0.19 | 1.92 | 10.1 |
| 119419 | 2 | 4 | 1.1574 | 10899 | 1.34 | 0.20 | 2.14 | 8.7 |
| 119419 | 2 | 5 | 1.1604 | 9329 | 1.39 | 0.25 | 2.02 | 9.3 |
| 119419 | 3 | 2 | 1.2194 | 8812 | 2.46 | 0.47 | 2.24 | 13.6 |
| 119419 | 4 | 1 | 1.1640 | 8379 | 1.46 | 0.22 | 2.10 | 10.2 |
| 119419 | 4 | 2 | 1.1820 | 8633 | 1.49 | 0.29 | 2.16 | 9.4 |
| 119419 | 4 | 3 | 1.1665 | 9769 | 1.62 | 0.25 | 2.26 | 8.7 |
| 119419 | 5 | 1 | 1.1882 | 9655 | 1.37 | 0.27 | 1.97 | 12.2 |
| 119419 | 5 | 3 | 1.1640 | 9810 | 0.97 | 0.19 | 1.72 | 16.6 |
| 119421 | 1 | 1 | 1.1705 | 10398 | 0.84 | 0.12 | 1.77 | 12.2 |
| 119421 | 1 | 2 | 1.1624 | 9835 | 1.24 | 0.22 | 1.86 | 14.3 |
| 119421 | 1 | 3 | 1.1632 | 10462 | 1.22 | 0.22 | 1.96 | 11.2 |
| 119421 | 1 | 4 | 1.1662 | 9700 | 1.57 | 0.25 | 2.10 | 10.8 |
| 119421 | 1 | 5 | 1.1604 | 10581 | 1.37 | 0.23 | 2.04 | 10.7 |
| 119421 | 3 | 3 | 1.1711 | 10580 | 1.07 | 0.22 | 1.82 | 13.5 |
| 119421 | 3 | 4 | 1.1633 | 10629 | 1.39 | 0.27 | 1.83 | 17.2 |
| 119421 | 3 | 5 | 1.1566 | 10907 | 1.37 | 0.25 | 1.96 | 12.5 |
| 119421 | 4 | 1 | 1.1683 | 8860 | 1.26 | 0.24 | 1.70 | 22.7 |
| 119421 | 4 | 2 | 1.1568 | 8927 | 1.42 | 0.24 | 1.82 | 18.1 |
| 119421 | 4 | 3 | 1.1693 | 11915 | 1.35 | 0.29 | 1.81 | 17.5 |
| 119421 | 4 | 4 | 1.1613 | 10022 | 0.99 | 0.22 | 1.71 | 17.7 |
| 119421 | 4 | 5 | 1.1576 | 11739 | 1.34 | 0.27 | 1.77 | 19.4 |
| 119422 | 1 | 1 | 1.1897 | 8328 | 1.55 | 0.27 | 1.92 | 15.6 |
| 119422 | 1 | 2 | 1.1971 | 8117 | 2.12 | 0.31 | 2.12 | 14.2 |
| 119422 | 1 | 3 | 1.1835 | 9572 | 1.43 | 0.27 | 1.81 | 18.7 |
| 119422 | 1 | 4 | 1.1850 | 7944 | 2.13 | 0.29 | 2.14 | 13.9 |
| 119422 | 1 | 5 | 1.1977 | 9326 | 2.17 | 0.36 | 2.09 | 15.4 |
| 119422 | 2 | 1 | 1.1575 | 11830 | 0.92 | 0.18 | 1.85 | 10.7 |
| 119422 | 2 | 2 | 1.1625 | 11219 | 1.17 | 0.22 | 1.91 | 12.1 |
| 119422 | 2 | 3 | 1.1672 | 11143 | 1.52 | 0.25 | 1.98 | 13.4 |
| 119422 | 2 | 4 | 1.1738 | 9001 | 1.35 | 0.26 | 1.84 | 16.3 |
| 119422 | 2 | 5 | 1.1873 | 11547 | 1.82 | 0.31 | 2.21 | 10.5 |
| 119422 | 3 | 1 | 1.1740 | 8158 | 1.24 | 0.24 | 1.80 | 14.6 |
| 119422 | 3 | 2 | 1.1644 | 8370 | 1.24 | 0.21 | 1.85 | 14.6 |
| 119422 | 3 | 3 | 1.1582 | 8457 | 1.41 | 0.22 | 1.90 | 14.6 |
| 119422 | 3 | 4 | 1.1617 | 10306 | 0.99 | 0.19 | 1.81 | 12.9 |
| 119422 | 3 | 5 | 1.1600 | 11231 | 1.08 | 0.19 | 1.86 | 12.6 |

TABLE IX-continued

EFFECT OF PACID LEVELS ON NORMALIZED WALL ELASTIC MODULUS, Properties

| LIBID | R | C | refractive index | thickness, Angstroms | elastic modulus, GPa | hardness, GPa | dielectric constant | Eo', GPa |
|---|---|---|---|---|---|---|---|---|
| 119422 | 4 | 1 | 1.2073 | 8686 | 1.71 | 0.33 | 1.80 | 22.6 |
| 119422 | 4 | 2 | 1.1655 | 9479 | 1.10 | 0.19 | 1.76 | 16.6 |
| 119422 | 4 | 3 | 1.1955 | 7382 | 1.57 | 0.30 | 1.87 | 17.6 |
| 119422 | 4 | 4 | 1.1634 | 11465 | 1.31 | 0.22 | 1.84 | 16.0 |
| 119423 | 1 | 1 | 1.1923 | 9185 | 2.33 | 0.36 | 2.12 | 15.7 |
| 119423 | 2 | 1 | 1.1930 | 9333 | 2.24 | 0.33 | 2.21 | 12.9 |
| 119423 | 2 | 2 | 1.2198 | 9146 | 2.35 | 0.37 | 2.22 | 13.3 |
| 119423 | 3 | 1 | 1.1666 | 8472 | 1.05 | 0.19 | 1.76 | 15.6 |
| 119423 | 3 | 2 | 1.1634 | 10436 | 1.42 | 0.22 | 1.95 | 13.3 |
| 119423 | 4 | 1 | 1.2148 | 9486 | 3.09 | 0.48 | 2.16 | 19.5 |
| 119423 | 4 | 2 | 1.1994 | 7230 | 2.09 | 0.36 | 2.00 | 17.4 |
| 119423 | 4 | 4 | 1.1580 | 9795 | 1.22 | 0.23 | 1.82 | 15.6 |
| 119423 | 4 | 5 | 1.1596 | 9901 | 1.35 | 0.22 | 1.89 | 14.3 |
| 119423 | 5 | 3 | 1.1960 | 7318 | 1.66 | 0.33 | 1.85 | 19.5 |
| 119423 | 5 | 4 | 1.1889 | 7812 | 1.92 | 0.33 | 1.91 | 19.4 |
| 119423 | 5 | 5 | 1.1904 | 8342 | 2.44 | 0.39 | 2.16 | 15.3 |
| 119424 | 2 | 1 | 1.2220 | 8605 | 2.18 | 0.37 | 2.18 | 13.3 |
| 119424 | 2 | 4 | 1.1705 | 8426 | 1.04 | 0.19 | 1.91 | 10.6 |
| 119424 | 2 | 5 | 1.1645 | 8592 | 1.13 | 0.19 | 1.98 | 10.0 |
| 119424 | 3 | 1 | 1.1674 | 9000 | 0.97 | 0.18 | 1.84 | 11.8 |
| 119424 | 3 | 2 | 1.1678 | 9483 | 1.16 | 0.20 | 2.06 | 8.6 |
| 119424 | 3 | 3 | 1.1609 | 9964 | 1.19 | 0.18 | 2.13 | 7.9 |
| 119424 | 3 | 4 | 1.1949 | 10017 | 1.42 | 0.27 | 2.09 | 10.0 |
| 119424 | 4 | 3 | 1.1648 | 8892 | 1.29 | 0.20 | 2.14 | 8.3 |
| 119424 | 5 | 1 | 1.1715 | 9612 | 1.01 | 0.20 | 1.78 | 14.5 |
| 119424 | 5 | 2 | 1.1832 | 9746 | 1.68 | 0.28 | 2.27 | 8.9 |
| 119499 | 1 | 1 | 1.1637 | 10014 | 0.93 | 0.17 | 1.76 | 14.1 |
| 119499 | 1 | 3 | 1.1592 | 10350 | 1.13 | 0.18 | 1.73 | 18.5 |
| 119499 | 1 | 5 | 1.1886 | 7962 | 1.47 | 0.24 | 2.00 | 12.5 |
| 119499 | 2 | 2 | 1.1842 | 10197 | 1.50 | 0.29 | 2.04 | 11.5 |
| 119499 | 2 | 4 | 1.1838 | 10658 | 1.79 | 0.33 | 2.13 | 11.8 |
| 119499 | 2 | 5 | 1.1614 | 12477 | 0.92 | 0.18 | 1.91 | 9.5 |
| 119499 | 3 | 1 | 1.1641 | 11931 | 1.39 | 0.23 | 1.68 | 26.7 |
| 119499 | 3 | 2 | 1.1859 | 8511 | 2.49 | 0.37 | 2.13 | 16.3 |
| 119499 | 3 | 4 | 1.1937 | 10946 | 1.55 | 0.31 | 1.99 | 13.2 |
| 119499 | 4 | 3 | 1.1634 | 10448 | 0.89 | 0.18 | 1.73 | 14.4 |
| 119499 | 4 | 4 | 1.1576 | 10345 | 1.12 | 0.21 | 1.77 | 16.4 |
| 119499 | 4 | 5 | 1.1602 | 10185 | 1.29 | 0.21 | 1.94 | 12.2 |
| 119499 | 5 | 1 | 1.1569 | 8051 | 0.96 | 0.17 | 1.65 | 21.1 |
| 119499 | 5 | 2 | 1.1643 | 8849 | 1.38 | 0.23 | 1.86 | 15.9 |
| 119499 | 5 | 3 | 1.1614 | 10118 | 0.95 | 0.19 | 1.68 | 18.3 |
| 119499 | 5 | 4 | 1.1393 | 7873 | 0.60 | 0.09 | 1.52 | 22.8 |
| 119499 | 5 | 5 | 1.1515 | 12823 | 1.09 | 0.19 | 1.82 | 13.9 |
| 119500 | 1 | 1 | 1.1529 | 9873 | 1.01 | 0.12 | 1.84 | 12.2 |
| 119500 | 1 | 2 | 1.1783 | 7280 | 1.58 | 0.21 | 1.91 | 16.0 |
| 119500 | 1 | 3 | 1.1828 | 7418 | 2.20 | 0.30 | 2.10 | 15.3 |
| 119500 | 1 | 4 | 1.1590 | 8961 | 0.90 | 0.15 | 1.79 | 12.3 |
| 119500 | 1 | 5 | 1.1591 | 9247 | 1.17 | 0.19 | 1.89 | 12.4 |
| 119500 | 2 | 2 | 1.1915 | 10865 | 2.51 | 0.40 | 2.06 | 18.7 |
| 119500 | 2 | 4 | 1.1793 | 8576 | 1.41 | 0.28 | 1.85 | 16.4 |
| 119500 | 2 | 5 | 1.1644 | 12120 | 1.12 | 0.19 | 1.73 | 18.4 |
| 119500 | 3 | 2 | 1.1933 | 12510 | 2.36 | 0.46 | 2.14 | 15.4 |
| 119500 | 3 | 5 | 1.1938 | 11160 | 2.40 | 0.37 | 2.20 | 14.2 |
| 119500 | 4 | 1 | 1.1578 | 9286 | 0.96 | 0.18 | 2.10 | 6.7 |
| 119500 | 4 | 2 | 1.1578 | 8856 | 1.29 | 0.22 | 1.76 | 19.6 |
| 119500 | 4 | 3 | 1.1517 | 8854 | 1.23 | 0.19 | 1.84 | 14.9 |
| 119500 | 4 | 4 | 1.1642 | 10232 | 0.94 | 0.19 | 1.72 | 16.2 |
| 119500 | 4 | 5 | 1.1562 | 10902 | 0.96 | 0.18 | 1.71 | 16.9 |
| 119500 | 5 | 1 | 1.1609 | 9246 | 1.36 | 0.27 | 1.65 | 29.9 |
| 119500 | 5 | 2 | 1.1493 | 9048 | 0.79 | 0.14 | 1.62 | 19.0 |
| 119500 | 5 | 3 | 1.1500 | 10063 | 1.29 | 0.22 | 1.73 | 21.4 |
| 119500 | 5 | 4 | 1.1862 | 9314 | 1.70 | 0.33 | 1.88 | 18.4 |
| 119500 | 5 | 5 | 1.1906 | 9062 | 2.03 | 0.37 | 1.92 | 20.5 |
| 119501 | 1 | 1 | 1.1569 | 9971 | 1.34 | 0.21 | 1.90 | 14.1 |
| 119501 | 1 | 3 | 1.1780 | 7823 | 1.96 | 0.31 | 1.99 | 16.8 |
| 119501 | 1 | 4 | 1.1820 | 8292 | 2.10 | 0.27 | 2.13 | 13.9 |
| 119501 | 1 | 5 | 1.1410 | 4779 | 0.67 | 0.08 | 1.71 | 12.0 |
| 119501 | 2 | 2 | 1.1898 | 8599 | 1.91 | 0.32 | 2.11 | 13.0 |
| 119501 | 2 | 3 | 1.1661 | 8770 | 1.38 | 0.23 | 1.79 | 19.1 |
| 119501 | 2 | 4 | 1.1825 | 9582 | 2.25 | 0.34 | 2.06 | 17.0 |
| 119501 | 2 | 5 | 1.1840 | 9048 | 1.83 | 0.29 | 2.02 | 14.7 |
| 119501 | 3 | 3 | 1.1776 | 8954 | 2.41 | 0.37 | 1.99 | 20.9 |
| 119501 | 4 | 1 | 1.1483 | 12142 | 1.02 | 0.18 | 1.81 | 13.5 |
| 119501 | 4 | 2 | 1.1300 | 5119 | 0.63 | 0.07 | 1.68 | 12.1 |
| 119501 | 4 | 3 | 1.1682 | 4998 | 1.68 | 0.26 | 1.85 | 19.8 |
| 119501 | 4 | 5 | 1.1542 | 4259 | 1.53 | 0.18 | 1.84 | 18.6 |
| 119501 | 5 | 1 | 1.1776 | 10380 | 2.28 | 0.35 | 2.14 | 14.7 |
| 119501 | 5 | 2 | 1.1821 | 8668 | 1.38 | 0.26 | 1.94 | 13.1 |
| 119502 | 1 | 2 | 1.1719 | 8254 | 1.90 | 0.34 | 2.03 | 15.0 |
| 119502 | 1 | 3 | 1.1788 | 8757 | 2.16 | 0.36 | 2.13 | 14.4 |
| 119502 | 1 | 4 | 1.1592 | 5487 | 0.75 | 0.13 | 1.84 | 9.1 |
| 119502 | 1 | 5 | 1.1784 | 12045 | 1.96 | 0.31 | 2.05 | 14.8 |
| 119502 | 3 | 2 | 1.2178 | 7201 | 3.41 | 0.53 | 2.22 | 19.3 |
| 119502 | 3 | 4 | 1.2102 | 8539 | 2.61 | 0.48 | 2.23 | 14.7 |
| 119502 | 3 | 5 | 1.2034 | 9722 | 2.22 | 0.42 | 2.05 | 17.0 |
| 119502 | 4 | 1 | 1.1896 | 11420 | 2.43 | 0.39 | 2.17 | 15.0 |
| 119502 | 4 | 2 | 1.1822 | 8466 | 1.47 | 0.28 | 1.92 | 14.6 |
| 119502 | 5 | 2 | 1.2252 | 6972 | 3.12 | 0.56 | 2.23 | 17.5 |

EXAMPLES 1 THROUGH 8

Preparation of Spin-Coated Films Using TEOS or poly-TEOS as Hydrophilic Silica Source Spin-coated films were prepared to illustrate that the results could be obtained for other manufacturing methods. In the following examples 1 through 8, a mixture of hydrophilic and hydrophobic silica sources were added to a polypropylene bottle that also contained one or more solvents. The amount and identity of each chemical reagent added to the mixture are provided in Table IVa. The initial mixture was aged under ambient conditions for 2 hours. Next, one or more porogens and water, were added to the mixture that was then agitated and aged for 5 minutes. Afterwards, nitric acid was added to the mixture to catalyze the hydrolysis of the silica sources. The mixture was agitated and aged for 5 minutes. Lastly, an ionic additive was added to mixture. Once all of the reagents have been added, the mixture was agitated for approximately 2–3 minutes to ensure that the mixture was homogeneous. The resulting solution was then aged for 12–24 hours at room temperature prior to spin coating. After aging, the solution was then filtered through a 0.2 µm Teflon filter. Each of the chemical reagents within the mixture contained less than 1 ppm of metal impurities.

The solution was dispensed onto a low resistivity P type <100> Si wafer spinning at 500 rpm for 7 seconds to spread the formulation across the wafer and then accelerated to 1800 rpm for 35–40 seconds to evaporate the solvents and dry the film. The film formed during the spin coating process was then heated on a hot plate at 90° C. for 90 seconds, 180° C. for 90 seconds, and 400° C. for 180 seconds in an air or nitrogen atmosphere to remove the porogen. The wafer was cooled under ambient conditions. The properties of each film are provided in Table V. Examples 1 through 8 reconfirm the array results of the effect of the carboxylate, the weight percent EO, and the pAcid values of the mixture have on the normalized wall elastic modulus.

EXAMPLES 9 THROUGH 11

Preparation of Spin-Coated Films Using TAS as Hydrophilic Silica Source

In the following examples 9 through 11, an initial solution, solution A, containing the hydrophilic silica source (TAS), water, and one or more solvents was prepared and agitated for about 1 hour to initiate hydrolysis and dissolve the silica source. The amount and identity of each reagent added to the solution are provided in Table IVb. The initial mixture was aged under ambient conditions for 12–24 hours. After solution A was aged, the solution was passed through a 0.2 μm Teflon filter.

Next, solution B was prepared containing one or more hydrophobic silica sources, water, nitric acid, and 3.4 grams of solution A. The amount and identity of each reagent added to the solution are provided in Table IVb. Solution B was then agitated for 2–3 minutes and aged for about 1 hour. Afterwards, additional reagents were added to solution B in the following order: porogen dissolved in a solvent; a solvent; and the ionic additive TMAH to provide a mixture. Once all of the reagents have been added, the mixture is agitated for approximately 2–3 minutes to ensure that the mixture was homogeneous. The resulting mixture was then aged for 12–24 hours at room temperature prior to spin coating. After aging, the solution was then filtered through a 0.2 μm Teflon filter.

The solution was dispensed onto a low resistivity P type <100> Si wafer spinning at 500 rpm for 7 seconds to spread the formulation across the wafer and then accelerated to 1800 rpm for 35–40 seconds to evaporate the solvents and dry the film. The film formed during the spin coating process was then heated on a hot plate at 90° C. for 90 seconds, 180° C. for 90 seconds, and 400° C. for 180 seconds in an air or nitrogen atmosphere to remove the porogen. The wafer was cooled under ambient conditions. The properties of each film are provided in Table V. Examples 9 through 11 reconfirm the array results of the effect of the carboxylate, the weight percent EO, and the pAcid values of the mixture have on the normalized wall elastic modulus.

TABLE IVa

COMPOSITION OF SPIN COATED FILMS

| Ex. | Hydrophilic Si Source (g) | Hydrophobic Si Source (g) | Solvent (g) | Porogen (g) | Water (g) | Nitric Acid (g) | TMAH (g) |
|---|---|---|---|---|---|---|---|
| 1 | 6.0 TEOS | 6.0 MTES | 18.6 EEA; 19.1 PGMEA | 3.2 L101 | 5.7 | 5.8 0.2 M | 0.2 2.4 wt % |
| 2 | 5.7 TEOS | 5.7 MTES | 23.2 PGPE; 9.3 DMF | 2.9 L101 | 5.4 | 5.4 0.025 M | 0.22 2.4 wt % |
| 3 | 8.0 TEOS | 8.5 MTAS | 54.5 PGPE | 4.0 L81 | 4.0 | 3.93 0.025 M | 0.33 2.4 wt % |
| 4 | 5.5 TEOS | 7.1 MTAS | 45.6 PGPE | 3.2 X45 | 6.8 | 1.78 0.025 M | 0.26 2.4 wt % |
| 5 | 6.4 TEOS | 6.4 MTES | 36.0 PGPE | 3.9 L101 | 3.8 | 7.0 .025 M | 0.54 2.4 wt % |
| 6 | 4.5 TEOS | 8.8 MTAS | 43.8 PGPE | 4.0 L101 | 5.8 | 3.9 0.025 M | 0.33 2.4 wt % |
| 7 | 7.7 TEOS | 7.7 MTES | 21.7 EEA; 25.7 PGMEA | 5.3 L101 | 4.1 | 4.1 0.2 M | 0.34 2.4 wt % |
| 8 | 3.8 poly-TEOS | 8.7 MTES | 45.7 PGPE | 5.0 L81 | 5.9 | 3.4 0.2 M | 0.42 2.4 wt % |

TABLE IVb

| | Solution A | | | Solution B | | | | | | |
|---|---|---|---|---|---|---|---|---|---|---|
| Ex | gram TAS | grams water | solvent | grams sol'n A | grams MTAS | grams water | Grams 0.025 M HNO$_3$ | grams 21.9 wt % porogen in PGPE | grams PGPE | grams 1.2 wt % TMAH |
| 9 | 2.5 | 0.8 | 9.3 g PGPE | 3.4 | 1.1 | 1.1 | 0.33 | 1.6 Triton X-45 | 5.6 | 0.06 |
| 10 | 7.4 | 4.5 | 25.5 g PGPE | 3.4 | 1.1 | 1.1 | 0.33 | 2.0 Tergitol 15-S-5 | 3.9 | 0.06 |
| 11 | 9.0 | 5.0 | 16.0 g IPA | 3.4 | 1.1 | 0.0 | 0.33 | 2.2 Tergitol 15-S-5 | 0.0 | 0.06 |

TABLE V

Properties of Spin-Coated Films

| Ex. | Silicate | Surfactant | Wt % EO | PAcid | k | E (GPa) | FOM |
|---|---|---|---|---|---|---|---|
| 1 | TEOS/MTES | L101 | 10 | 1.8 | 2.09 | 2.12 | 15.1 |
| 2 | TEOS/MTES | L101 | 10 | 2.9 | 2.09 | 2.23 | 15.6 |
| 3 | TEOS/MTAS | L81 | 10 | 3.9 | 2.09 | 2.01 | 14.0 |
| 4 | TEOS/MTAS | X-45 | 52 | 5.9 | 2.34 | 3.2 | 15.1 |
| 5 | TEOS/MTES | L101 | 10 | 3.4 | 1.92 | 1.46 | 14.5 |
| 6 | TEOS/MTAS | L101 | 10 | 3.9 | 1.77 | 1.43 | 20.8 |
| 7 | TEOS/MTES | L101 | 10 | 2.0 | 2.17 | 2.6 | 16.1 |

TABLE V-continued

Properties of Spin-Coated Films

| Ex. | Silicate | Surfactant | Wt % EO | PAcid | k | E (GPa) | FOM |
|---|---|---|---|---|---|---|---|
| 8 | Poly-TEOS/MTES | L81 | 10 | 2.1 | 1.86 | 1.3 | 14.7 |
| 9 | TAS/MTAS | X-45 | 52 | 8.5 | 2.13 | 2.8 | 18.5 |
| 10 | TAS/MTAS | 15-S-5 | 52 | 8.6 | 1.93 | 2.0 | 19.7 |
| 11 | TAS/MTAS | 15-S-5 | 52 | 8.8 | 2.08 | 2.32 | 15.8 |

While the invention has been described in detail and with reference to specific examples thereof, it will be apparent to one skilled in the art that various changes and modifications can be made therein without departing from the spirit and scope thereof.

The invention claimed is:

1. A mixture of an at least one chemical reagent for producing a performance material having a dielectric constant of about 3.7 or less, the mixture comprising:
    an at least one silica source;
    an at least one porogen;
    a carboxylate selected from the group consisting of a carboxylic acid, a carboxylate anion, a carboxylic acid ester, or combinations thereof;
    a strong acid catalyst that has a pKa that is 2 or less and a strong base catalyst that has a pKa of its conjugate acid of greater than 12 in an amount sufficient to adjust a pAcid value of the mixture to a range of from 2.2 to 9; and
    an ionic additive,
    provided that if the at least one chemical reagent has a metal impurity level of 1 ppm or greater then the at least one chemical reagent is purified prior to adding to the mixture.

2. The mixture of claim 1 wherein the at least one porogen comprises about 5 weight percent to about 75 weight percent ethylene oxide groups.

3. The mixture of claim 1 wherein the at least one porogen comprises from about 5 weight percent to about 55 weight percent ethylene oxide groups.

4. The mixture of claim 1 wherein the weight ratio of weight of porogen to the weight of porogen and weight of $SiO_2$ ranges from 0.9 to 0.1.

5. The mixture of claim 1 wherein the at least one silica source comprises at least one carboxylic acid ester bonded to the Si atom.

6. The mixture of claim 1 wherein the at least one silica source is selected from the group of compounds represented by the following formulas:
    i. $R_aSi(OR^1)_{4-a}$, wherein R is independently a hydrogen atom, a fluorine atom, or a monovalent organic group; $R^1$ is independently a monovalent organic group; and a is an integer of 1 or 2;
    ii. $Si(OR^2)_4$, where $R^2$ is independently a monovalent organic group;
    iii. $R^3{}_b(R^4O)_{3-b}Si-(R^7)-Si(OR^5)_{3-c}R^6{}_c$, wherein $R^3$ and $R^6$ are independently a hydrogen atom, a fluorine atom, or a monovalent organic group, $R^4$ and $R^5$ are independently a monovalent organic group; b and c may be the same or different and each is a number of 0 to 2; $R^7$ is an oxygen atom, a phenylene group, or a group represented by $-(CH2)_n-$, wherein n is an integer of 1 to 6; or combinations thereof.

7. A mixture of an at least one chemical reagent for producing a performance material having a dielectric constant of about 3.7 or less comprising:
    an at least one silica source;
    an at least one porogen wherein the at least one porogen comprises from about 5 weight percent to about 75 weight percent ethylene oxide groups;
    a carboxylate selected from the group consisting of a carboxylic acid, a carboxylate anion, a carboxylic acid ester, or combinations thereof; and
    a strong acid catalyst that has a pKa that is 2 or less and a strong base catalyst that has a pKa of its conjugate acid of greater than 12 in an amount sufficient to adjust a pAcid value of the mixture to a range of from 2.2 to 9;
    wherein the at least one chemical reagent has a metal impurity level below 1 ppm.

8. The mixture of claim 7 wherein the at least one silica source comprises at least one carboxylic acid ester bonded to a Si atom.

9. The mixture of claim 7 wherein the at least one porogen comprises from about 5 weight percent to about 55 weight percent ethylene oxide groups.

10. The mixture of claim 7 wherein the at least one porogen comprises a non-ionic surfactant.

11. A mixture of an at least one chemical reagent for producing a performance material having a dielectric constant of about 3.7 or less, the mixture comprising:
    an at least one silica source;
    an at least one porogen; and
    a strong acid catalyst that has a pKa that is 2 or less and a strong base catalyst that has a pKa of its conjugate acid of greater than 12 in an amount sufficient to adjust a pAcid value of the mixture to a range of from about 2.2 to about 9.

12. The mixture of claim 11 wherein the mixture further comprises a carboxylate selected from the group consisting of a carboxylic acid, a carboxylate anion, a carboxylic acid ester, or combinations thereof.

13. The mixture of claim 12 wherein the at least one silica source comprises at least one carboxylic acid ester bonded to a Si atom.

14. The mixture of claim 11 wherein the at least one chemical reagent has a metal impurity level below 1 ppm.

15. The mixture of claim 14 further comprising an ionic additive.

16. A mixture of an at least one chemical reagent for producing a performance material having a dielectric constant of about 3.7 or less, the mixture comprising:
    an at least one silica source;
    an at least one porogen wherein the at least one porogen comprises about 75 weight percent or less of ethylene oxide groups;
    an ionic additive; and
    a strong acid catalyst that has a pKa that is 2 or less and a strong base catalyst that has a pKa of its conjugate acid of greater than 12 in an amount sufficient to adjust a pAcid value of the mixture to a range of from 2.2 to 9
    provided that if the at least one chemical reagent has a metal impurity level of 1 ppm or greater then the at least one chemical reagent is purified prior to adding to the mixture.

17. A mixture of an at least one chemical reagent for producing a performance material having a dielectric constant of about 3.7 or less, the mixture comprising:

an at least one silica source;

an at least one porogen wherein the at least one porogen comprises from about 5 to about 75 weight percent of ethylene oxide groups; and a strong acid catalyst that has a pKa that is 2 or less and a strong base catalyst that has a pKa of its conjugate acid of greater than 12 in an amount sufficient to adjust a pAcid value of the mixture to a range of from 2.2 to 9;

provided that if the at least one chemical reagent has a metal impurity level of 1 ppm or greater then the at least one chemical reagent is purified prior to adding to the mixture.

18. The performance film formed by the mixture of claim 1.

19. The semiconductor device comprising the performance film of claim 18.

20. The performance film formed by the mixture of claim 7.

21. The performance film of claim 20 wherein the normalized wall elastic modulus is 16 GPa or greater.

22. The semiconductor device comprising the performance film of claim 21.

23. The mixture of claim 1 wherein the pAcid value of the mixture is one selected 1mm the group consisting of:
   (i) pAcid=−[log(equivalents of strong acid−equivalents of strong base)/(kg total mixture)] when the number of equivalents of strong acid is greater than the number of equivalents of strong base;
   (ii) pAcid=14+[log(equivalents of strong base−equivalents of strong acid)/(kg total mixture)] when the number of equivalents of strong base is greater than the number of equivalents of strong acid; and
   (iii) pAcid=7 when the number of equivalents of strong acid equals the number of equivalents of strong base.

24. The mixture of claim 7 wherein the pAcid value of the mixture is one selected from the group consisting of:
   (i) pAcid=−[(log(equivalents of strong acid−equivalents of strong base)/(kg total mixture)] when the number of equivalents of strong acid is greater than the number of equivalents of strong base;
   (ii) pAcid=14+[log(equivalents of strong base−equivalents of strong acid)/(kg total mixture)] when the number of equivalents of strong base is greater than the number of equivalents of strong acid; and
   (iii) pAcid=7 when the number of equivalents of strong acid equals the number of equivalents of strong base.

25. The mixture of claim 11 wherein the pAcid value of the mixture is one selected from the group consisting of:
   (i) pAcid=−[log(equivalents of strong acid−equivalents of strong base)/(kg total mixture)] when the number of equivalents of strong acid is greater than the number of equivalents of strong base;
   (ii) pAcid=14+[(log(equivalents of strong base−equivalents of strong acid)/(kg total mixture)] when the number of equivalents of strong base is greater than the number of equivalents of strong acid; and
   (iii) pAcid=7 when the number of equivalents of strong acid equals the number of equivalents of strong base.

26. The mixture of claim 16 wherein the pAcid value of the mixture is one selected from the group consisting of:
   (i) pAcid=−[log (equivalents of strong acid−equivalents of strong base)/(kg total mixture)] when the number of equivalents of strong acid is greater than the number of equivalents of strong base;
   (ii) pAcid=14+[log(equivalents of strong base−equivalents of strong acid)/(kg total mixture)] when the number of equivalents of strong base is greater than the number of equivalents of strong acid; and
   (iii) pAcid=7 when the number of equivalents of strong acid equals the number of equivalents of strong base.

27. The mixture of claim 17 wherein the pAcid value of the mixture is one selected from the group consisting of:
   (i) pAcid=−[(log(equivalents of strong acid−equivalents of strong base)/(kg total mixture)] when the number of equivalents of strong acid is greater than the number of equivalents of strong base;
   (ii) pAcid 14+[log(equivalents of strong base−equivalents of strong acid)/(kg total mixture)] when the number of equivalents of strong base is greater than the number of equivalents of strong acid; and
   (iii) pAcid=7 when the number of equivalents of strong acid equals the number of equivalents of strong base.

28. A mixture of an at least one chemical reagent for producing a performance material having a dielectric constant of about 3.7 or less, the mixture comprising:

an at least one silica source;

an at least one porogen; and a strong acid catalyst that has a pKa that is 2 or less and a strong base catalyst that has a pKa of its conjugate acid of greater than 12 in an amount sufficient to adjust a pAcid value of the mixture to a range of from about 2.2 to about 9 wherein the pAcid value of the mixture is one selected from the group consisting of:
   (i) pAcid=−[log(equivalents of strong acid−equivalents of strong base)/(kg total mixture)] when the number of equivalents of strong acid is greater than the number of equivalents of strong base;
   (ii) pAcid=14+[log(equivalents of strong base−equivalents of strong acid)/(kg total mixture)] when the number of equivalents of strong base is greater than the number of equivalents of strong acid; and
   (iii) pAcid=7 when the number of equivalents of strong acid equals the number of equivalents of strong base provided that if the at least one chemical reagent has a metal impurity level of 1 ppm or greater then the at least one chemical reagent is purified prior to adding to the mixture.

* * * * *